(12) United States Patent
Karashima

(10) Patent No.: US 10,950,686 B2
(45) Date of Patent: Mar. 16, 2021

(54) SEMICONDUCTOR DEVICE INCLUDING A CHIP CAPACITOR MOUNTED ON A WIRING SUBSTRATE

(71) Applicant: RENESAS ELECTRONICS CORPORATION, Tokyo (JP)

(72) Inventor: Takashi Karashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 23 days.

(21) Appl. No.: 16/404,133

(22) Filed: May 6, 2019

(65) Prior Publication Data

US 2019/0363157 A1 Nov. 28, 2019

(30) Foreign Application Priority Data

May 24, 2018 (JP) .............................. JP2018-100046

(51) Int. Cl.
*H01L 25/16* (2006.01)
*H01L 23/528* (2006.01)
(Continued)

(52) U.S. Cl.
CPC .............. *H01L 28/60* (2013.01); *H01L 23/34* (2013.01); *H01L 23/5283* (2013.01);
(Continued)

(58) Field of Classification Search
CPC ......... H01L 25/16; H01L 23/34; H01L 24/17; H01L 23/5283; H01L 24/09; H01L 2224/92225; H01L 24/16; H01L 24/32; H01L 24/73; H01L 24/92; H01L 2924/351; H01L 2224/32245; H01L 2224/16227; H01L 2224/0401; H01L 2224/73253; H01L 2224/73204; H01L 2224/32225; H01L 2224/92125; H01L 2924/15311; H01L 2924/15192; H01L 2924/16251; H01L 2924/19105; H01L 2924/19041;
(Continued)

(56) References Cited

U.S. PATENT DOCUMENTS 9,277,648 B2 3/2016 Hamao et al.
2017/0164472 A1* 6/2017 Matsuura ............... H05K 1/181
2017/0278638 A1* 9/2017 Hattori .................... H01G 2/06

FOREIGN PATENT DOCUMENTS

JP 2010-212318 A 9/2010
JP 2015-135906 A 7/2015

* cited by examiner

*Primary Examiner* — Nelson Garces
(74) *Attorney, Agent, or Firm* — McDermott Will & Emery LLP

(57) ABSTRACT

The terminal pattern TP1 of the wiring substrate PB has a side T1a facing the terminal pattern TP2 and the terminal pattern TP2 of the wiring substrate PB has a side T2a facing the side T1a of the terminal pattern TP1. The side T1a and the side of T2a are exposed from the opening portion OP1 and OP2 of the solder resist layer SR1 respectively, and outer peripheries of terminal patterns TP1 and TP2 other than sides T1a and T2a are not exposed from opening portions OP1 and OP2. The opening portion OP1 and the opening portion OP2 are separated from each other. The electrode E1 of the capacitor C1 is soldered to the terminal pattern TP1 exposed from the opening portion OP1, and the electrode E2 of the capacitor C1 is soldered to the terminal pattern TP2 exposed from the opening portion OP2.

15 Claims, 28 Drawing Sheets

(51) Int. Cl.
*H01L 49/02* (2006.01)
*H01L 23/34* (2006.01)
*H01L 23/00* (2006.01)

(52) U.S. Cl.
CPC .............. *H01L 24/09* (2013.01); *H01L 24/17* (2013.01); *H01L 25/16* (2013.01); H05K 2201/10015 (2013.01)

(58) Field of Classification Search
CPC . H01L 23/50; H01L 23/5386; H01L 23/5383; H01L 23/5384; H01L 28/60; H05K 2201/10–10992; H05K 1/111; H05K 1/181; H05K 2201/07–0792; H05K 3/34–3494; H05K 3/4007–4015; H05K 2203/04–0485
See application file for complete search history.

| SPECIFICATION | W1(mm) | W2(mm) |
|---|---|---|
| NO.1 | 0.31 | 0.62 |
| NO.2 | 0.35 | 0.62 |
| NO.3 | 0.4 | 0.62 |
| NO.4 | 0.45 | 0.62 |
| NO.5 | 0.5 | 0.62 |

SEMICONDUCTOR DEVICE INCLUDING A CHIP CAPACITOR MOUNTED ON A WIRING SUBSTRATE

CROSS-REFERENCE TO RELATED APPLICATIONS

The disclosure of Japanese Patent Application No. 2018-100046 filed on May 24, 2018 including the specification, drawings and abstract is incorporated herein by reference in its entirety.

TECHNICAL FIELD OF THE INVENTION

The present invention relates to a semiconductor device, and can be suitably applied to, for example, a semiconductor device in which a semiconductor chip and a chip capacitor are mounted on a wiring substrate.

A semiconductor device can be manufactured by mounting a chip capacitor on a wiring substrate.

BACKGROUND OF THE INVENTION

In Japanese Unexamined Patent Application No. 2010-212318 (Patent Document 1) and No. 2015-135906 (Patent Document 2), there are disclosed technologies for mounting chip components on a wiring substrate.

SUMMARY OF THE INVENTION

It is desired to improve reliability in a semiconductor device in which a semiconductor chip and a chip capacitor are mounted on a wiring substrate.

Other objects and novel features will become apparent from the description of this specification and the accompanying drawings.

According to one embodiment, a semiconductor device includes a wiring substrate, and a semiconductor chip and a first chip capacitor mounted on the wiring substrate.
The wiring substrate has a first conductive layer including a first terminal pattern and a second terminal pattern, and an insulating layer formed to cover the first conductive layer. The insulating layer has a first opening portion exposing a part of the first terminal pattern and a second opening portion exposing a part of the second terminal pattern, and the first opening portion and the second opening portion are separated from each other in plan view.
The first terminal pattern has a first side facing the second terminal pattern in plan view, the first side of the first terminal pattern is exposed from the first opening portion, and the outer periphery of the first terminal pattern other than the first side is not exposed from the first opening portion.
The second terminal pattern has a second side facing the first side of the first terminal pattern in plan view, the second side of the second terminal, pattern is exposed from the second opening portion, and the outer periphery of the second terminal pattern other than the second side is not exposed from the second opening portion.
The first electrode of the first chip capacitor is electrically connected to the first terminal pattern exposed from the first opening portion via a first solder joint, and the second electrode of the first chip capacitor is electrically connected to the second terminal pattern exposed from the second opening portion via a second solder joint.

According to one embodiment, reliability of the semiconductor device can be improved.

DESCRIPTIONS OF THE PREFERRED EMBODIMENTS

Figure 1:
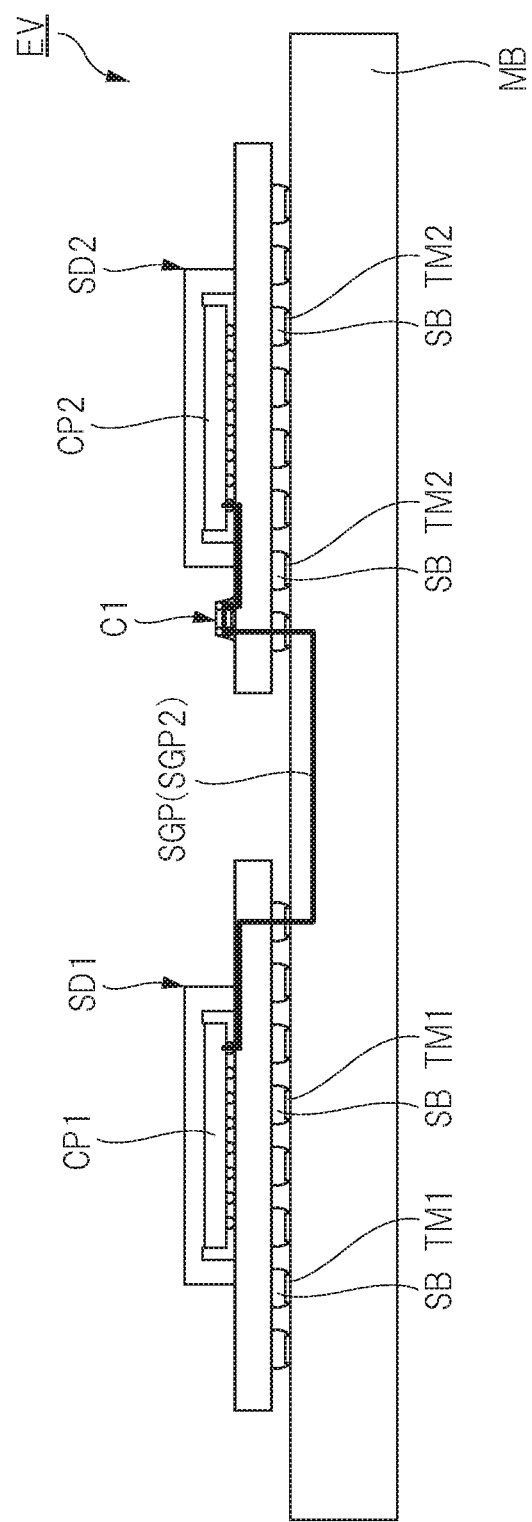
FIG. 1 is an explanatory diagram showing a configuration example of an electronic device including a semiconductor device according to an embodiment.

In all the drawings for explaining the embodiments, members having the same functions are denoted by the same reference numerals, and repetitive descriptions thereof are omitted.

In the following embodiments, descriptions of the same or similar parts will not be repeated in principle except when particularly necessary.

In the drawings used in the embodiments, hatching may be omitted in order to make the drawings easier to see even in a cross-sectional view.

In addition, even in plan view, hatching may be used to make the drawing easier to see.

An example of an electronic device using the semiconductor device of this embodiment will be described with reference to FIGS. 1 and 2.

Figure 2:
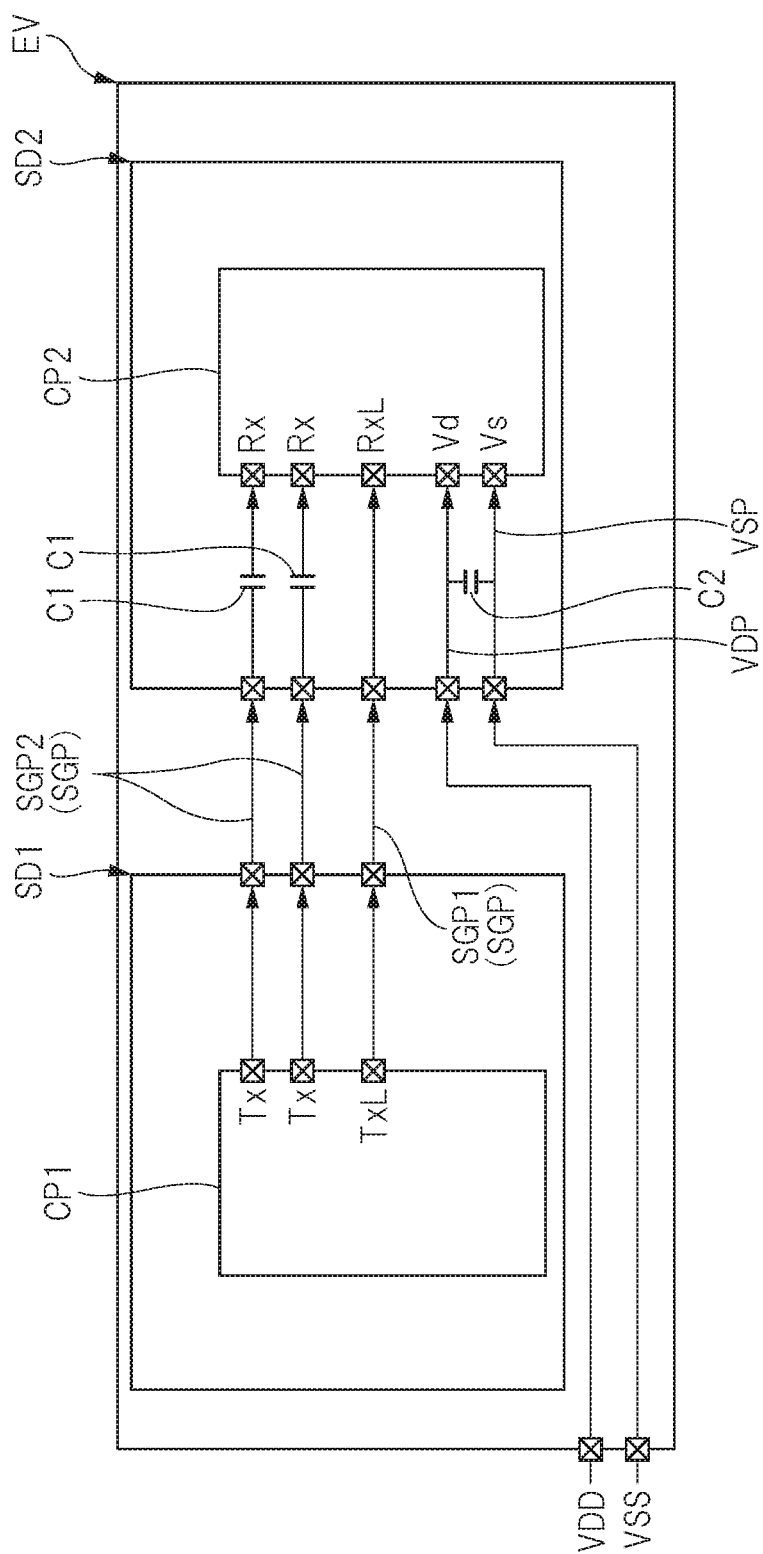
FIG. 2 is an explanatory diagram showing an example of the circuit configuration of the electronic device shown in FIG. 1.

FIG. 1 is an explanatory diagram showing a configuration example of an electronic device including the semiconductor device of the present embodiment, and FIG. 2 is an explanatory diagram showing a circuit configuration example of the electronic device shown in FIG. 1.

In FIG. 1, a cross section of the electronic device EV is shown, but hatching is omitted.

The electronic device shown in FIGS. 1 and 2 is an electronic device in which a plurality of semiconductor devices (semiconductor packages) SD1 and SD2 are mounted on a motherboard, and electric signals are transmitted between the plurality of semiconductor devices SD1 and SD2.

Specifically, the electronic device (electronic device) EV shown in FIG. 1 includes a motherboard (mounting substrate) MB and semiconductor devices SD1 and SD2 mounted on the motherboard MB, and electric signals are transmitted between the semiconductor device SD1 and the semiconductor device SD2.

The semiconductor device SD1 and the semiconductor device SD2 are electrically connected to each other via a signal transmission path SGP.

As shown in FIG. 2, the electronic device EV has a plurality of signal transmission paths SGP, and in FIG. 1, one of the signal transmission paths SGP is schematically shown by a thick line.

The signal transmission path SGP is formed by wiring of the motherboard MB or the like.

In the example shown in FIG. 2, the plurality of signal transmission paths SGPs included in the electronic device EV include a low-speed transmission path SGP1 through which an electrical signal is transmitted at a first transmission rate (e.g., a transmission rate of less than 3 Gbps (Gigabit per second) and a high-speed transmission path SGP2 through which an electrical signal is transmitted at a second transmission rate (e.g., a transmission rate of about 3 Gbps to 50 Gbps) higher than the first transmission rate.

The semiconductor device SD1 incorporates a semiconductor chip CP1, and the semiconductor device SD2 incorporates a semiconductor chip CP 2.

Then, the pad electrode TxL of the semiconductor chip CP1 and the pad electrode RxL of the semiconductor chip CP2 are electrically connected via the low-speed transmission path SGP1, and electric signals are transmitted between them.

The pad electrode Tx of the semiconductor chip CP1 and the pad electrode Rx of the semiconductor chip CP2 are electrically connected via the high-speed transmission path SGP2, and electric signals are transmitted therebetween.

When signals are transmitted at high speed as in the electronic device EV, it is preferable to connect the capacitor C1 in series in the high-speed transmission path SGP2.

The DC components included in the AC signals can be cut by the capacitor C1 inserted in the high-speed transmission path SGP2. This makes it possible to stabilize the input and output of signals at high speed.

The capacitor C1, which is inserted in the signal transmission path in series and cuts the DC components in the AC signal, is called a DC (Direct Current) cutting capacitor or an AC (Alternate Current) coupling capacitor (hereinafter, referred to as a DC cutting capacitor).

The capacitor C1, which is a DC-cutting capacitor, is required for each high-speed transmission path SGP2, and therefore needs to be provided corresponding to the number of high-speed transmission paths SGP2.

The capacitor C1, which is a DC cutting capacitor, is distinguished from the capacitor C2 for the power supply circuit, which is inserted in the power supply circuit in a parallel connection.

The capacitor C2 shown in FIG. 2 is inserted between a reference potential supply path VSP for supplying a reference potential (ground potential, ground potential, GND potential) VSS to (the reference potential pad electrode Vd) of the semiconductor chip CP2 and a power supply potential supply path VDP for supplying a power supply potential VDD to (the power supply potential pad electrode Vs) of the semiconductor chip CP2.

The capacitor C2 can function as a bypass capacitor that bypasses and flows the noise (signal) included in the power supply potential supply path VDP to the reference potential supply path VSP side.

In addition, the capacitor C2 can function as a decoupling capacitor that reduces the influence of the impedance component included in the power supply potential supply path VDP and the reference potential supply path VSP by reducing the loop (path distance) of the current flowing through the circuit formed in the semiconductor chip CP2.

In addition, by connecting the capacitor C2 to the vicinity of the circuit which consumes the supplied power, it is possible to function as a battery which suppresses a phenomenon in which the driving voltage drops instantaneously.

Thus, the capacitor C2 for the power supply circuit is inserted in the power supply circuit in parallel, while the capacitor C1 is inserted in series in the signal transmission path SGP.

In the example shown in FIG. 2, the capacitor C1 which is a DC cutting capacitor and the capacitor C 2 for the power supply circuit are provided in the semiconductor device SD2, and specifically, are mounted as chip capacitors on the wiring substrate PB constituting the semiconductor device SD2.

The semiconductor device SD2 of the present embodiment will be described with reference to FIGS. 3 to 7.

Figure 3:
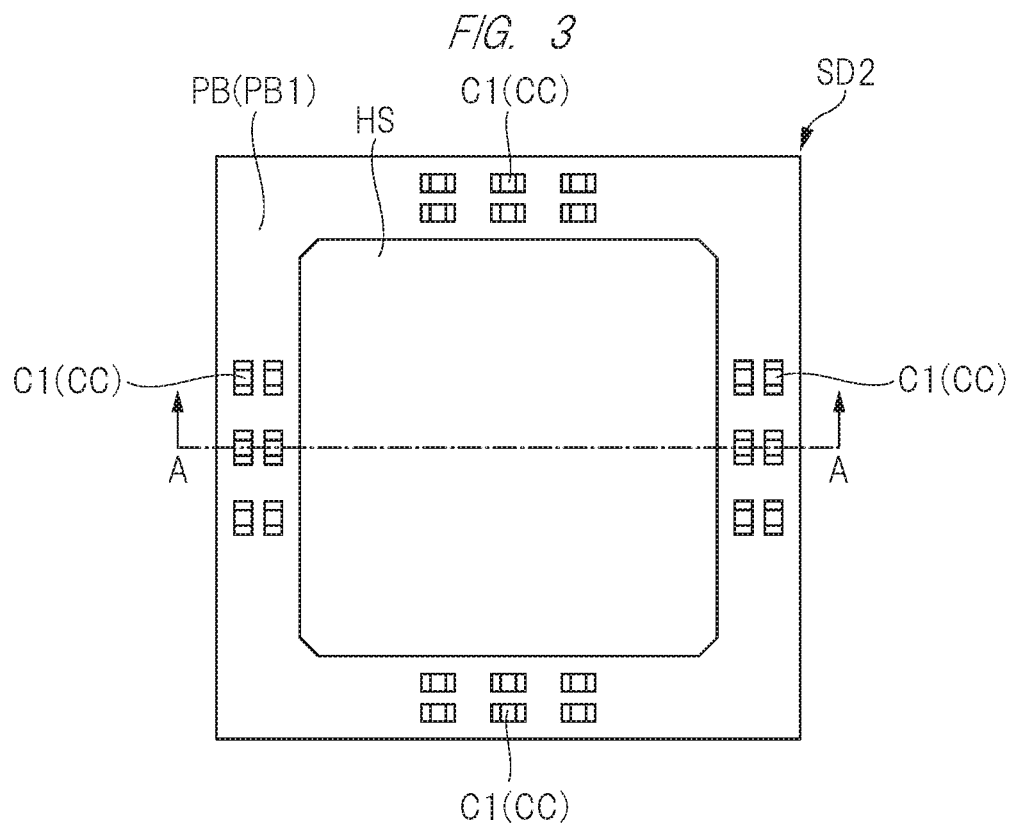
FIG. 3 is a top view of the semiconductor device according to the embodiment.
Figure 4:
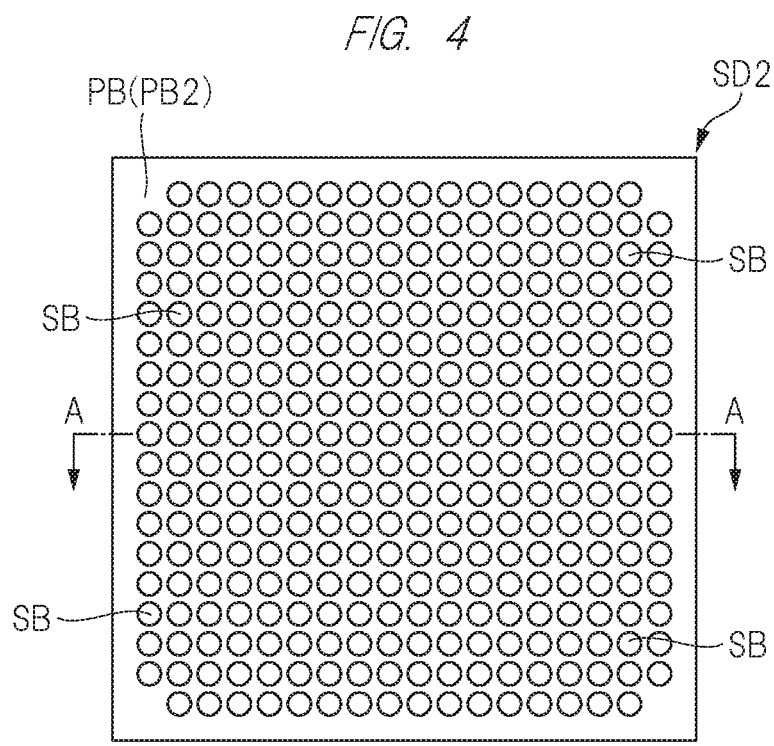
FIG. 4 is a bottom view of the semiconductor device shown in FIG. 3.

FIG. 3 is a top view of the semiconductor device SD2 of the present embodiment, and FIG. 4 is a bottom view of the semiconductor device SD2 of the present embodiment.

Figure 5:
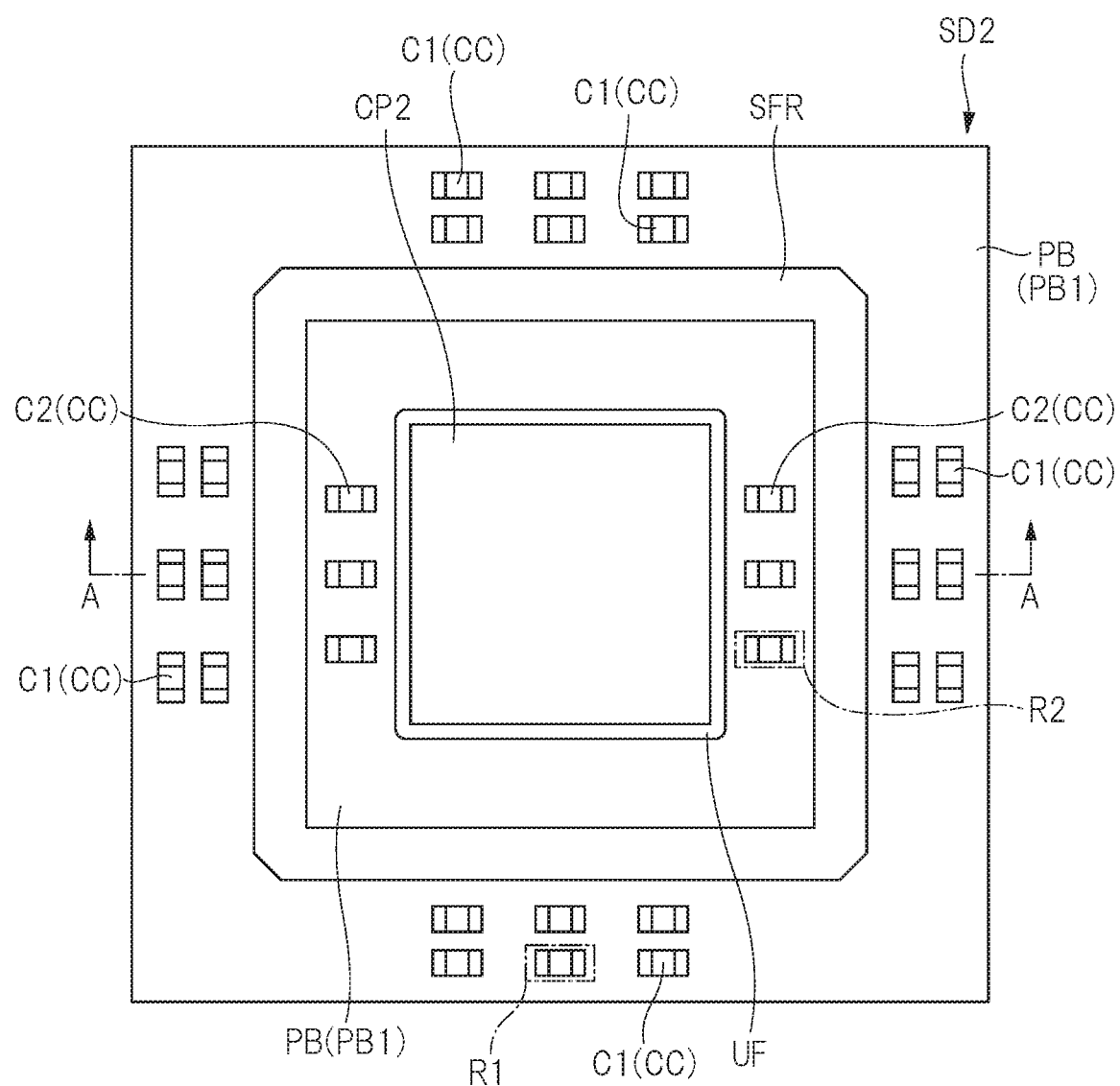
FIG. 5 is a plan perspective view of the semiconductor device shown in FIG. 3.

FIG. 5 is a plan perspective view of the semiconductor device SD2 of the present embodiment, and shows a top view of the semiconductor device SD2 when the heat dissipation member HS is seen through.

Figure 6:
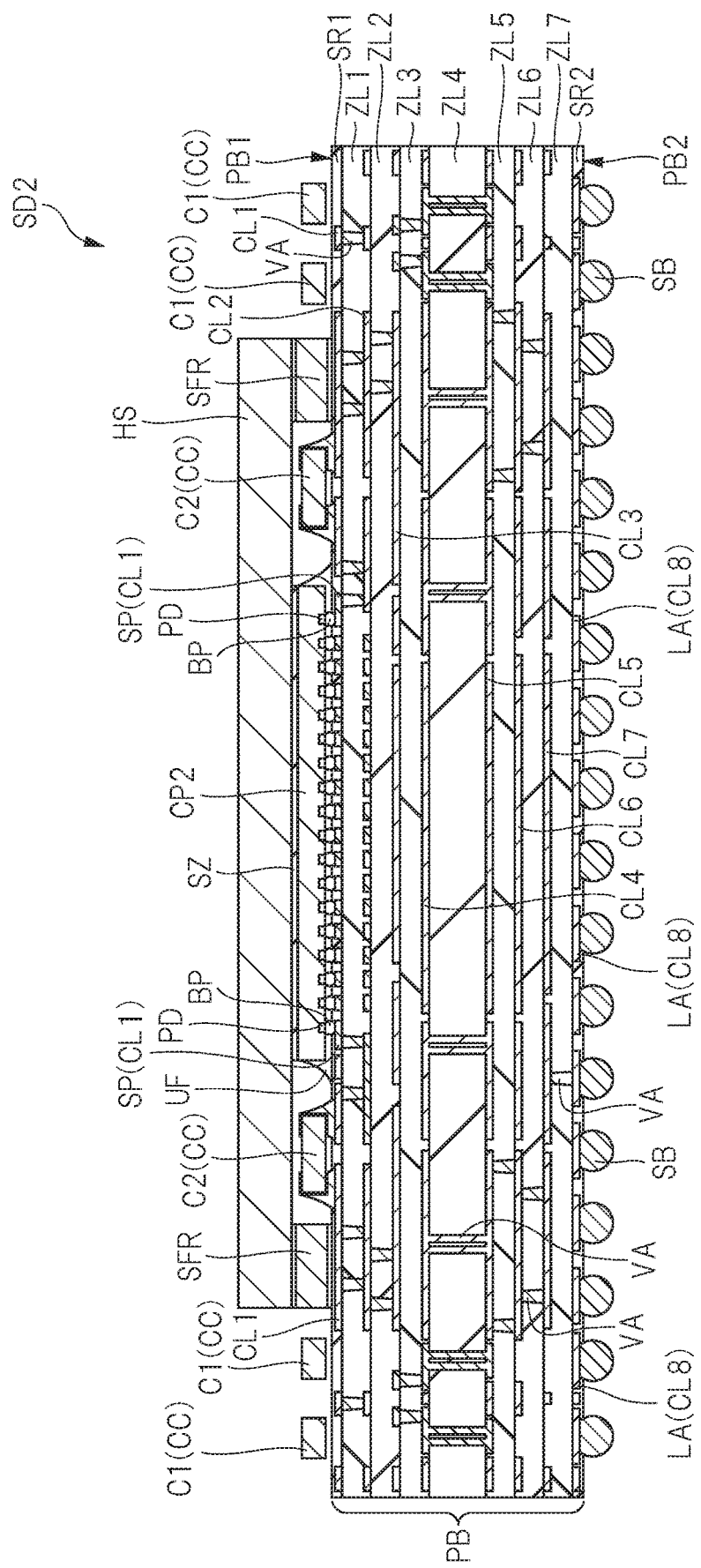
FIG. 6 is a cross-sectional view of the semiconductor device shown in FIG. 3.

FIG. 6 is a cross-sectional view of the semiconductor device SD2 of the present embodiment, and the cross-sectional view of the semiconductor device SD2 at a position corresponding to the line A-A shown in FIGS. 3 to 5 substantially corresponds to FIG. 6.

Figure 7:
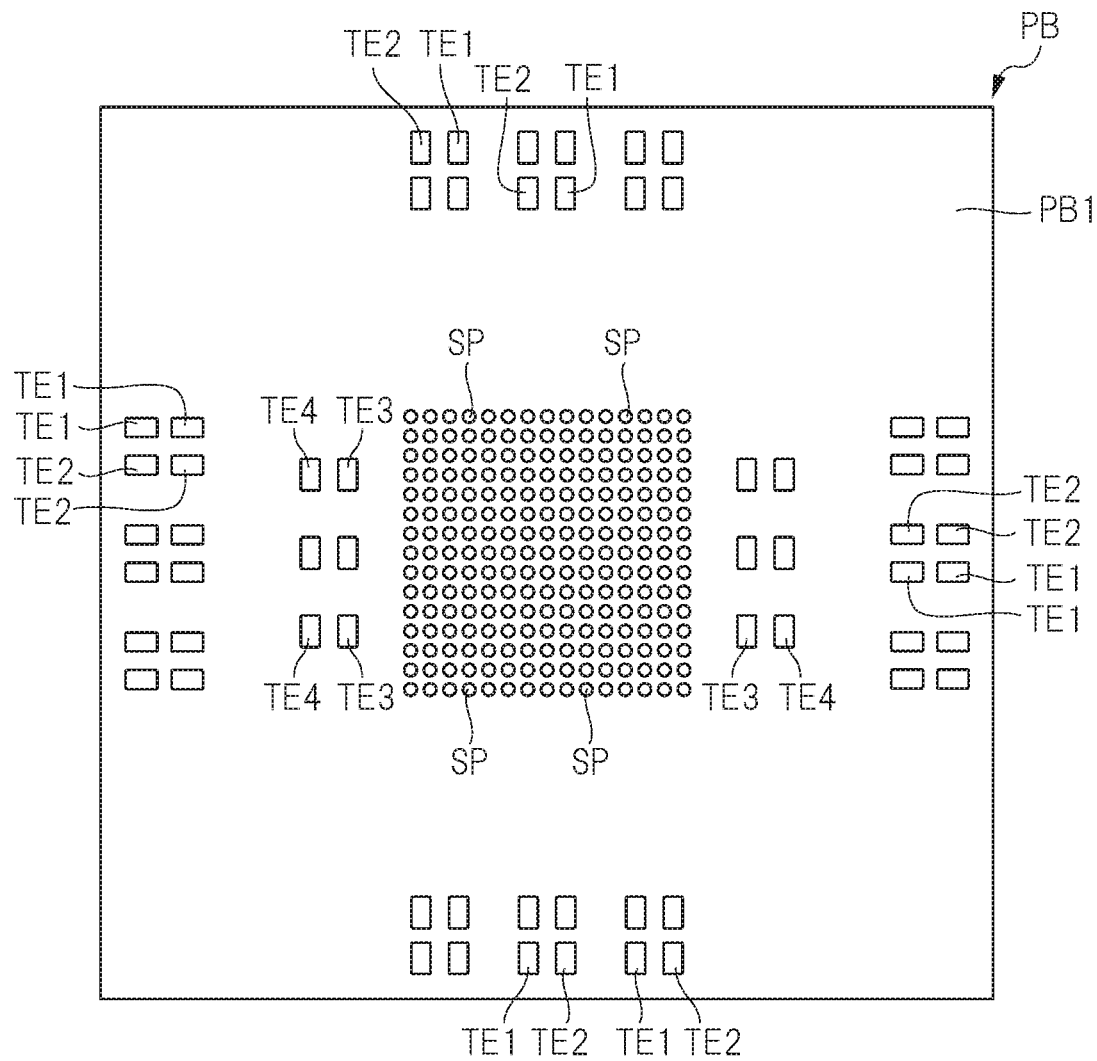
FIG. 7 is a top view of a wiring substrate used in the semiconductor device shown in FIG. 3.

FIG. 7 is a top view of the wiring substrate PB used in the semiconductor device SD2.

The semiconductor device SD2 of the present embodiment shown in FIGS. 1 to 4 has a wiring substrate PB, a semiconductor chip CP2 mounted on the upper surface PB1 of the wiring substrate PB, a plurality of chip capacitors CC mounted on the upper surface PB1 of the wiring substrate PB, and a heat dissipation member HS mounted (bonded) on the upper surface PB1 of the wiring substrate PB so as to cover the semiconductor chip CP 2.

The semiconductor chip CP2 is an electronic component composed of an active element, and the chip capacitor CC is an electronic component composed of a passive element, that is, a passive component.

The plurality of chip capacitors CC mounted on the wiring substrate PB include a plurality of capacitors C1 for DC cutting and a plurality of capacitors C2 for power supply circuits, respectively.

Note that the semiconductor device SD2 can be regarded as an electronic device because the electronic component is mounted on the wiring substrate PB, but in the case of the present embodiment, the semiconductor device can also be regarded as a semiconductor device because the electronic component mounted on the wiring substrate PB also includes a semiconductor chip.

The wiring substrate PB has an upper surface (main surface) PB 1 on which the semiconductor chip CP2 and the plurality of chip capacitors CC are mounted, a lower surface (main surface) PB2 on the side opposite to the upper surface PB1, and a plurality of side surfaces disposed between the upper surface PB1 and the lower surface PB2, and has a rectangular outer shape (more specifically, a rectangular shape) in plan view.

The wiring substrate PB is an interposer (relay board) for electrically connecting the semiconductor chip CP2 and the plurality of chip capacitors CC mounted on the upper surface PB1 of the wiring substrate PB and the motherboard on which the semiconductor device SD2 is mounted.

The wiring substrate PB is, for example, a multilayer wiring board (multilayer board) in which a plurality of insulating layers (insulative layers, dielectric layers) ZL1 to ZL7 and a plurality of conductive layers (conductive pattern layers, wiring layers) CL1 to CL8 are alternately laminated and integrated.

Conductive layers are formed on both upper and lower surfaces of the plurality of insulating layers ZL1 to ZL7 constituting the wiring substrate PB and between each other.

Specifically, in the wiring substrate PB, a conductive layer CL1, an insulating layer ZL1, a conductive layer CL2, an insulating layer ZL2, a conductive layer CL3, an insulating layer ZL3, a conductive layer CL4, an insulating layer ZL4, a conductive layer CL5, an insulative layer ZL5, a conductive layer CL6, a conductive layer CL7, an insulating layer ZL7, and a conductive layer CL8 are arranged in this order from the upper surface PB1 side to the lower surface PB2 side of the wiring substrate PB.

Each of the conductive layers CL1 to CL8 is processed into a predetermined planar shape (pattern), and can be regarded as an aggregate of a plurality of conductive patterns.

Note that "CL1, CL2, CL3, CL4, CL5, CL6, CL7, CL8" is abbreviated to "CL1 to CL8", and other symbols can be considered in the same manner.

The wiring substrate PB is formed, for example, by alternately stacking conductive layers and insulating layers (prepreg layers) on both upper and lower surfaces of a hard core insulating layer (corresponding to the insulating layer ZL4) impregnated with a resin in a glass fiber by a build-up method.

As the wiring substrate PB, a so-called coreless substrate in which a core insulating layer made of a hard material is not provided, but an insulating layer (prepreg layer) and a conductive layer are stacked in this order may be used.

In addition, the cross-sectional view of FIG. 6 shows a case where the wiring substrate PB is formed by stacking seven insulating layers ZL1 to ZL7 and eight conductive layers CL1 to CL8, but the number of stacked insulating layers and conductive layers is not limited to this, and various modifications are possible.

The conductive layer CL1 is the uppermost conductive layer of the plurality of conductive layers CL1 to CL8 of the wiring substrate PB, that is, the conductive layer on the uppermost surface PB1 side.

The conductive layer CL1 is formed on the upper surface of the uppermost insulating layer ZL1 of the plurality of insulating layers ZL1 to ZL7 included in the wiring substrate PB.

The conductive layer CL1 includes a plurality of terminal patterns (bonding leads, bonding pads, terminals, electrodes) SP for connection to the semiconductor chip CP2, and a plurality of terminal patterns (lands, conductive lands, terminals, electrodes) TP1, TP2 for connection to the capacitor C1.

The conductive layer CL1 may further include wirings, for example, wirings integrally connected to the terminal patterns SP, TP1, and TP2.

The conductive layer CL8 is the lowest conductive layer of the plurality of conductive layers CL1 to CL8 of the wiring substrate PB, that is, the conductive layer on the lowest surface PB2 side.

The conductive layer CL8 is formed on the lower surface of the lowest insulative layer ZL7 of the plurality of insulating layers ZL1 to ZL7 included in the wiring substrate PB.

The conductive layer CL8 includes a plurality of lands LA functioning as external input/output terminals of the semiconductor device SD2.

Each of the conductive layers CL2 to CL7 has a plurality of wirings, and these wirings constitute internal wirings of the wiring substrate PB.

The conductive layers CL1 to CL8 constituting the wiring substrate PB are electrically connected to each other through via wirings VA formed in the insulating layers ZL1 to ZL7 as necessary.

The via wiring VA is formed of a conductor in a via hole formed in the insulating layer.

Therefore, a plurality of terminals (terminal patterns SP, TP1, TP2) on the upper surface PB1 side of the wiring substrate PB are electrically connected to a plurality of terminals (lands LA) on the lower surface PB2 side of the wiring substrate PB via internal wirings and via wirings VA of the wiring substrate PB as necessary.

The wiring substrate PB further includes a solder resist layer (solder resist layer, insulating layer, insulating layer) SR1 on the upper surface PB1 side and a solder resist layer (solder resist layer, insulating layer, insulating layer) SR2 on the lower surface PB2 side.

The solder resist layer SR1 is formed on the upper surface of the uppermost insulating layer ZL1 of the plurality of insulating layers ZL1 to ZL7 included in the wiring substrate PB so as to cover the conductive layer CL8.

The solder resist layer SR2 is formed on the lower surface of the lowest insulating layer ZL7 of the plurality of insulating layers ZL1 to ZL7 included in the wiring substrate PB so as to cover the conductive layer CL8.

Therefore, the uppermost film of the wiring substrate PB corresponds to the solder resist layer SR1, and the lowermost film of the wiring substrate PB corresponds to the solder resist layer SR2.

The conductive layer CL8 does not cover all the regions with the solder resist layer SR2, and has a region covered with the solder resist layer SR2 and a region exposed from the opening portion of the solder resist layer SR2 without being covered with the solder resist layer SR2.

Specifically, an opening portion is formed in the solder resist layer SR2 of the wiring substrate PB at a position aligned with each of the plurality of lands LA.

Each land LA is at least partially exposed from the opening portion of the solder resist layer SR2, and a solder ball (protruding electrode) SB made of a solder material is connected (bonded) to the exposed portion of the land LA.

The plurality of solder balls SB included in the semiconductor device SD2 are arranged in an array over substantially the entire lower surface PB2 of the wiring substrate PB.

Therefore, the plurality of lands LA are also arranged in an array over almost the entire lower surface PB2 of the wiring substrate PB.

The solder balls SB can function as external connection terminals of the semiconductor device SD2.

For example, when the semiconductor device SD2 is mounted on the motherboard MB shown in FIG. 1, a plurality of solder balls SB of the semiconductor device SD2 are connected (bonded or soldered) to a plurality of terminals TM2 of the motherboard MB.

The conductive layer CL1 does not cover all the regions with the solder resist layer SR1, but has a region covered with the solder resist layer SR1 and a region exposed from the opening portion of the solder resist layer SR1 without being covered with the solder resist layer SR1.

The conductive layer CL1 exposed from the opening portion of the solder resist layer SR1 functions as a terminal for electrically connecting the semiconductor chip CP2 or the chip capacitor CC.

In the semiconductor chip CP2, for example, after various semiconductor elements are formed on a semiconductor substrate (semiconductor wafer) made of single crystal silicon or the like, a multilayer wiring structure including a plurality of wiring layers is formed on the semiconductor substrate, and, if necessary, the back surface of the semiconductor substrate is ground, and then the semiconductor substrate is separated into semiconductor chips by dicing or the like.

Therefore, various circuits are formed in the semiconductor chip CP2 as necessary.

The semiconductor chip CP2 has a front surface which is one main surface (more specifically, a main surface on the side on which the plurality of pads PD are formed) and a back surface which is the opposite main surface, and the planar shape of the semiconductor chip CP2 is a quadrangle (more specifically, a rectangular shape).

The semiconductor chip CP2 has a plurality of pads (pad electrodes, bonding pads) PD, and the plurality of pads PD are exposed from an opening portion provided in a protective film (insulating film) of the uppermost layer of the semiconductor chip CP2.

Therefore, each pad PD is exposed on the surface of the semiconductor chip CP2, and a bump electrode (protruding electrode) BP is formed (connected) on the exposed portion of the pad PD.

That is, a plurality of bump electrodes BP is formed on the plurality of pads PD included in the semiconductor chip CP2. The plurality of pads PD included in the semiconductor chip CP2 are electrically connected to various circuits formed inside the semiconductor chip CP2.

The plurality of pads PD included in the semiconductor chip CP2 include the pad electrodes Rx, RxL, Vd, and Vs shown in FIG. 2.

The semiconductor chip CP2 is flip-chip connected to the upper surface PB1 of the wiring substrate PB.

That is, the semiconductor chip CP2 is mounted on the upper surface PB1 of the wiring substrate PB with its rear surface facing upward and its front surface, i.e., the main surface on the pad PD forming side, facing the upper surface PB1 of the wiring substrate PB.

Accordingly, the semiconductor chip CP2 is face-down bonded to the upper surface PB1 of the wiring substrate PB.

The conductive layer CL1 includes a plurality of terminal patterns SP for connecting the semiconductor chip CP2.

In the wiring substrate PB, an opening portion is formed in the solder resist layer SR1 covering the conductive layer CL1 at a position matching each of the plurality of terminal patterns SP.

The bump electrodes BP of the semiconductor chip CP2 are connected (bonded) to the terminal patterns SP exposed from the openings of the solder resist layer SR1.

Accordingly, the plurality of pads PD of the semiconductor chip CP2 are electrically connected to the plurality of terminal patterns SP of the wiring substrate PB via the plurality of bump electrodes BP, respectively.

In the wiring substrate PB, the plurality of terminal patterns SP are arranged in a region overlapping with the semiconductor chip CP2 in plan view, hereinafter referred to as a chip mounting region.

The arrangement of the plurality of terminal patterns SP in the chip mounting region of the wiring substrate PB is the same as the arrangement of the plurality of pads PD on the surface of the semiconductor chip CP2, and is, for example, in an array form.

An underfill resin (sealing resin, sealing portion) IF is filled (disposed) between (the upper surface PB1 of) the wiring substrate PB and (the surface of) the semiconductor chip CP2.

The bump electrodes BP are sealed by the underfill resin UF, so that the stress on the bump electrodes BP due to the difference in thermal expansion coefficient between the semiconductor chip CP2 and the wiring substrate PB can be alleviated, and the reliability of the electrical connection between the semiconductor chip CP2 and the wiring substrate PB can be improved.

Although the semiconductor chip CP2 is face-down bonded onto the wiring substrate PB in the present embodiment, as another mode, the semiconductor chip CP2 may be face-up bonded onto the upper surface PB1 of the wiring substrate PB.

In this case, the back surface of the semiconductor chip CP2 is bonded to the top surface PB1 of the wiring substrate PB via a die bonding material, the plurality of terminal patterns SP are arranged around the chip mounting region in the wiring substrate PB, and the plurality of pads PD of the semiconductor chip CP2 and the plurality of terminal patterns SP of the wiring substrate PB are electrically connected via a plurality of wires (bonding wires).

In the example shown in FIG. 6, a heat dissipation member (heat radiating plate, heat spreader) HS is attached to the back surface of the semiconductor chip CP2 via an adhesive SZ.

The heat dissipation member HS is, for example, a metal plate having a thermal conductivity higher than that of the wiring substrate PB, and has a function of discharging heat generated in the semiconductor chip CP2 to the outside.

In plan view, the semiconductor chip CP2 is included in the heat dissipation member HS.

On the upper surface PB1 of the wiring substrate PB, a supporting frame SFR for supporting the heat dissipation member HS is disposed around the semiconductor chip CP2.

The support frame SFR is bonded and fixed to the upper surface PB1 of the wiring substrate PB via an adhesive, and the heat dissipation member HS is bonded and fixed to the back surface of the semiconductor chip CP2 and the support frame SFR via an adhesive.

Therefore, the heat dissipation member HS is mounted on the upper surface PB1 of the wiring substrate PB via the support frame SFR, and the semiconductor chip CP2 is covered with the heat dissipation member HS and surrounded by the support frame SFR in plan view.

The support frame SFR is made of, for example, a metal material.

By fixing the metallic support frame SFR around the semiconductor chip CP2, warp deformation of the wiring substrate PB can be suppressed.

In addition, the heat dissipation member HS can be stably fixed.

Although the heat dissipation member HS is attached to the back surface of the semiconductor chip CP2 in the present embodiment, as another mode, the back surface of the semiconductor chip CP2 may be exposed without attaching the heat dissipation member HS to the semiconductor chip CP2.

As still another mode, both the support frame SFR and the heat dissipation member HS may be omitted.

Next, the connection structure between the wiring substrate PB and the chip capacitor CC will be described in detail.

Figure 8:
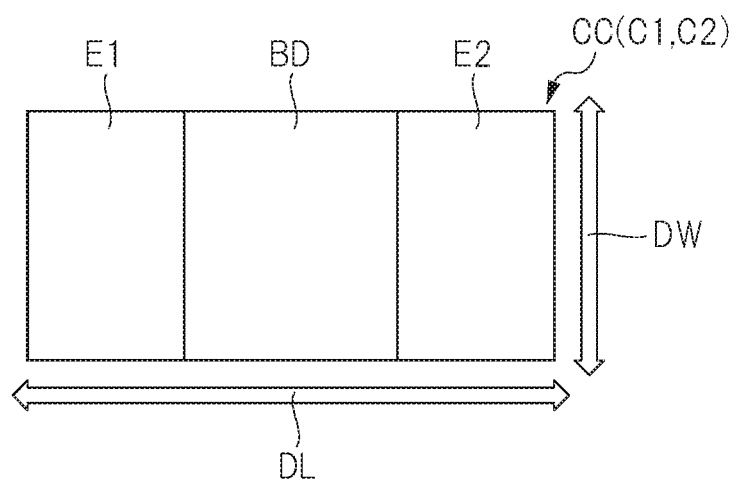
FIG. 8 is plan view of a chip capacitor used in the semiconductor device shown in FIG. 3.

FIG. 8 is plan view showing the chip capacitor CC.

Figure 9:
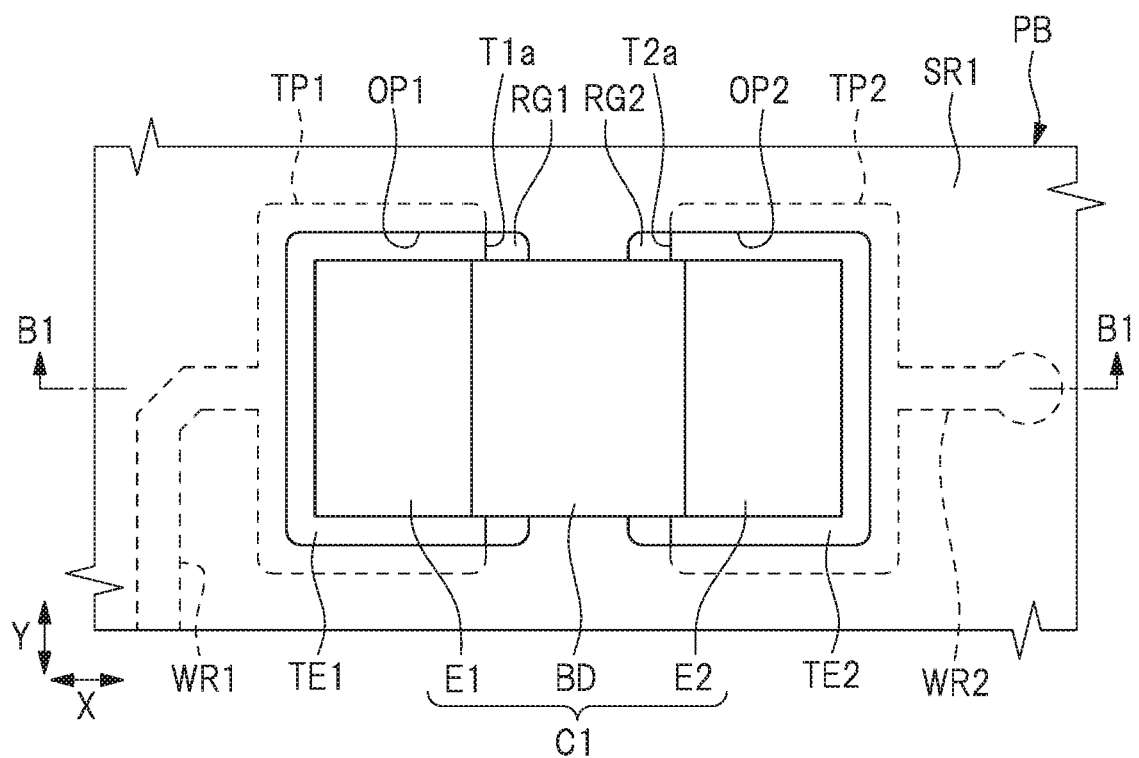
FIG. 9 is a partially enlarged plan view of a portion of FIG. 5.

FIG. 9 is a partially enlarged plan view of the semiconductor device SD2, and shows an enlarged view of the region R1 in FIG. 5.

Figure 10:
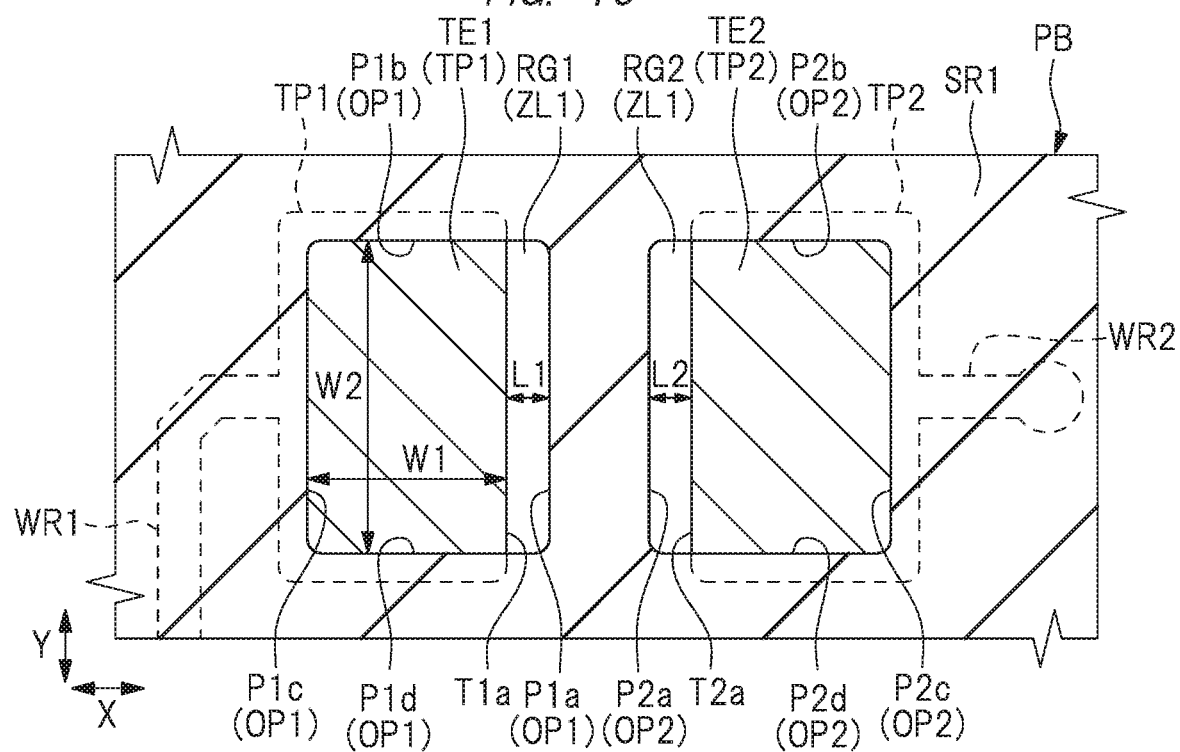
FIG. 10 is a top view of the wiring substrate shown in FIG. 9.

FIG. 10 is a partially enlarged plan view of the wiring substrate PB, and shows a top view of the wiring substrate PB shown in FIG. 9, that is, an enlarged view (partially enlarged plan view) of the wiring substrate PB in the region R1 of FIG. 5.

Figure 11:
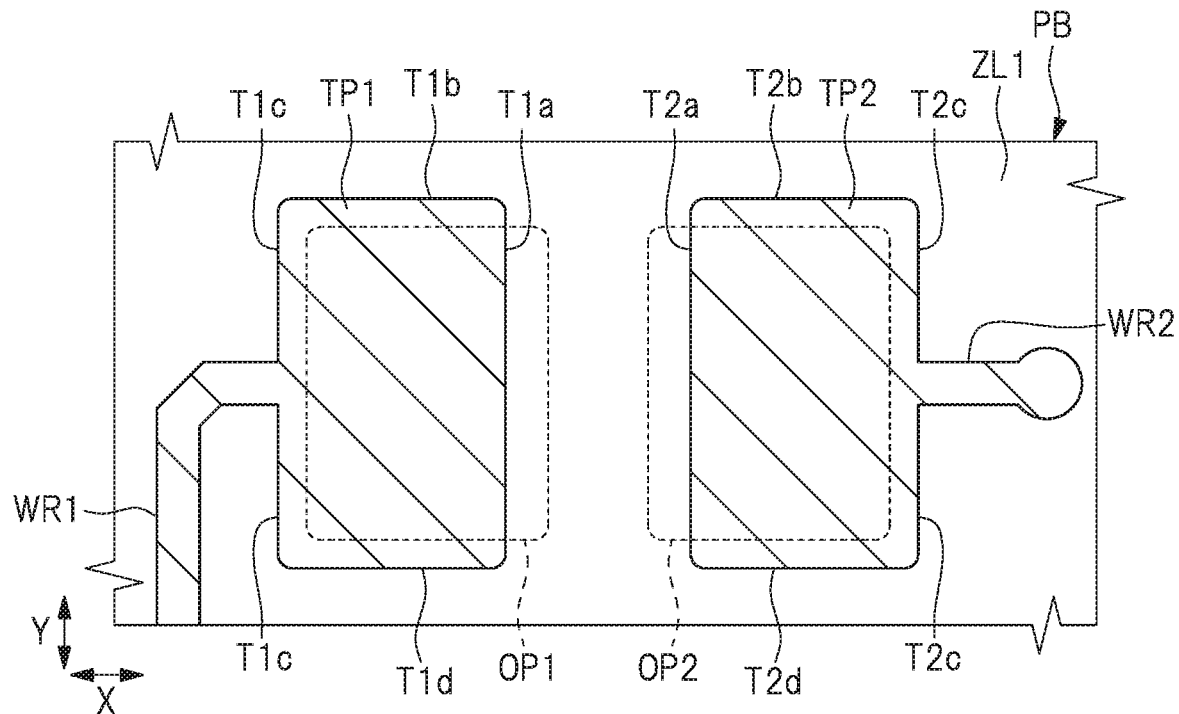
FIG. 11 is a plan perspective view of the solder resist layer in the wiring substrate shown in FIG. 10.

FIG. 11 is a partially enlarged plan perspective view of the solder resist layer SR1 in the wiring substrate PB shown in FIG. 10.

For this reason, FIGS. 9 to 11 show the same planar regions.

Figure 12:
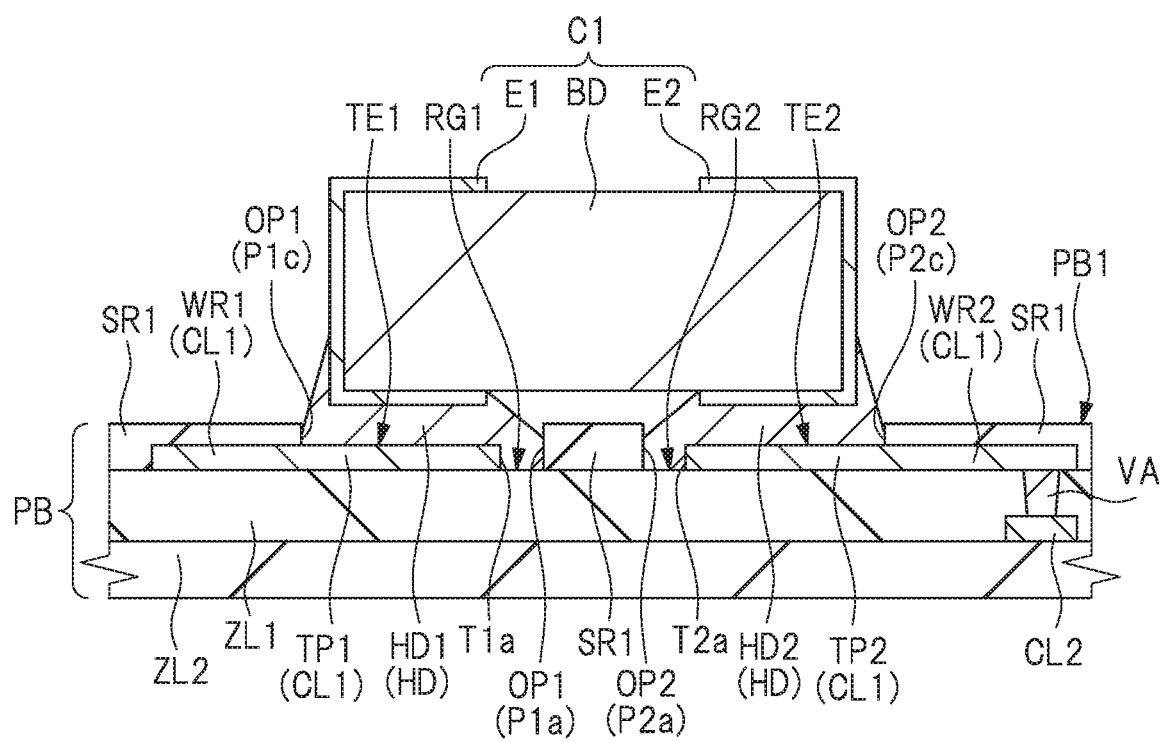
FIG. 12 is a cross-sectional view along line B1-B1 of FIG. 9.

FIG. 12 is a partially enlarged cross-sectional view of the semiconductor device SD2, and is a cross-sectional view along line B1-B1 in FIG. 9.

Figure 13:
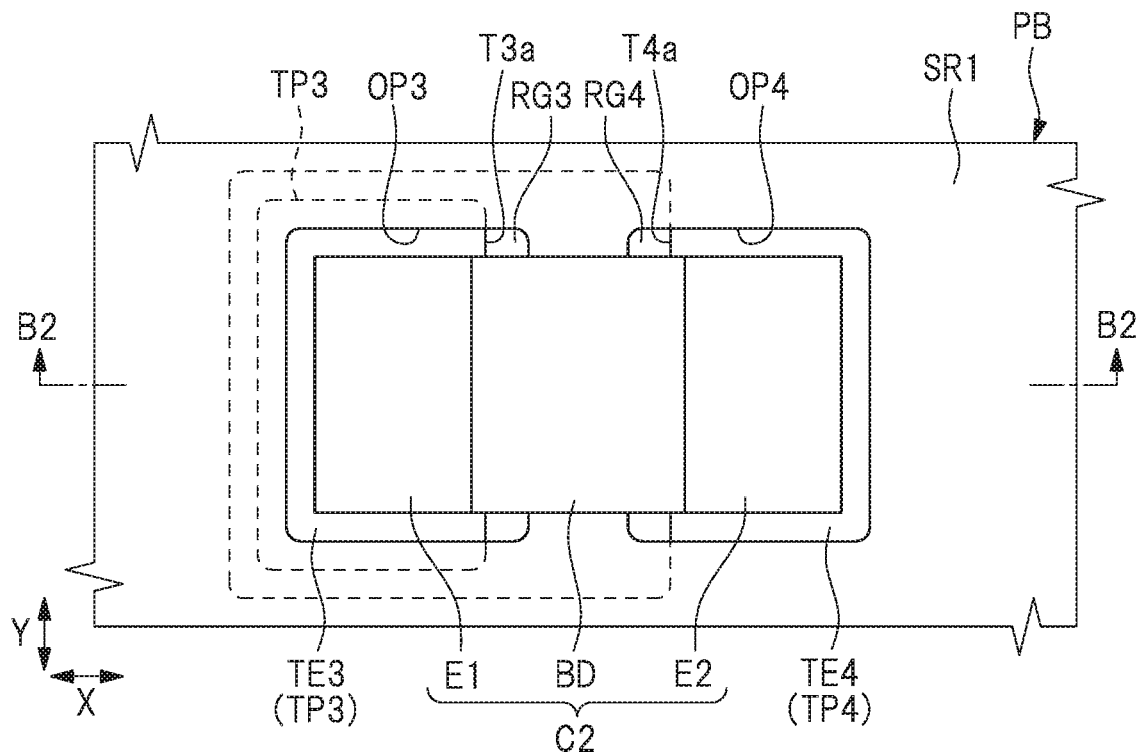
FIG. 13 is a partially enlarged plan view of a portion of FIG. 5.

FIG. 13 is a partially enlarged plan view of the semiconductor device SD2, and shows an enlarged view of the region R2 in FIG. 5.

Figure 14:
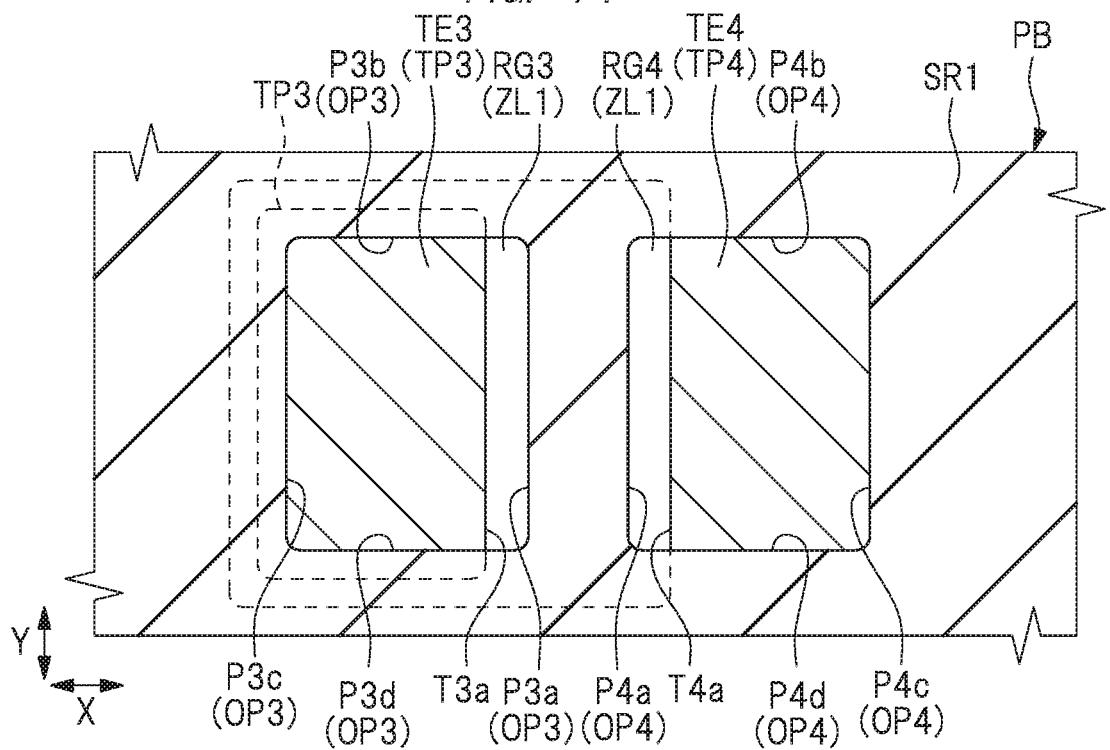
FIG. 14 is a top view of the wiring substrate shown in FIG. 13.

FIG. 14 is a partially enlarged plan view of the wiring substrate PB, and shows a top view of the wiring substrate PB shown in FIG. 13, that is, an enlarged view of the wiring substrate PB in the region R2 of FIG. 5.

Figure 15:
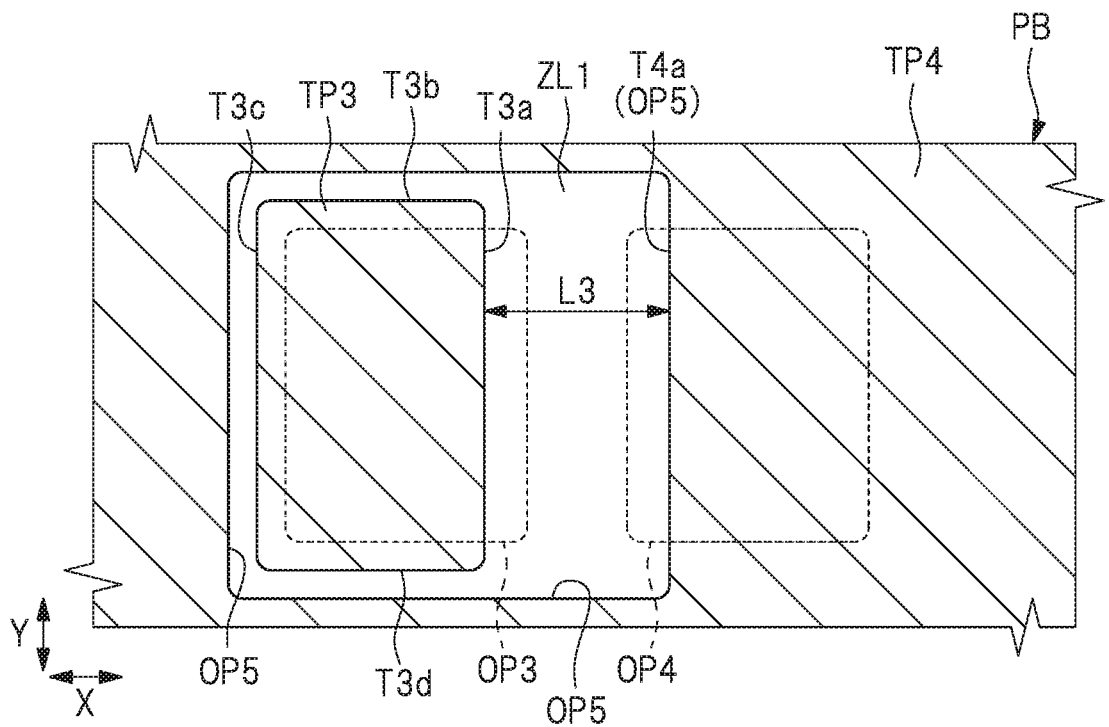
FIG. 15 is a plan perspective view of the solder resist layer in the wiring substrate shown in FIG. 14.

FIG. 15 is a partially enlarged plan perspective view of the solder resist layer SR1 in the wiring substrate PB shown in FIG. 14.

For this reason, FIGS. 13 to 15 show the same planar regions.

Figure 16:
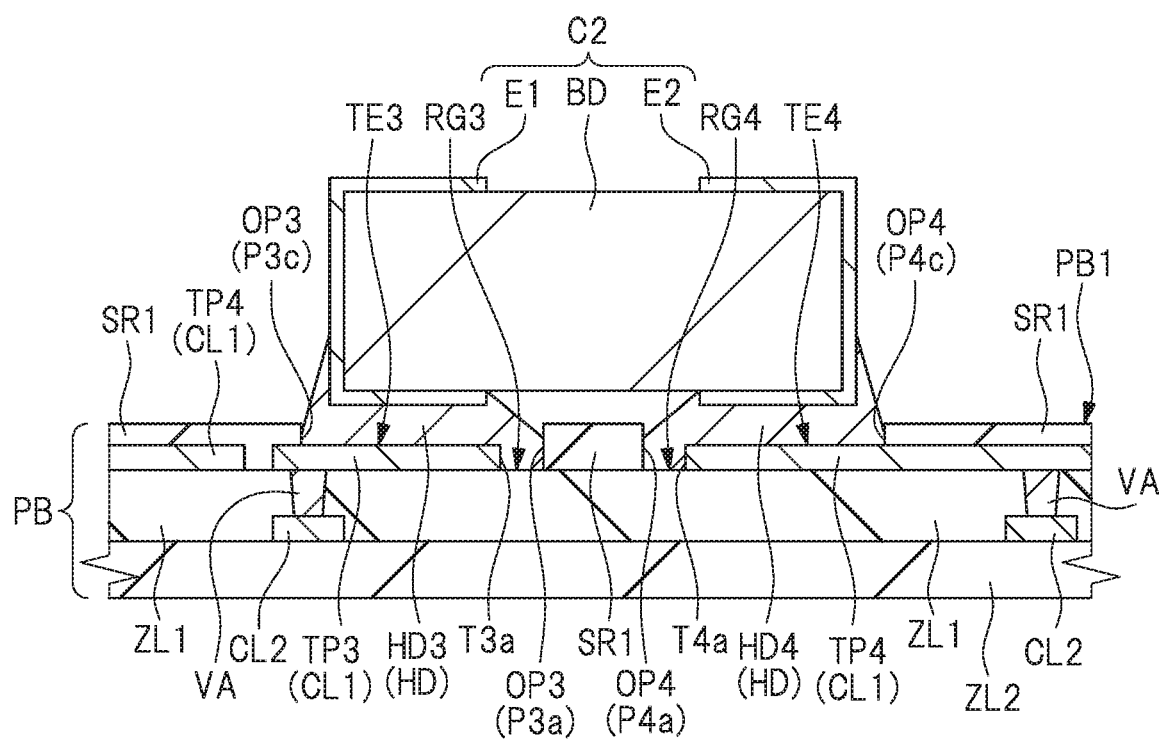
FIG. 16 is a cross-sectional view along line B2-B2 of FIG. 13.

FIG. 16 is a partially enlarged cross-sectional view of the semiconductor device SD2, and shows a cross-sectional view along line B2-B2 in FIG. 13.

In FIGS. 12 and 16, the structure of the wiring substrate PB below the insulating layer ZL2 is omitted.

FIG. 10 is plan view, but the solder resist layer SR1 and the terminal patterns TP1 and TP2 exposed from the opening portions OP1 and OP2, that is, the terminal portions TE1 and TE2, are hatched, respectively.

FIG. 11 is plan view, but the terminal patterns TP1 and TP2 and the wirings WR1 and WR2 are hatched.

FIG. 14 is plan view, but the solder resist layer SR1, the terminal pattern TP3 and the conductive plane TP4 exposed from the opening portions OP3 and OP 4, i.e., the terminal portions TE3 and TE4, are hatched, respectively.

FIG. 15 is plan view, but the terminal pattern TP3 and the conductor plane TP4 are hatched.

A plurality of chip capacitors CC constituting the capacitor C1 and a plurality of chip capacitors CC constituting the capacitor C2 are mounted on the upper surface PB1 of the wiring substrate PB.

As shown in FIG. 8, each of the chip capacitors CC, that is, each of the capacitors C1 and C2 has a rectangular planar shape in plan view, and has a rectangular outer shape when viewed three-dimensionally.

The chip capacitor CC has, in plan view, two long sides (side surfaces) extending along the extending direction (longitudinal direction) DL and two short sides (side surfaces) extending along the width direction DW orthogonal to the extending direction DL.

The chip capacitor CC has an electrode (terminal electrode, terminal electrode) E1 and an electrode (terminal electrode, terminal electrode) E2 which are arranged at opposite ends in the extending direction DL.

The chip capacitor CC further includes a main body BD sandwiched between the electrodes E1 and E2.

That is, the chip capacitor CC has the electrode E1 on one end side in the extension direction DL, and has the electrode E2 on the opposite end side, and the main body portion BD is interposed between the electrode E1 and the electrode E2 in the extending direction DL.

The main body portion BD is formed, for example, by stacking a plurality of conductive layers with an insulating layer (dielectric layer) interposed therebetween.

However, in the main body portion BD, the conductive layer is not exposed to the outer surface, and the outer surface of the main body portion BD is made of an insulator.

In the chip capacitor CC, the electrode E1 and the electrode E2 function as external electrode terminals (electrodes, terminals, external terminals, external connection terminals) for taking out the capacitance formed between the plurality of conductive layers disposed opposite to each other in the main body portion BD to the outside of the chip capacitor CC.

Although an example of the structure of the chip capacitor CC has been described here, various modifications may be made to the structure of the chip capacitor CC.

Although a plurality of chip capacitors CC (C1, C2) are mounted on the top surface PB1 of the wiring substrate PB, a plurality of capacitors C2 are disposed around the semiconductor chip CP2 in a plane view, and a plurality of capacitors C1 are further disposed around the plurality of capacitors C1.

That is, in plan view, a plurality of capacitors C2 are arranged near the semiconductor chip CP2, and a plurality of capacitors C1 are arranged farther than the plurality of capacitors C2.

Therefore, the distance (interval) between the semiconductor chip CP2 and the capacitor C2 is smaller than the distance (interval) between the semiconductor chip CP2 and the capacitor C1.

The capacitor C1 is connected in series to a signal transmission path SGP2 for inputting or outputting an electric signal to or from the circuits in the semiconductor chip CP2. Since the capacitor C2 for the power supply circuit is preferably arranged near the circuit that consumes power, it is preferably arranged near the semiconductor chip CP2.

In FIG. 5, the plurality of chip capacitors CC arranged inside the support frame SFR are all capacitors C2, and the plurality of chip capacitors CC arranged outside the support frame SFR are all capacitors C1.

First, a connection structure between the wiring substrate PB and the capacitor C1 will be described with reference to FIGS. 8 to 12.

The uppermost conductive layer CL1 of the plurality of conductive layers CL1 to CL8 included in the wiring substrate PB includes terminal patterns TP1 and TP2 for connecting the capacitor C1.

The terminal pattern TP1 is a terminal pattern electrically connected to the electrode E1 of the capacitor C1, and the terminal pattern TP2 is a terminal pattern electrically connected to the electrode E2 of the capacitor C1.

In the wiring substrate PB, a pair of terminal patterns TP1 and TP2 are provided for each capacitor C 1 mounted thereon.

A part of the terminal pattern TP1 is exposed from an opening portion OP1 provided in the solder resist layer SR1 covering the conductive layer CL1, and the other part of the terminal pattern TP1 is covered with the solder resist layer SR1.

A part of the terminal pattern TP2 is exposed from the opening portion OP2 provided in the solder resist layer SR1 covering the conductive layer CL1, and the other part of the terminal pattern TP2 is covered with the solder resist layer SR1.

The terminal pattern TP1 is not exposed from the opening portion OP2, and the terminal pattern TP2 is not exposed from the opening portion OP1.

In plan view, the opening portion OP1 and the opening portion OP2 of the solder resist layer SR1 are adjacent to each other in the X direction, but are not connected to each other and are separated from each other.

A solder resist layer SR1 is present between the opening portion OP1 and the opening portion OP2.

The terminal patterns TP1 and TP2 are adjacent to each other in the X direction, but are not connected to each other and are separated from each other.

Here, the X direction and the Y direction shown in FIGS. 9 to 11 and the like are directions parallel to the upper surface PB1 of the wiring substrate PB and orthogonal to each other.

When the chip capacitors CC (C1, C2) are mounted on the upper surface PB1 of the wiring substrate PB, the chip capacitors CC (C1, C2) are mounted so that the extending direction DL of the chip capacitors CC (C1, C2) substantially coincides with the X direction.

Therefore, in the manufactured semiconductor device SD2, the extending direction DL of the chip capacitors CC C1 and C2 substantially coincides with the X direction.

The planar shape of each of the terminal patterns TP1 and TP2 is a rectangular shape.

Specifically, the planar shape of the terminal pattern TP1 is a rectangular shape having sides T1$a$ and T1$c$ extending in the Y direction and sides T1$b$ and T1$d$ extending in the X direction, and the corners of the rectangular shape can be rounded.

The side T1$a$ and the side T1$c$ of the terminal pattern TP1 are substantially parallel to each other and located on opposite sides in the X direction.

The side T1$b$ and the side T1$d$ of the terminal pattern TP1 are substantially parallel to each other and located on opposite sides in the Y direction.

The planar shape of the terminal pattern TP2 is a rectangular shape having sides T2$a$ and T2$c$ extending in the Y direction and sides T2$b$ and T2$d$ extending in the X direction, and the corners of the rectangular shape can be rounded.

The side T2$a$ and the side T2$c$ of the terminal pattern TP2 are substantially parallel to each other and located on opposite sides in the X direction.

The side T2$b$ and the side T2$d$ of the terminal pattern TP2 are substantially parallel to each other and located on opposite sides in the Y direction.

Of the sides T1$a$, T1$b$, T1$c$, and T1$d$ of the terminal, pattern TP1, the side that is closest to the terminal pattern TP2 (opening portion OP2, terminal portion TE2) is the side T1$a$, and the side that is closest to the terminal pattern TP1 (opening portion OP1, terminal portion TE1) is the side T2$a$ among the sides T2$a$, T2$b$, T2$c$, and T2$d$ of the terminal pattern TP2.

The side T1$a$ of the terminal pattern TP1 and the side T2$a$ of the terminal pattern TP2 are adjacent to each other in the X direction, and thus are opposed to each other in the X direction.

Between the terminal pattern TP1 and the terminal pattern TP2, that is, between the side T1a of the terminal pattern TP1 and the side T2a of the terminal pattern TP2, no other conductive pattern constituting the conductive layer CL1 is arranged.

The planar shape of each of the opening portions OP1 and OP2 is a square shape, more specifically, a rectangular shape. Specifically, the planar shape of the opening portion OP1 is a rectangular shape having sides P1a and P1c extending in the Y direction and sides P1b and P1d extending in the X direction, and the corners of the rectangular shape can be rounded.

The side P1a and the side P1c of the opening portion OP1 are substantially parallel to each other and located on opposite sides in the X direction.

The side P1b and the side P1d of the opening portion OP1 are substantially parallel to each other and located on opposite sides in the Y direction.

The side P1a of the opening portion OP1 extends along the side T1a of the terminal pattern TP1, the side P1b of the opening portion OP1 extends along the side T1b of the terminal pattern TP1, the side P1c of the opening portion OP1 extends along the side T1c of the terminal pattern TP1, and the side P1d of the opening portion OP1 extends along the side T1d of the terminal pattern TP1.

The length (dimension) of each of the sides P1a and P1c of the opening portion OP1 is smaller than the length (dimension) of each of the sides T1a and T1c of the terminal pattern TP1.

The planar shape of the opening portion OP2 is a rectangular shape having sides P2a and P2c extending in the Y direction and sides P2b and P2d extending in the X direction, and the corners of the rectangular shape can be rounded.

The side P2a and the side P2c of the opening portion OP2 are substantially parallel to each other and located on opposite sides in the X direction.

The side P2b and the side P2d of the opening portion OP2 are substantially parallel to each other and located on opposite sides in the Y direction.

The side P2a of the opening portion OP2 extends along the side T2a of the terminal pattern TP2, the side P2b of the opening portion OP2 extends along the side T2b of the terminal pattern TP2, the side P2c of the opening portion OP2 extends along the side T2c of the terminal pattern TP2, and the side P2d of the opening portion OP2 extends along the side T2d of the terminal pattern TP2.

The length (dimension) of each of the sides P2a and P2c of the opening portion OP2 is smaller than the length (dimension) of each of the sides T2a and T2c of the terminal pattern TP2.

Of the sides P1a, P1b, P1c, and P1d of the opening portion OP1, the side P1a is closest to the opening portion OP2, and of the sides P2a, P2b, P2c, and P2d of the opening portion OP2, the side P2a is closest to the opening portion OP1.

The side P1a of the opening portion OP1 and the side P2a of the opening portion OP2 are adjacent to each other in the X direction, and thus are opposed to each other in the X direction.

A solder resist layer SR 1 exists between the side P1a of the opening portion OP1 and the side P2a of the opening portion OP2.

Although the opening portion OP1 of the solder resist layer SR1 and the terminal pattern TP1 partially overlap in plan view, the positional relationship between the opening portion OP1 of the solder resist layer SR1 and the terminal pattern TP1 is as follows.

The side T1a of the terminal pattern TP1 is exposed from the opening portion OP1 of the solder resist layer SR1, but the outer periphery (sides T1b, T1c, T1d) of the terminal pattern TP1 other than the side T1a is not exposed from the opening portion OP1 of the solder resist layer SR1.

That is, the sides T1b, T1c, and T1d of the terminal pattern TP1 extend outside the opening portion OP1 in plan view and are covered with the solder resist layer SR1, while the side T1a of the terminal pattern TP1 crosses the sides P1b and P1d of the opening portion OP1 and extends inside the opening portion OP1 of the solder resist layer SR1.

Comparing the positions of the side T1a of the terminal pattern TP1 and the side P1a of the opening portion OP1 of the solder resist layer SR1, the side P1a of the opening portion OP1 is positioned closer to (the side P2a of) the opening portion OP2 than the side T1a of the terminal pattern TP1.

That is, the distance (distance in the X direction) between the side P1a of the opening portion OP1 and (the side P2a of the opening portion OP2) is smaller than the distance (distance in the X direction) between the side T1a of the terminal pattern TP1 and (the side P2a of the opening portion OP2).

When comparing the positions of the side T1c of the terminal pattern TP1 and the side P1c of the opening portion OP1 of the solder resist layer SR1, the side P1c of the opening portion OP1 is located closer to the (side P2a of) the opening portion OP2 than the side T1c of the terminal pattern TP1.

That is, the distance (distance in the X direction) between the side P1c of the opening portion OP1 and (the side P2a of) the opening portion OP2 is smaller than the distance (distance in the X direction) between the side T1c of the terminal pattern TP1 and (the side P2a of) the opening portion OP2.

In plan view, the sides T1b, T1c, and T1d of the terminal pattern TP1 extend outside the opening portion OP1 of the solder resist layer SR1 along the sides P1b, P1c, and P1d of the opening portion OP1, and a solder resist material constituting the solder resist layer SR1 exists between the sides T1b, T1c, and T1d of the terminal pattern TP1 and the sides P1b, P1c, and P1d of the opening portion OP1.

In plan view, the side T1a of the terminal pattern TP1 extends inside the opening portion OP1 of the solder resist layer SR1 along the side P1a of the opening portion OP1.

In plan view, the region between the side T1a of the terminal pattern TP1 and the side P1a of the opening portion OP1 has a structure in which the insulative layer ZL1 is exposed from the opening portion OP1 without disposing the solder resist material constituting the solder resist layer SR1 and the conductive material constituting the conductive layer CL1.

Although the opening portion OP2 of the solder resist layer SR1 and the terminal pattern TP2 partially overlap in plan view, the positional relationship between the opening portion OP2 of the solder resist layer SR1 and the terminal pattern TP2 is as follows.

The side T2a of the terminal pattern TP2 is exposed from the opening portion OP2 of the solder resist layer SR1, but the outer periphery of the terminal pattern TP2 other than the side T2a (sides T2b, T2c, T2d) is not exposed from the opening portion OP2 of the solder resist layer SR1.

That is, the sides T2b, T2c, and T2d of the terminal pattern TP 2 extend outside the opening portion OP2 in plan view and are covered with the solder resist layer SR1, while the side T2a of the terminal pattern TP2 crosses the sides P2b and P2*d* of the opening portion OP2 and extends inside the opening portion OP2 of the solder resist layer SR1.

Comparing the positions of the side T2*a* of the terminal pattern TP2 and the side P2*a* of the opening portion OP2 of the solder resist layer SR1, the side P2*a* of the opening portion OP2 is located closer to (the side P1*a* of) the opening portion P1 than the side T2*a* of the terminal pattern TP2.

That is, the distance (distance in the X direction) between the side P2*a* of the opening portion OP2 and (the side P1*a* of) the opening portion OP1 is smaller than the distance (distance in the X direction) between the side T2*a* of the terminal pattern TP2 and (the side P1*a* of) the opening portion OP1.

When comparing the positions of the side T2*c* of the terminal pattern TP2 and the side P2*c* of the opening portion OP2 of the solder resist layer SR1, the side P2*c* of the opening portion OP2 is located closer to (the side P1*a* of) the opening portion OP1 than the side T2*c* of the terminal pattern TP2.

That is, the distance (distance in the X direction) between the side P2*c* of the opening portion OP2 and (the side P1*a* of) the opening portion OP1 is smaller than the distance (distance in the X direction) between the side T2*c* of the terminal pattern TP2 and (the side P1*a* of) the opening portion OP1.

In plan view, the sides T2*b*, T2*c*, and T2*d* of the terminal pattern TP2 extend outside the opening portion OP2 of the solder resist layer SR1 along the sides P2*b*, P2*c*, and P2*d* of the opening portion OP2, and a solder resist material constituting the solder resist layer SR1 exists between the sides T2*b*, T2*c*, and T2*d* of the terminal pattern TP2 and the sides P2*b*, P2*c*, and P2*d* of the opening portion OP2.

In plan view, the side T2*a* of the terminal pattern TP2 extends inside the opening portion OP2 of the solder resist layer SR1 along the side P2*a* of the opening portion OP2.

In plan view, the region between the side T2*a* of the terminal pattern TP2 and the side P2*a* of the opening portion OP2 has a structure in which the insulative layer ZL1 is exposed from the opening portion OP2 without disposing the solder resist material constituting the solder resist layer SR1 and the conductive material constituting the conductive layer CL1.

Here, a portion of the terminal pattern TP1 exposed from the opening portion OP1 of the solder resist layer SR1 is referred to as a terminal portion TE1.

A portion of the terminal pattern TP2 exposed from the opening portion OP2 of the solder resist layer SR1 is referred to as a terminal portion TE2.

Further, in plan view, a region (planar region) in which the terminal pattern TP1 is not arranged in the region (planar region) within the opening portion OP1 is referred to as a region RG1.

In the region RG1, the conductive material constituting the conductive layer CL1 is not disposed, and the insulative layer ZL1 is exposed from the opening portion OP1.

Further, in plan view, a region (planar region) in which the terminal pattern TP2 is not arranged in the region (planar region) in the opening portion OP2 is referred to as a region RG2.

In the region RG2, the conductive material, constituting the conductive layer CL1 is not disposed, and the insulative layer ZL1 is exposed from the opening portion OP2.

In plan view, a combination of the terminal portion TE1 and the region RG1 coincides with the opening portion OP1, and a combination of the terminal portion TE2 and the region RG2 coincides with the opening portion OP2.

The terminal portion TE1 is a region (planar region) of the terminal pattern TP1 surrounded by the side P1*b*, the side P1*c*, the side P1*d*, and the side T1*a* of the terminal pattern TP1, and the region RG1 is a region (planar region) of the opening portion OP1 between the side T1*a* of the terminal pattern TP1 and the side P1*a* of the opening portion OP1.

The terminal portion TE1 and the region RG1 are adjacent to each other in the X direction, and the boundary between the terminal portion TE1 and the region RG1 is a side T1*a* of the terminal pattern TP1.

Of the terminal portion TE1 and the region RG1, the region RG1 is located on the side closer to the opening portion OP2, and the terminal portion TE1 is located on the side farther from the opening portion OP2.

Terminal portion TE2 is an area (flat area) surrounded by the sides P2*b* and P2*c* of the opening portion OP2, the side P2*c* of the opening portion P2, the side P2*d* of the terminal pattern TP2, and the side T2*a* of the terminal pattern TP2. Area RG2 is an area (flat area) between the sides T2*a* of the terminal pattern TP2 and the side P2*a* of the opening portion OP2 of the terminal pattern TP2.

The terminal portion TE2 and the region RG2 are adjacent to each other in the X direction, and the boundary between the terminal portion TE2 and the region RG2 is a side T2*a* of the terminal pattern TP2.

Of the terminal portion TE2 and the region RG2, the region RG2 is located on the side close to the opening portion OP1, and the terminal portion TE2 is located on the side far from the opening portion OP1.

The electrode E1 of the capacitor C1 is disposed so as to face the terminal pattern TP1 (i.e., the terminal portion TE1) exposed from the opening portion OP1 of the solder resist layer SR 1, and is bonded and electrically connected to the terminal pattern TP1 (the terminal portion TE1) via a conductive bonding material (solder bonding portion) HD1 made of solder.

That is, the terminal portion TE1 exists below the electrode E1 of the capacitor C1, and the electrode E1 of the capacitor C1 and the terminal, portion TE1 are bonded and electrically connected by the bonding material HD1 interposed therebetween.

The electrode E2 of the capacitor C1 is disposed so as to face the terminal pattern TP2 (i.e., the terminal portion TE2) exposed from the opening portion OP2 of the solder resist layer SR1, and is bonded and electrically connected to the terminal pattern TP2 (the terminal portion TE2) via a conductive bonding material (solder bonding portion) HD2 made of solder.

That is, the terminal portion TE2 exists below the electrode E2 of the capacitor C1, and the electrode E2 of the capacitor C1 and the terminal portion TE2 are bonded and electrically connected by the bonding material HD2 interposed therebetween.

As a result, the capacitor C1 is mounted on and fixed to the wiring substrate PB, and is connected in series between the terminal pattern TP1 (terminal portion TE1) and the terminal pattern TP2 (terminal portion TE2) of the wiring substrate PB.

The bonding material HD1 and the bonding material HD2 are made of the same material, specifically, solder, but are not connected to each other and are separated from each other.

The conductive layer CL1 may further include a wiring WR1 integrally connected to the terminal pattern TP1 and having a width (wiring width) smaller than that of the terminal pattern TP1.

The conductive layer CL1 may further include a wiring WR2 integrally connected to the terminal pattern TP2 and having a width smaller than that of the terminal pattern TP2.

The wiring WR1 is a wiring for drawing out the terminal pattern TP1, and the wiring WR 2 is a wiring for drawing out the terminal pattern TP2.

The wirings WR 1 and WR2 are arranged at positions which do not overlap with the opening portions OP1 and OP2.

Specifically, of the sides T1$a$, T1$b$, T1$c$, and T1$d$ of the terminal pattern TP1, the wiring WR1 is connected to any one of the sides T1$b$, T1$c$, and T1$d$ covered with the solder resist layer SR1, instead of the side T1$a$ exposed from the opening portion OP1.

The wiring WR2 is connected to any one of the sides T2$b$, T2$c$, T2$d$ covered with the solder resist layer SR1, not the side T2$a$ exposed from the opening portion OP2, among the sides T2$a$, T2$b$, T2$c$, T2$d$ of the terminal pattern TP2.

Therefore, the wiring WR1 itself or the connection portion between the wiring WR1 and the terminal pattern TP1 is not exposed from the opening portion OP1.

Further, the wiring WR2 itself or the connection portion between the wiring WR2 and the terminal pattern TP2 is not exposed from the opening portion OP2.

In the case of FIG. 11, one end of the wiring WR1 is connected to the side T1$c$ of the terminal pattern TP1, and one end of the wiring WR2 is connected to the side T2$c$ of the terminal pattern TP2.

The other end of the wiring WR1 is electrically connected to a conductive pattern included in the conductive layer CL2 via a via wiring VA (not shown in FIG. 12) that penetrates the insulating layer ZL1.

The other end of the wiring WR2 is electrically connected to the conductive pattern included in the conductive layer CL2 through the via wiring VA penetrating the insulating layer ZL1.

The terminal pattern TP1 is electrically connected to the land LA on the lower surface PB2 side of the wiring substrate PB via the wiring WR1, the internal wiring of the wiring substrate PB, and the via wiring VA.

The terminal pattern TP2 is electrically connected to the terminal pattern SP on the upper surface PB 1 side of the wiring substrate PB via the wiring WR2, the internal wiring of the wiring substrate PB, and the via wiring VA.

Therefore, the electrode E1 of the capacitor C1 is electrically connected to the terminal pattern TP1 via the bonding material HD1, and further electrically connected to the solder ball SB provided on the lower surface side of the wiring substrate PB via the wiring WR1, the internal wiring, the via wiring VA, and the land LA of the wiring substrate PB.

In addition, the electrode E2 of the capacitor C1 is electrically connected to the terminal pattern TP2 via the bonding material HD2, further electrically connected to the bump electrode BP of the semiconductor chip CP2 via the wiring WR2 of the wiring substrate PB, the internal wiring, the via wiring VA, and the terminal pattern SP, and further electrically connected to the circuit in the semiconductor chip CP2 via the pad PD and the internal wiring of the semiconductor chip CP2.

As another mode, a via wiring VA penetrating the insulating layer ZL1 may be provided immediately below the terminal pattern TP1, and the terminal pattern TP1 may be electrically connected to the conductive pattern included in the conductive layer CL2 via the via wiring VA.

In this case, the wiring WR1 is not necessarily provided.

In addition, a via wiring VA penetrating the insulating layer ZL1 may be provided immediately below the terminal pattern TP2, and the terminal pattern TP2 may be electrically connected to the conductive pattern included in the conductive layer CL2 through the via wiring VA.

In this case, the wiring WR2 may not be provided.

In the conductive layer CL1, a conductive plane to which the reference potential VSS is supplied (corresponding to a conductor plane TP 4 described later) may be disposed so as to surround the terminal patterns TP 1 and TP2 (and the wirings WR 1 and WR 2) in plan view.

In other words, in the conductive layer CL1, the terminal patterns TP1 and TP2 (and the wirings WR1 and WR2) may be disposed in the opening portions provided in the conductive plane to which the reference potential VSS is supplied.

Next, a connection structure between the wiring substrate PB and the capacitor C2 will be described with reference to FIGS. 8 and 13 to 16.

The uppermost conductive layer CL1 of the plurality of conductive layers CL1 to CL8 included in the wiring substrate PB includes a terminal pattern TP3 to which the power supply potential VDD is supplied and a conductor plane (solid pattern, terminal pattern, conductive pattern) TP4 to which the reference potential VSS is supplied.

The terminal pattern TP3 and the conductor plane TP4 are not connected to each other and are separated from each other. The conductor plane TP4 has a larger area than the terminal patterns TP1, TP2, and TP3, and the terminal pattern TP3 is surrounded by the conductor plane TP4 in plan view.

That is, in plan view, the terminal pattern TP3 is arranged in the opening portion OP5 provided in the conductive plane TP4.

The other conductive patterns constituting the conductive layer CL1 are not arranged between the terminal pattern TP3 and the conductive plane TP4.

A part of the terminal pattern TP3 is exposed from an opening portion OP3 provided in the solder resist layer SR1 covering the conductive layer CL1, and the other part of the terminal pattern TP3 is covered with the solder resist layer SR1.

A part of the conductive plane TP4 is exposed from an opening portion OP4 provided in the solder resist layer SR1 covering the conductive layer CL1, and the other part of the conductor plane TP4 is covered with the solder resist layer SR1.

The terminal pattern TP3 is not exposed from the opening portion OP4, and the conductor plane TP4 is not exposed from the opening portion OP3.

In plan view, the opening portion OP3 and the opening portion OP4 of the solder resist layer SR1 are arranged adjacent to each other in the X direction, but are not connected to each other and are separated from each other.

A solder resist layer SR1 is present between the opening portion OP3 and the opening portion OP4.

Here, a portion of the terminal pattern TP3 exposed from the opening portion OP3 of the solder resist layer SR1 is referred to as a terminal portion TE3.

A portion of the conductor plane TP4 exposed from the opening portion OP4 of the solder resist layer SR1 is referred to as a terminal portion TE4.

The conductive plane TP4 can also be regarded as a terminal pattern.

The planar shape of the terminal pattern TP3 is a rectangular shape.

Specifically, the planar shape of the terminal pattern TP3 is a rectangular shape having sides T3a and T3c extending in the Y direction and sides T3b and T3d extending in the X direction, and the corners of the rectangular shape can be rounded.

The side T3a and the side T3c of the terminal pattern TP3 are substantially parallel to each other and located on opposite sides in the X direction.

The side T3b and the side T3d of the terminal pattern TP3 are substantially parallel to each other and located on opposite sides in the Y direction.

Of the sides T3a, T3b, T3c, and T3d of the terminal pattern TP3, the side closest to the opening portion OP4 is the side T3a.

The side T3a of the terminal pattern TP3 faces the side T4a of the conductive plane TP4.

In plan view, the conductive plane TP4 surrounds the terminal pattern TP3, but has a side T4a facing the side T3a of the terminal pattern TP3.

The side T4a of the conductive plane TP4 extends in the Y direction and faces the side T3a of the terminal pattern TP3 in the X direction.

No other conductive pattern constituting the conductive layer CL1 is arranged between the side T4a of the conductive plane TP4 and the side T3a of the terminal pattern TP3.

The planar shape of each of the opening portions OP3 and portion P4 is a square shape, more specifically, a rectangular shape.

Specifically, the planar shape of the opening portion OP3 is a rectangular shape having sides P3a and P3c extending in the Y direction and sides P3b and P3d extending in the X direction, and the corners of the rectangular shape can be rounded.

The side P3a and the side P3c of the opening portion OP3 are substantially parallel to each other and located on opposite sides in the X direction.

The side P3b and the side P3d of the opening portion OP3 are substantially parallel to each other and located on opposite sides in the Y direction.

The planar shape of the opening portion OP4 is a rectangular shape having sides P4a and P4c extending in the Y direction and sides P4b and P4d extending in the X direction, and the corners of the rectangular shape can be rounded.

The side P4a and the side P4c of the opening portion OP4 are substantially parallel to each other and located on opposite sides in the X direction.

The side P4b and the side P4d of the opening portion OP4 are substantially parallel to each other and located on opposite sides in the Y direction.

Of the sides P3a, P3b, P3c, and P3d of the opening portion OP3, the side P3a is closest to the opening portion OP4, and of the sides P4a, P4b, P4c, and P4d of the opening portion OP4, the side P4a is closest to the opening portion OP3.

The side P3a of the opening portion OP3 and the side P4a of the opening portion OP4 are adjacent to each other in the X direction, and thus are opposed to each other in the X direction.

A solder resist layer SR1 exists between the side P3a of the opening portion OP3 and the side P4a of the opening portion OP4.

The opening portion OP3 of the solder resist layer SR1 partially overlaps with the terminal pattern TP3 in plan view, and the positional relationship between the opening portion OP3 of the solder resist layer SR1 and the terminal pattern TP3 is basically the same as the positional relationship between the opening portion OP1 and the terminal pattern TP1 of the solder resist layer SR1 described above.

That is, the side T3a of the terminal pattern TP3 is exposed from the opening portion OP3 of the solder resist layer SR1, but the outer periphery (sides T3b, T3c, T3d) of the terminal pattern TP 3 other than the side T3a is not exposed from the opening portion OP3 of the solder resist layer SR1.

That is, the sides T3b, T3c, and T3d of the terminal pattern TP3 extend outside the opening portion OP3 in plan view and are covered with the solder resist layer SR1, while the side T3a of the terminal pattern TP3 crosses the sides P3b and P3d of the opening portion OP3 and extends inside the opening portion OP3 of the solder resist layer SR1.

Comparing the positions of the side T3a of the terminal pattern TP3 and the side P3a of the opening portion OP3 of the solder resist layer SR1, the side P3a of the opening portion OP3 is positioned closer to the opening portion OP4 than the side T3a of the terminal pattern TP3.

That is, the distance (distance in the X direction) between the side P3a of the opening portion OP3 and (the side P4a of) the opening portion OP4 is smaller than the distance (distance in the X direction) between the side T3a of the terminal pattern TP3 and (the side P4a of) the opening portion OP4.

In plan view, the sides T3b, T3c, and T3d of the terminal pattern TP3 extend outside the opening portion OP3 of the solder resist layer SR1 along the sides P3b, P3c, and P3d of the opening portion OP3, and a solder resist material constituting the solder resist layer SR1 exists between the sides T3b, T3c, and T3d of the terminal pattern TP3 and the sides P3b, P3c, and P3d of the opening portion OP3.

In plan view, the side T3a of the terminal pattern TP3 extends inside the opening portion OP3 of the solder resist layer SR1 along the side P3a of the opening portion OP3, and the region between the side T3a of the terminal pattern TP3 and the side P3a of the opening portion OP3 is a region where the terminal pattern TP3 (a conductive material constituting the conductive layer CL1) is not disposed (hereinafter referred to as a region RG3).

The region RG3 has a structure in which the insulative layer ZL 1 is exposed from the opening portion OP3.

In plan view, a combination of the terminal portion TE3 and the region RG3 coincides with the opening portion OP3.

The side T4a of the conductor plane TP4 is exposed from the opening portion OP4 of the solder resist layer SR1, but the outer periphery of the conductor plane TP4 other than the side T4a is not exposed from the opening portion OP4 of the solder resist layer SR1.

That is, the outer periphery of the conductor plane TP4 other than the side T4a extends outside the opening portion OP4 in plan view and is covered with the solder resist layer SR1, while the side T4a of the conductor plane TP4 crosses the sides P4b and P4d of the opening portion OP4 and extends inside the opening portion OP4 of the solder resist layer SR1.

Comparing the positions of the side T4a of the conductive plane TP4 and the side P4a of the opening portion OP4 of the solder resist layer SR1, the side P4a of the opening portion OP4 is positioned closer to the opening portion OP3 than the side T4a of the conductor plane TP4.

That is, the distance (distance in the X direction) between the side P4a of the opening portion OP4 and (the side P3a of) the opening portion OP3 is smaller than the distance (distance in the X direction) between the side T4a of the conductor plane TP4 and (the side P3a of) the opening portion OP3.

In plan view, the side T4a of the conductive plane TP4 extends inside the opening portion OP4 of the solder resist layer SR1 along the side P4a of the opening portion P4, and the region between the side T4a of the conductive plane TP4 and the side P4a of the opening portion OP4 is a region where the conductor plane TP4 (a conductive material constituting the conductive layer CL 1) is not disposed (hereinafter referred to as a region RG4).

The region RG4 has a structure in which the insulating layer ZL1 is exposed from the opening portion OP4.

In plan view, a combination of the terminal portion TE4 and the region RG4 coincides with the opening portion OP4.

The electrode E1 of the capacitor C2 is disposed so as to face the terminal pattern TP3 (i.e., the terminal portion TE3) exposed from the opening portion OP3 of the solder resist layer SR1, and is bonded and electrically connected to the terminal pattern TP3 (the terminal portion TE3) via a conductive bonding material (solder bonding portion) HD3 made of solder.

That is, the terminal portion TE3 exists below the electrode E1 of the capacitor C2, and the electrode E1 of the capacitor C2 and the terminal portion TE3 are bonded and electrically connected by the bonding material HD3 interposed therebetween.

The electrode E2 of the capacitor C2 is disposed so as to face the conductive plane TP4 (i.e., the terminal portion TE4) exposed from the opening portion OP4 of the solder resist layer SR1, and is bonded and electrically connected to the conductive plane TP4 (the terminal portion TE4) via a conductive bonding material (solder bonding portion) HD4 made of solder.

That is, the terminal, portion TE4 exists below the electrode E2 of the capacitor C2, and the electrode E2 of the capacitor C2 and the terminal portion TE4 are bonded and electrically connected by the bonding material HD4 interposed therebetween.

As a result, the capacitor C2 is mounted on and fixed to the wiring substrate PB, and is connected in series between the terminal pattern TP3 (terminal portion TE 3) and the conductor plane TP4 (terminal portion TE4) of the wiring substrate PB.

The bonding material HD3 and the bonding material HD4 are made of the same material, specifically, solder, but are not connected to each other and are separated from each other.

A via wiring VA penetrating the insulative layer ZL1 is provided immediately below the terminal pattern TP3, and the terminal pattern TP3 can be electrically connected to a conductive pattern (a conductive pattern to which the power supply potential VDD is supplied) included in the conductive layer CL2 via the via wiring VA.

In addition, a via wiring VA penetrating through the insulating layer ZL1 is provided immediately below the conductive plane TP4, and the conductive plane TP4 can be electrically connected to a conductive pattern included in the conductive layer CL2 (a conductive pattern to which the reference potential VSS is supplied) via the via wiring VA.

The terminal pattern TP3 is electrically connected to the land LA for supplying the power supply potential among the plurality of lands LA on the lower surface PB2 side of the wiring substrate PB via the internal wiring of the wiring substrate PB and the via wiring VA.

The power supply potential VDD is supplied into the semiconductor device SD2 from the solder ball SB connected to the power supply potential supply land LA.

The terminal pattern TP3 is electrically connected to the bump electrode BP for supplying the power supply potential among the plurality of bump electrodes BP of the semiconductor chip CP2 via the internal wiring of the wiring substrate PB, the via wiring VA, and the terminal pattern SP.

The power supply potential VDD is supplied into the semiconductor chip CP2 from the bump electrode BP for supplying the power supply potential.

The conductive plane TP4 is electrically connected to the lands LA for supplying the reference potential among the plurality of lands LA on the lower surface PB2 side of the wiring substrate PB via the internal wiring of the wiring substrate PB and the via wiring VA.

The reference potential VSS is supplied into the semiconductor device SD 2 from the solder ball SB connected to the land LA for supplying the reference potential.

The conductive plane TP4 is electrically connected to a bump electrode BP for supplying a reference potential among the plurality of bump electrodes BP of the semiconductor chip CP2.

The reference potential VSS is supplied into the semiconductor chip CP2 from the bump electrode BP for supplying the reference potential.

Next, a manufacturing process of the semiconductor device SD 2 of the present embodiment will be described.

Figure 17:
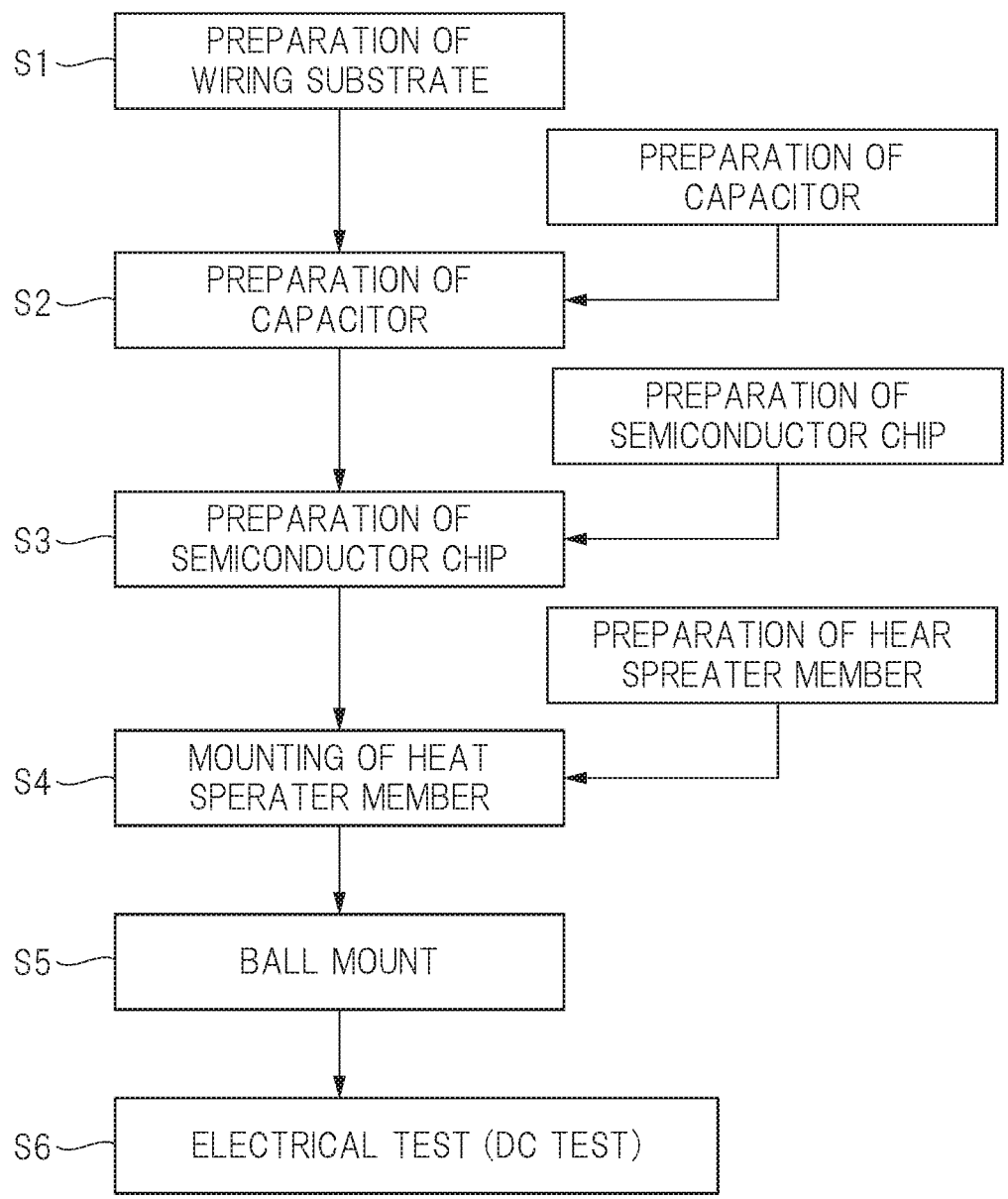
FIG. 17 is a process flow diagram showing a manufacturing process of the semiconductor device according to the embodiment.

FIG. 17 is a process flow diagram showing a manufacturing process of the semiconductor device SD2 according to the present embodiment.

Figure 18:
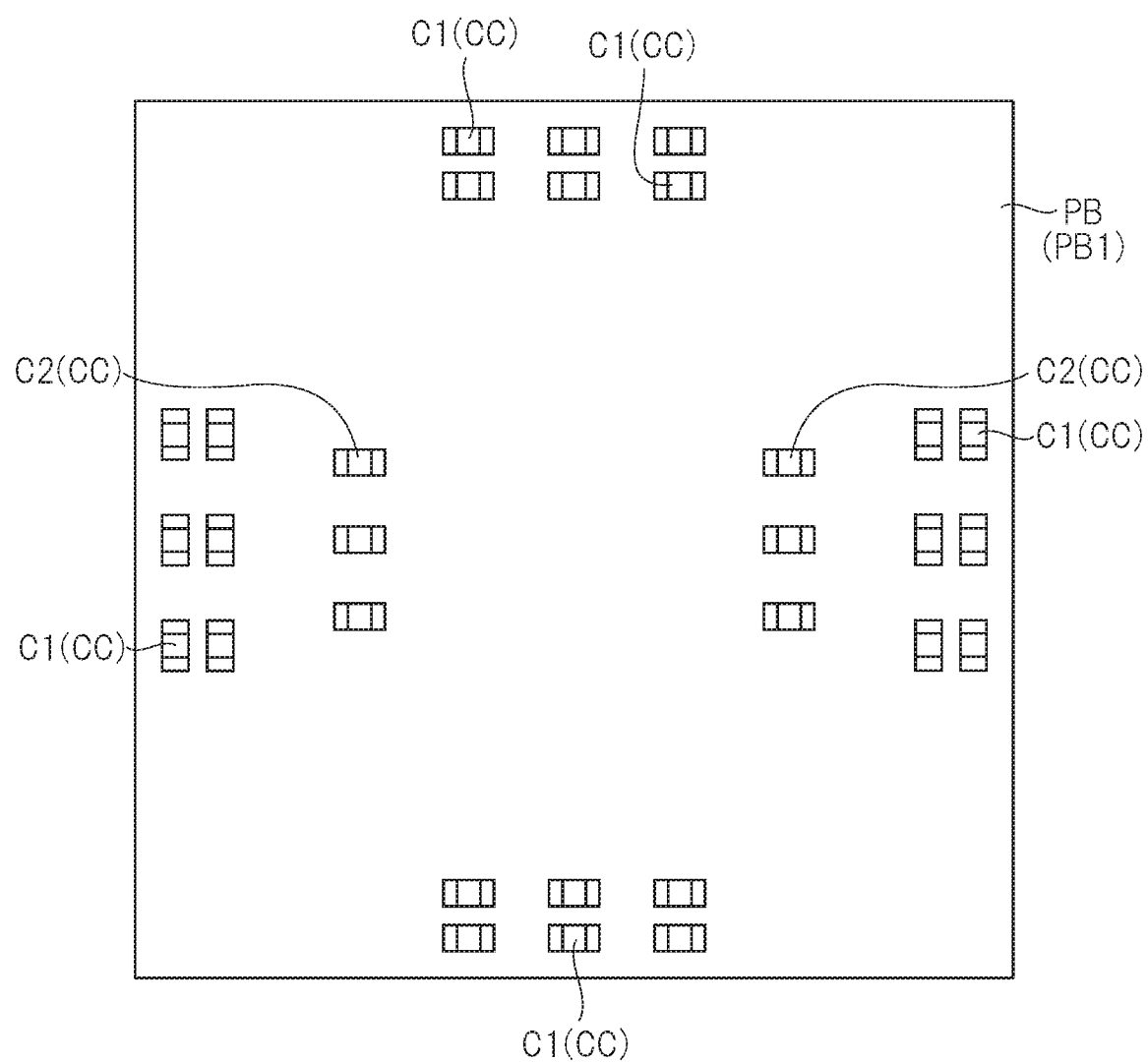
FIG. 18 is plan view during the manufacturing process of the semiconductor device according to the embodiment.
Figure 22:
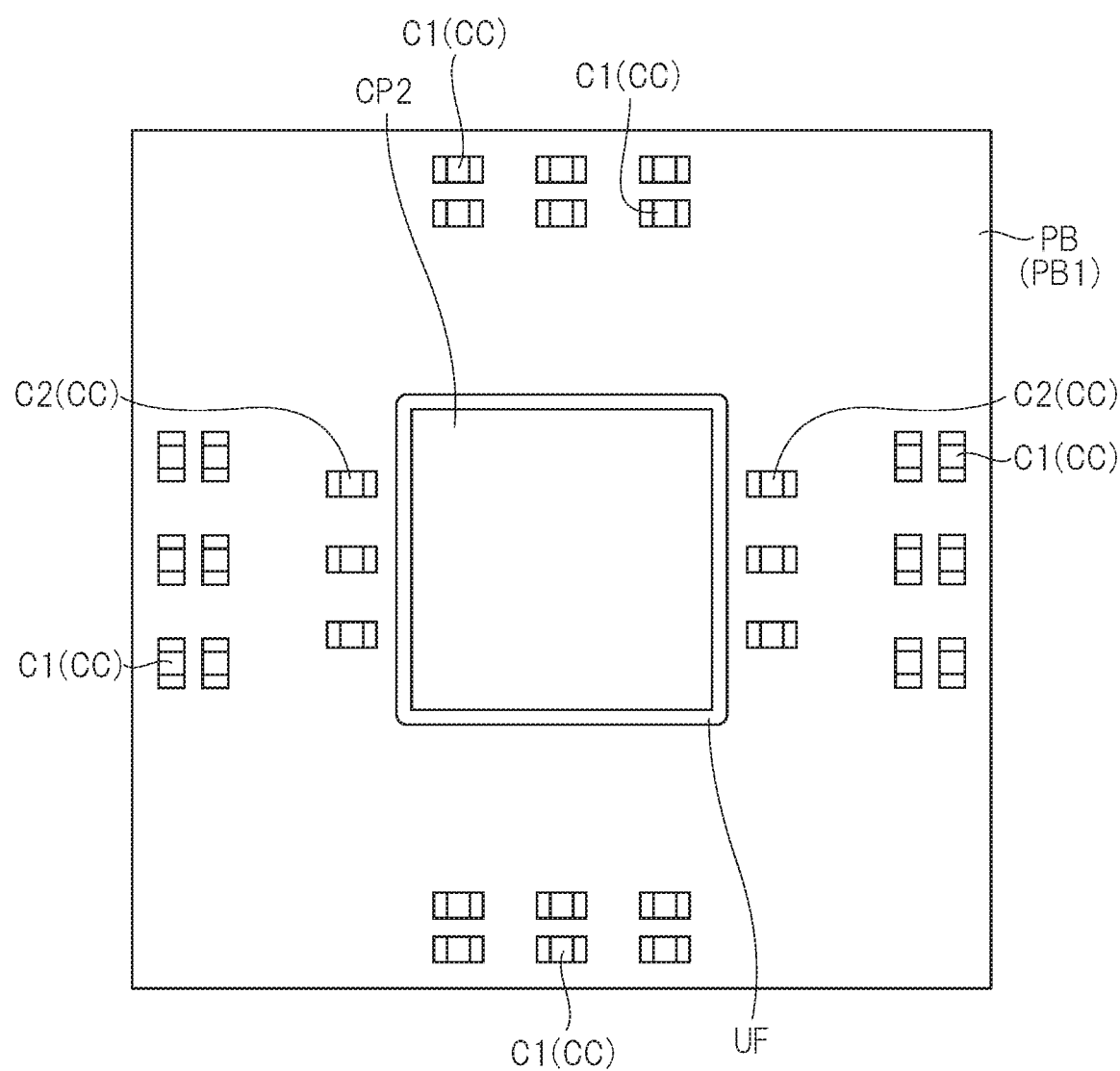
FIG. 22 is plan view during the manufacturing process of the semiconductor device continued from FIG. 18.
Figure 23:
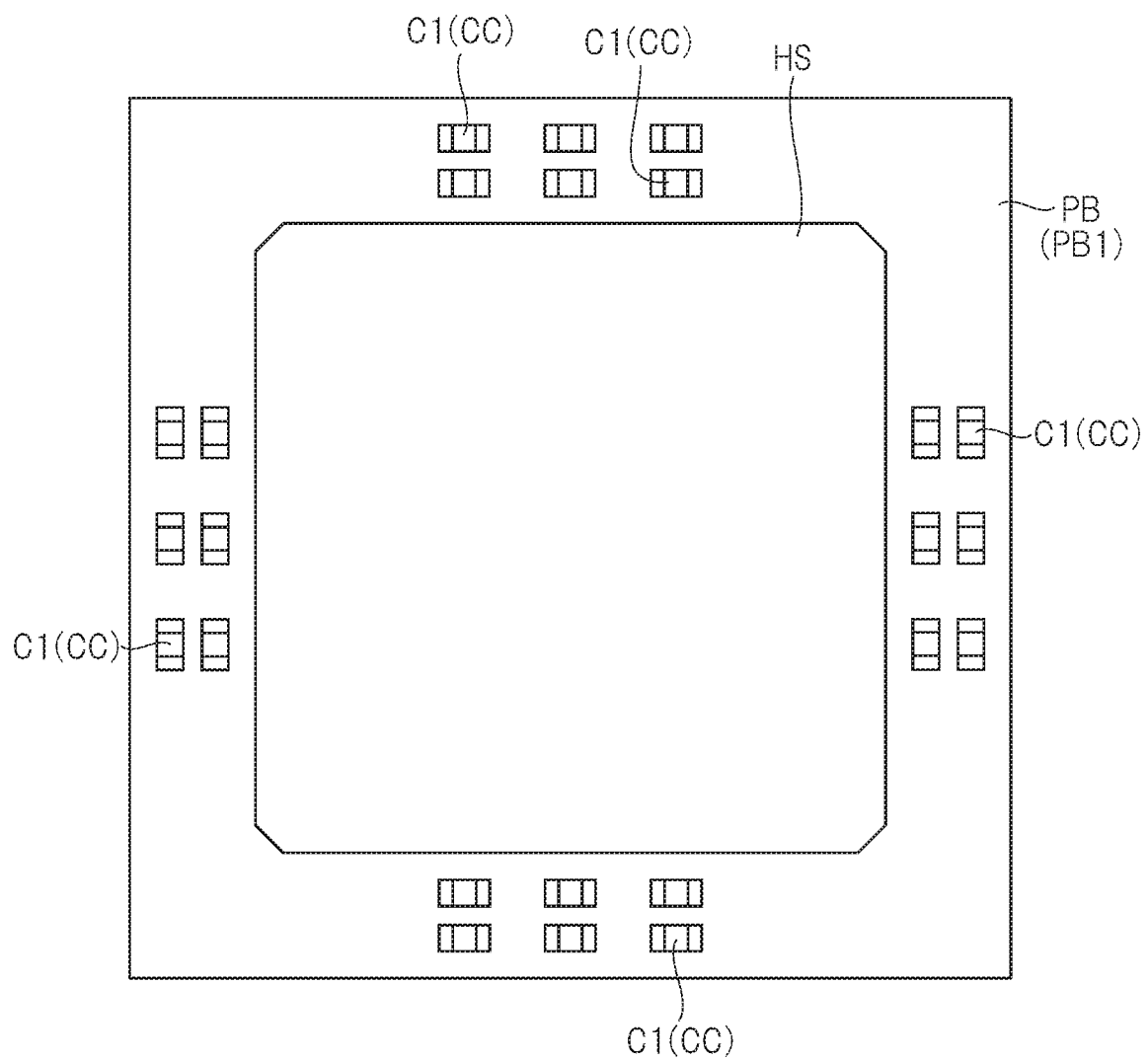
FIG. 23 is plan view during the manufacturing process of the semiconductor device continued from FIG. 19.

FIGS. 18, 22, and 23 are plan views during the manufacturing process of the semiconductor device SD2 of the present embodiment.

Figure 19:
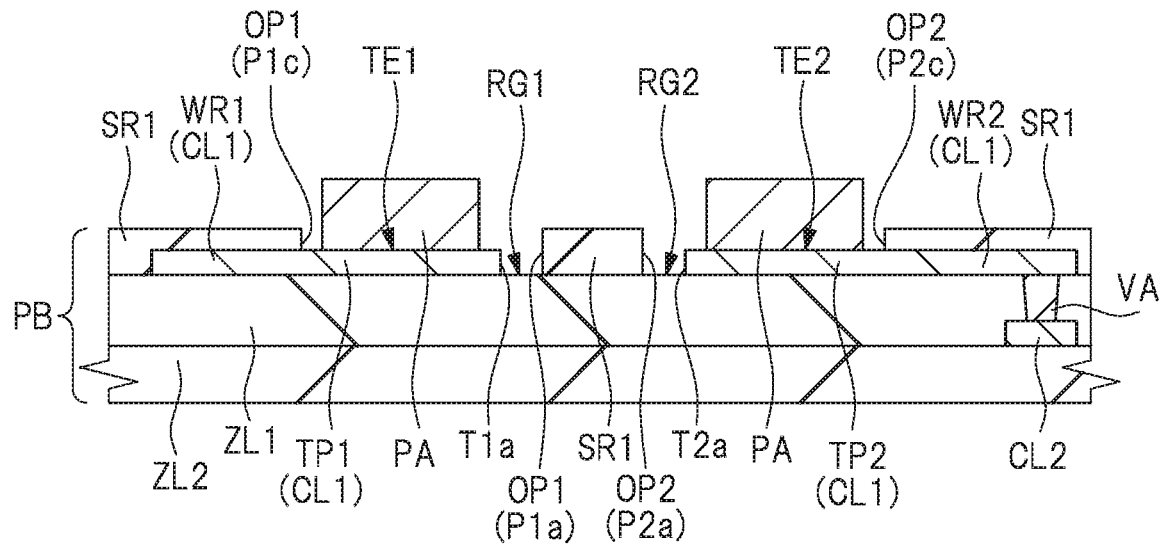
FIG. 19 is an explanatory diagram of a capacitor mounting process.
Figure 20:
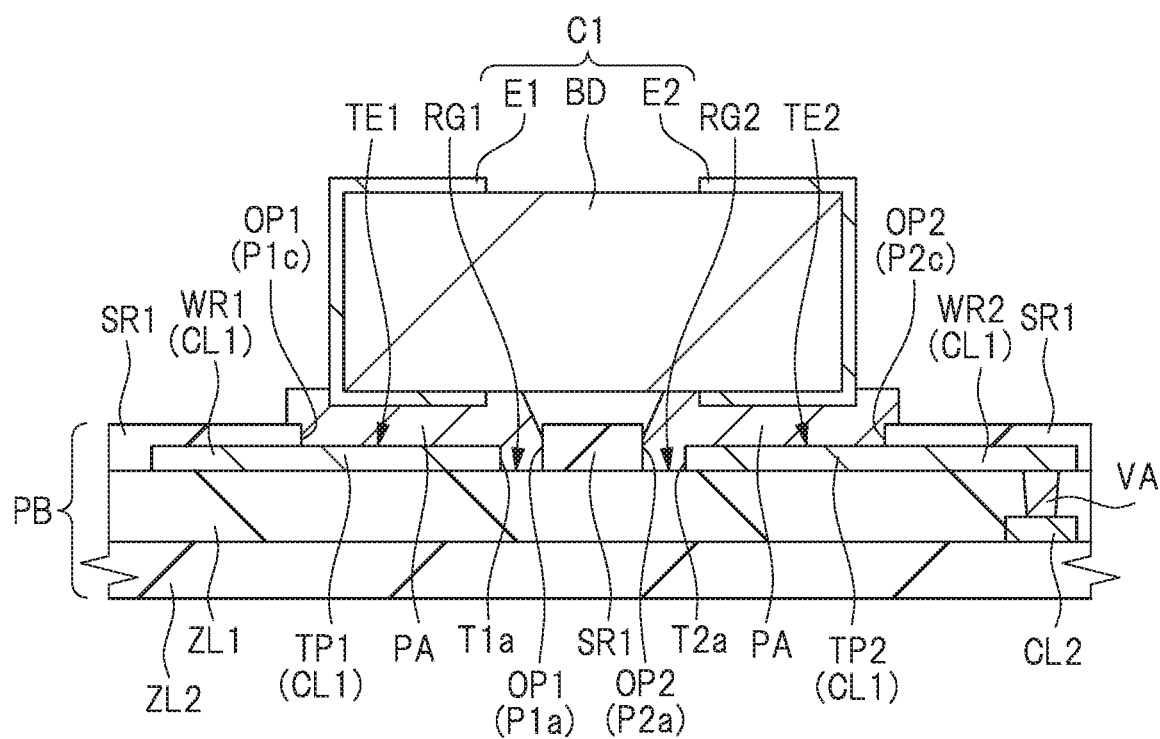
FIG. 20 is an explanatory view of the capacitor mounting process.
Figure 21:
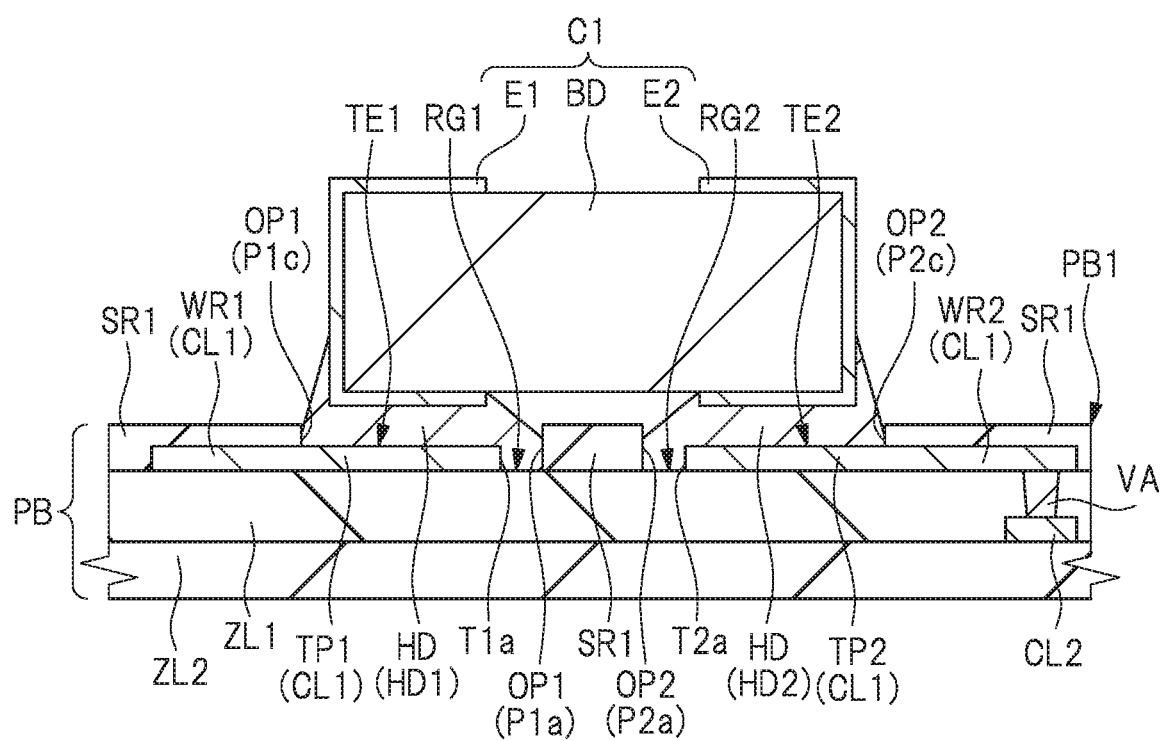
FIG. 21 is an explanatory diagram of a capacitor mounting process.

FIGS. 19 to 21 are explanatory diagrams of the capacitor mounting process in step S2 of FIG. 17, and cross sections corresponding to the above-mentioned FIG. 12 are shown.

In the following description of the manufacturing process, a case where the wiring substrate PB formed in advance in a product size is prepared and the semiconductor device SD2 is manufactured using the wiring substrate PB will be described.

However, as another mode, it is also possible to apply a multi-chip method in which a so-called multi-chip wiring substrate having a plurality of product formation regions is prepared, and after assembling each of the plurality of product formation regions, the plurality of semiconductor devices is obtained by dividing each product formation region.

First, the wiring substrate PB shown in FIG. 7 is prepared in step S1 of FIG. 17.

As shown in FIG. 7, on the upper surface PB1 of the wiring substrate PB, the plurality of terminal patterns SP described above are arranged in an array in a region where the semiconductor chip CP2 is to be mounted, hereinafter referred to as a chip mounting region.

In the upper surface PB1 of the wiring substrate PB, the terminal portions TE1 and TE2 are arranged in the respective regions where the capacitor C1 is to be mounted, and the terminal portions TE3 and TE4 are arranged in the respective regions where the capacitor C2 is to be mounted.

Since the structure of the wiring substrate PB shown in FIG. 7 has already been described with reference to FIGS. 3 to 16, a duplicated description is omitted here.

Next, as shown in FIG. 18, a plurality of capacitors C1 and C2 are mounted on the upper surface PB1 side of the wiring substrate PB in step 32 of FIG. 17.

In step S2, a plurality of capacitors C1 and C2 are prepared and then mounted on the wiring substrate PB, respectively, but the capacitor preparation step may be performed before, after, or simultaneously with the wiring substrate PB preparation step of step S1.

In step S2, as shown in FIGS. 12 and 16, the electrodes E1 and E2 of the capacitors (C1 and C2) are soldered to the terminal portions (TE1, TE2, TE3, and TE4) of the wiring substrate PB.

The capacitor mounting process in step S2 will be described in detail with reference to FIGS. 19 to 21.

In FIGS. 19 to 21, a cross section of a region in which the capacitor C1 is mounted (a cross section corresponding to FIG. 12) is shown, but the cross section of the region in which the capacitor C2 is mounted is easily understood by referring to FIG. 16 together with FIGS. 19 to 21.

In step S2, first, before mounting the capacitors C1 and C2, a solder paste PA, which is a solder material containing a solder component, is disposed (coated and supplied) on the surface of each of the terminal portions TE1, TE2, TE3, and TE4 of the wiring substrate PB by a printing method or the like (see FIG. 19) Then, the capacitor C1 is arranged on the wiring substrate PB such that the electrode E1 of the capacitor C1 faces the terminal portion TE1 via the solder paste PA and the electrode E2 of the capacitor C1 faces the terminal portion TE2 via the solder paste PA, as shown in FIG. 20.

The capacitor C2 is arranged on the wiring substrate PB such that the electrode E1 of the capacitor C2 faces the terminal portion TE3 via the solder paste PA, and the electrode E2 of the capacitor C2 faces the terminal portion TE4 via the solder paste PA.

At this time, the solder paste PA on the terminal portions TE1, TE2, TE3, and TE4 is pushed and spread by the lower surfaces of the capacitors C1 and C2 due to the load applied to the capacitors C1 and C2 from the mounting jig or the load due to the own weight of the capacitors C1 and C2.

Thereafter, the solder paste PA is melted and then solidified by performing a process of heating (solder reflow process) to a temperature equal to or higher than the melting point of the solder component included in the solder paste PA.

The electrodes E1 and E2 of the capacitor C1 are bonded and electrically connected to the terminal portions TE1 and TE2, respectively, by the bonding material HD made of a solder material (solder paste PA) solidified after melting (see FIG. 21).

The electrodes E1 and E2 of the capacitor C2 are bonded to the terminal portions TE3 and TE4, respectively, by the bonding material HD made of the solder paste PA solidified after melting.

The bonding materials HD1, HD2, HD3, and HD4 are made of the bonding material HD.

Therefore, the bonding materials HD1, HD2, HD3, and HD4 are made of the same material.

Next, as shown in FIG. 22, the semiconductor chip CP2 is mounted on the upper surface PB1 side of the wiring substrate PB in step S3 of FIG. 17.

In step S3, the semiconductor chip CP2 is prepared and then mounted on the chip mounting region of the upper surface PB1 of the wiring substrate PB, but the preparation process of the semiconductor chip CP2 may be performed before, after, or at the same time as the wiring substrate PB preparation process of step S1, and may be performed before, after, or at the same time as the capacitor preparation process.

In the example shown in FIG. 22 and FIG. 6, the semiconductor chip CP2 is mounted on the upper surface PB1 of the wiring substrate PB in a direction in which the surface of the semiconductor chip CP2 and the upper surface PB1 of the wiring substrate PB face each other.

That is, a so-called face-down mounting method (also referred to as a flip-chip connection method) is applied.

The plurality of pads PD of the semiconductor chip CP2 are electrically connected to the plurality of terminal patterns SP of the wiring substrate PB via the plurality of bump electrodes BP, respectively.

As the bump electrode BP, a solder bump can be used, but the present invention is not limited thereto, and for example, a pillar bump formed by molding a metal material such as copper into a columnar shape may be used.

In step S3, the underfill resin UF is filled (disposed) between the semiconductor chip CP2 and the wiring substrate PB (see FIG. 6).

For example, after mounting the semiconductor chip CP2 on the wiring substrate PB, a resin material is injected into a gap between the semiconductor chip CP2 and the wiring substrate PB, and then the resin material is cured, whereby the underfill resin UF can be formed.

As another mode, the underfill resin UF may be formed by disposing a material for forming the underfill resin UF on a chip mounting area of the wiring substrate PB, then mounting the semiconductor chip CP2 on the wiring substrate PB, and then curing the material.

Next, as shown in FIG. 23 and FIG. 6, the heat dissipation member HS is mounted in step S4 of FIG. 17.

The heat dissipation member HS is mounted on the semiconductor chip CP2, and the semiconductor chip CP2 is covered with the heat dissipation member HS.

In the case of FIG. 23 and FIG. 6, not only the semiconductor chip CP2 but also the plurality of capacitors C2 for the power supply circuit are covered with the heat dissipation member HS.

On the other hand, the plurality of capacitors C1 for DC cutting are not covered with the heat dissipation member HS and are exposed from the heat dissipation member HS.

There are various methods for mounting the heat dissipation member HS.

For example, a supporting frame SFR is attached to the peripheral portion of the heat dissipation member HS, and the heat dissipation member HS is bonded and fixed to the wiring substrate PB via the supporting frame SFR.

At this time, an adhesive (heat-radiating resin) SZ is applied to the back surface of the semiconductor chip CP2, and the heat dissipation member HS is bonded and fixed to the semiconductor chip CP2 via the adhesive SZ.

Next, as shown in FIG. 4 and FIG. 6, a ball mounting process is performed to attach a plurality of solder balls SB to the lower surface PB2 side of the wiring substrate PB in step S5 of FIG. 17.

In step S5, the solder balls SB are arranged on the lands LA exposed from the solder resist layer SR2 and then subjected to a solder reflow process, whereby the solder balls SB are bonded and fixed to the lands LA.

Next, an electrical test is performed in step S6 of FIG. 17.

In the electrical test step of step S6, an electrical test is performed on the circuit formed in the semiconductor device SD 2.

The electrical test includes a DC test in which a test is performed by passing a DC current for the test.

The DC test includes, for example, a conductive test for confirming an electrical connection state of a circuit.

When performing a DC test of the high-speed transmission path in which the capacitor C 1 is inserted, it is necessary to input a DC test signal in a state in which the electrodes E1 and E2 of the capacitor C1 are short-circuited by a test jig or the like.

If the electrodes E1 and E2 of the capacitor C1 are short-circuited, even if the DC-cutting capacitor C1 is inserted in the high-speed transmission path in series, the DC test signal input to one of the electrodes E1 and E2 of the capacitor C1 is output from the other of the electrodes E1 and E2 of the capacitor C1, so that the DC test of the entire circuit can be performed.

Therefore, it is preferable that the DC-cutting capacitor C1 is disposed at a position not covered with the heat dissipation member HS.

This makes it easier to bring a test jig or the like for short-circuiting the electrodes E1 and E2 of the capacitor C1 into contact with the electrodes E1 and E2 of the capacitor C1.

On the other hand, in the electrical test, the electrodes E1 and E2 of the capacitor C2 for the power supply circuit need not be short-circuited.

In addition, the capacitor C2 for the power supply circuit is preferably arranged close to the circuit that consumes power, and therefore, is preferably arranged close to the semiconductor chip CP 2.

Therefore, it is preferable to arrange the capacitor C2 for the power supply circuit at a position covered with the heat dissipation member HS.

As a result, in plan view, the plurality of capacitors C2 are arranged near the semiconductor chip CP2 and the plurality of capacitors C1 are arranged farther than the plurality of capacitors C2, and the distance between the semiconductor chip CP2 and the capacitor C2 is smaller than the distance between the semiconductor chip CP2 and the capacitor C1.

Next, a process of mounting the semiconductor devices SD1 and SD2 on the motherboard MB as the motherboard will be described with reference to FIG. 1.

As shown in FIG. 1, a plurality of terminals TM1 for connecting the semiconductor device SD1 and a plurality of terminals TM2 for connecting the semiconductor device SD2 are provided on the upper surface of the motherboard MB.

The semiconductor device SD1 and the motherboard MB are electrically connected by bonding the plurality of solder balls SB of the semiconductor device SD1 to the plurality of terminals TM 1 of the motherboard MB, respectively.

The semiconductor device SD2 and the motherboard MB are electrically connected by bonding the plurality of solder balls SB of the semiconductor device SD2 to the plurality of terminals TM2 of the motherboard MB, respectively.

By electrically connecting the semiconductor device SD1 and the semiconductor device SD2 to the motherboard MB, the semiconductor device SD1 and the semiconductor device SD2 can be electrically connected to each other via the transmission path of the motherboard MB.

The present inventor has studied a semiconductor device in which a semiconductor chip and a chip capacitor are mounted on a wiring substrate.

Figure 24:
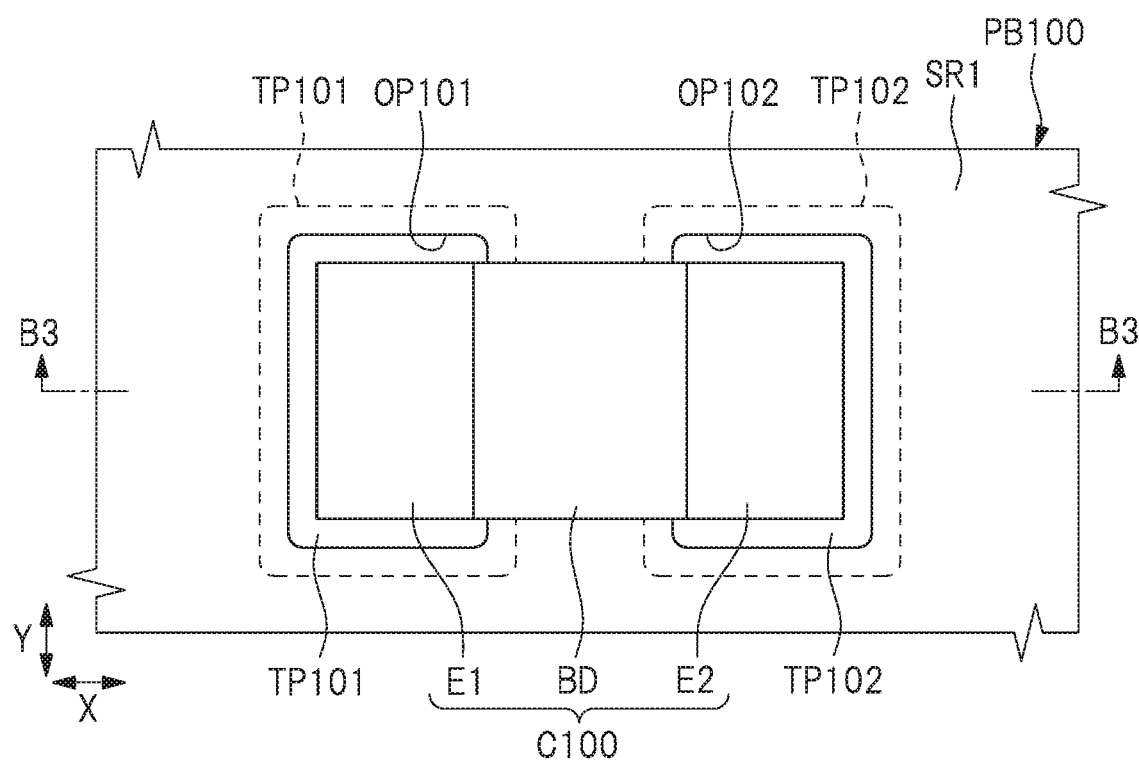
FIG. 24 is a partially enlarged plan view of a part of the semiconductor device of the first study example.

FIG. 24 is a partially enlarged plan view of the semiconductor device of the first study example studied by the present inventor, and corresponds to FIG. 9.

Figure 25:
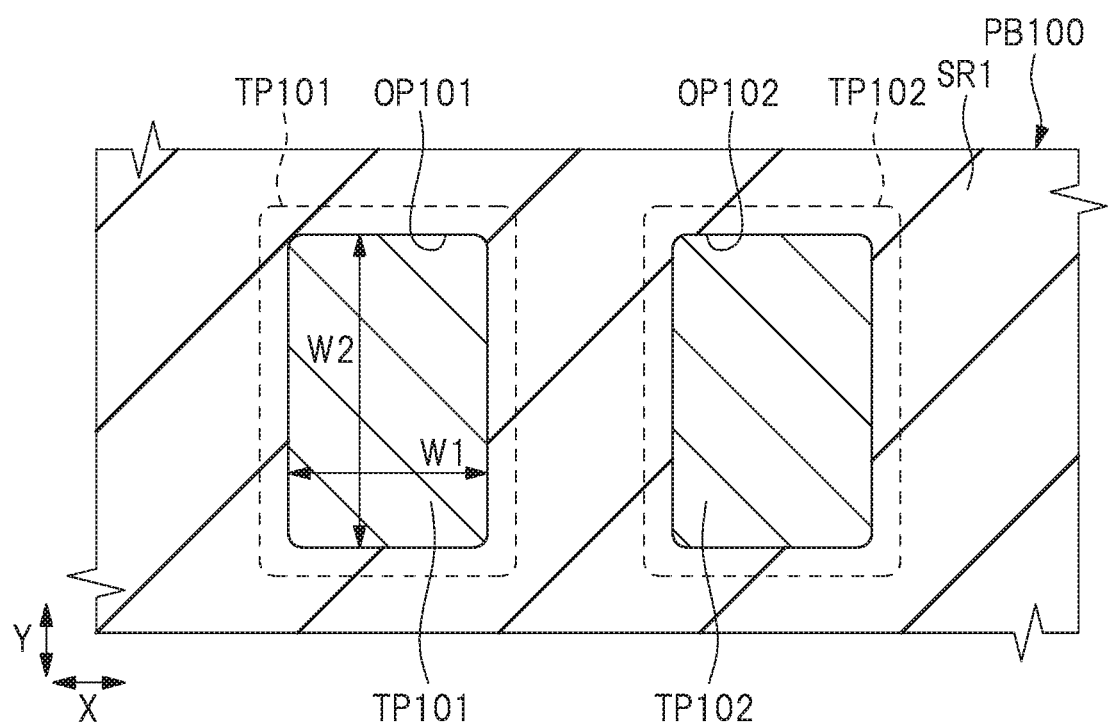
FIG. 25 is a top view of the wiring substrate shown in FIG. 24.

FIG. 25 is a top view of a wiring substrate PB100 used in the semiconductor device of the first study, and corresponds to FIG. 10.

Figure 26:
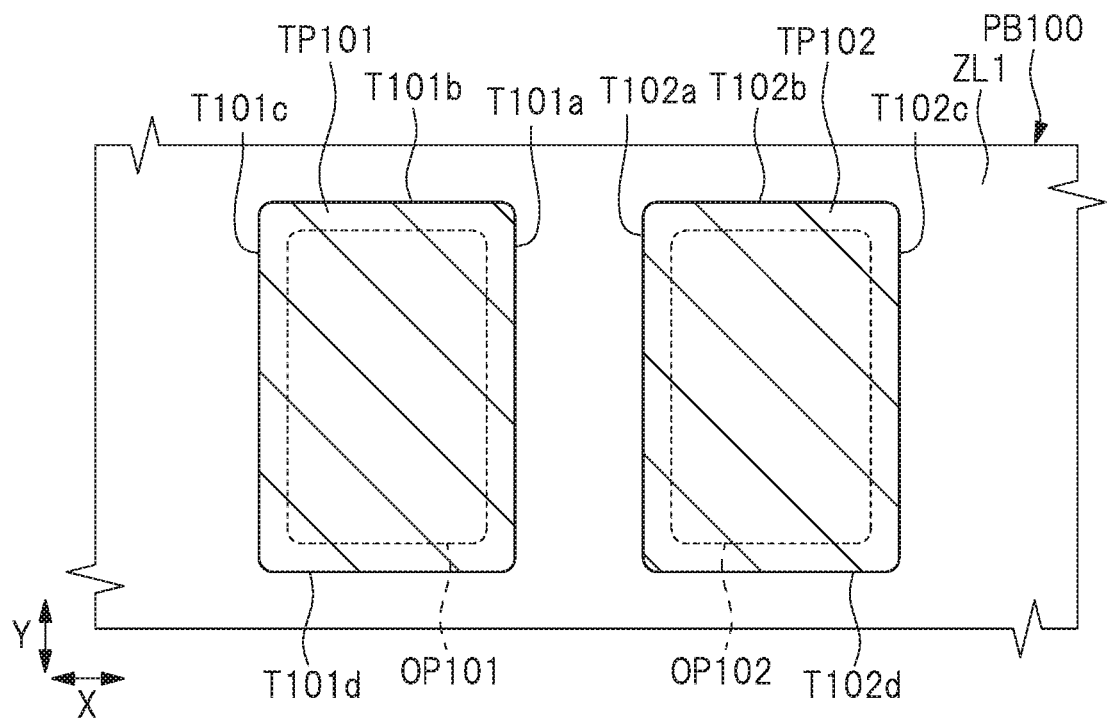
FIG. 26 is a plan perspective view of the solder resist layer in the wiring substrate shown in FIG. 25.

FIG. 26 is a plan perspective view of the solder resist layer SR 1 in the wiring substrate PB100 shown in FIG. 25, and corresponds to FIG. 11.

Figure 27:
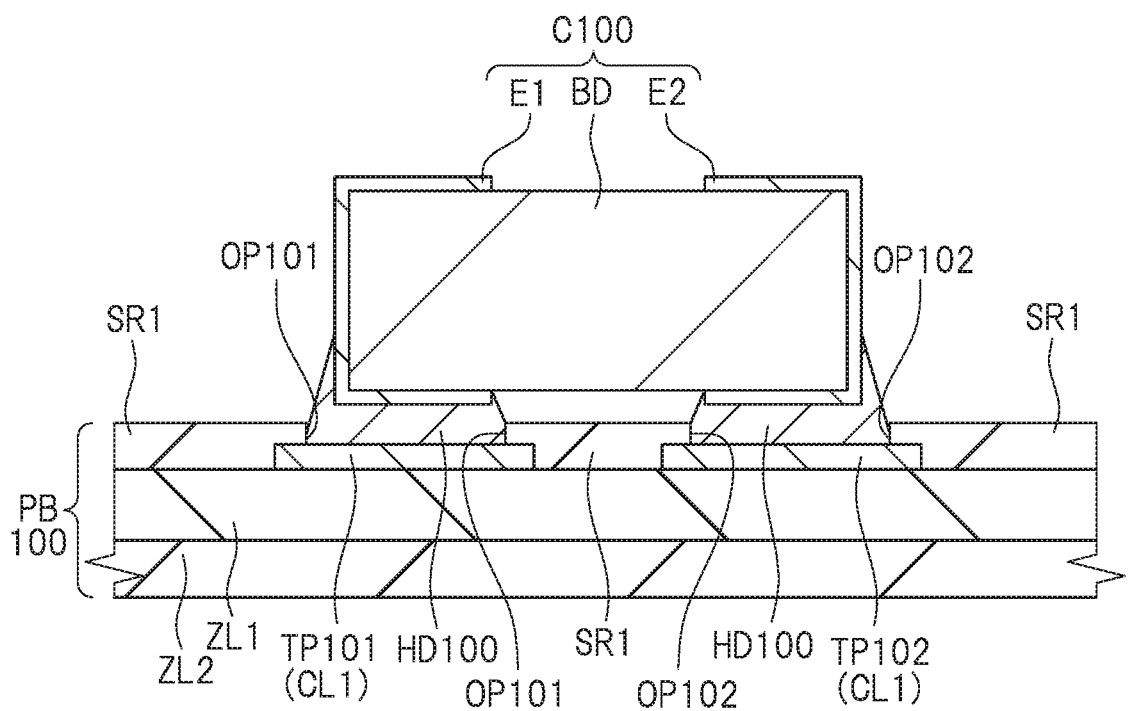
FIG. 27 is a cross-sectional view along line B3-B3 of FIG. 24.

FIG. 27 is a cross-sectional view taken along line B3-B3 of FIG. 24, and corresponds to FIG. 12.

Figure 28:
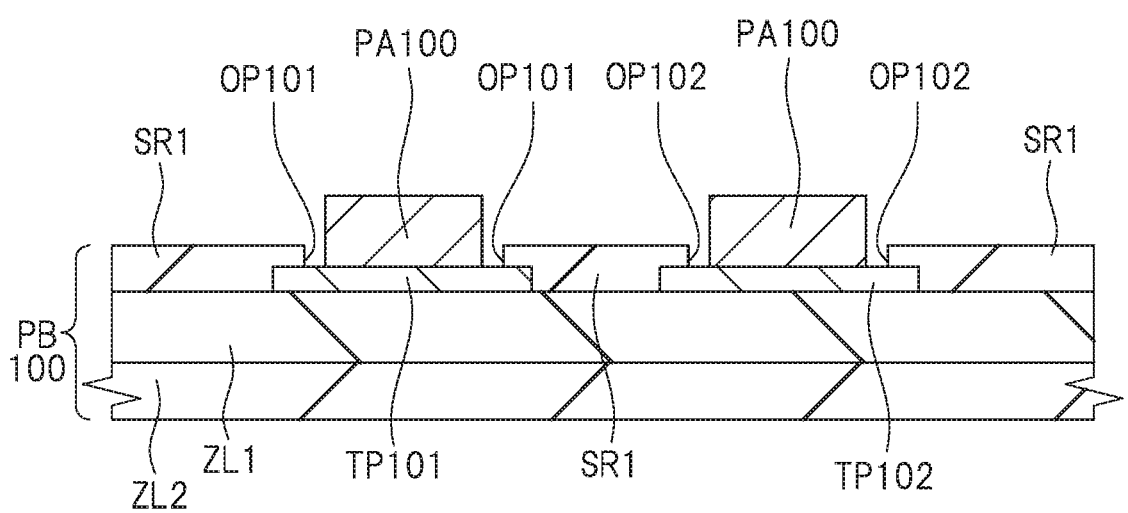
FIG. 28 is an explanatory diagram of a capacitor mounting process in the first examination example.
Figure 29:
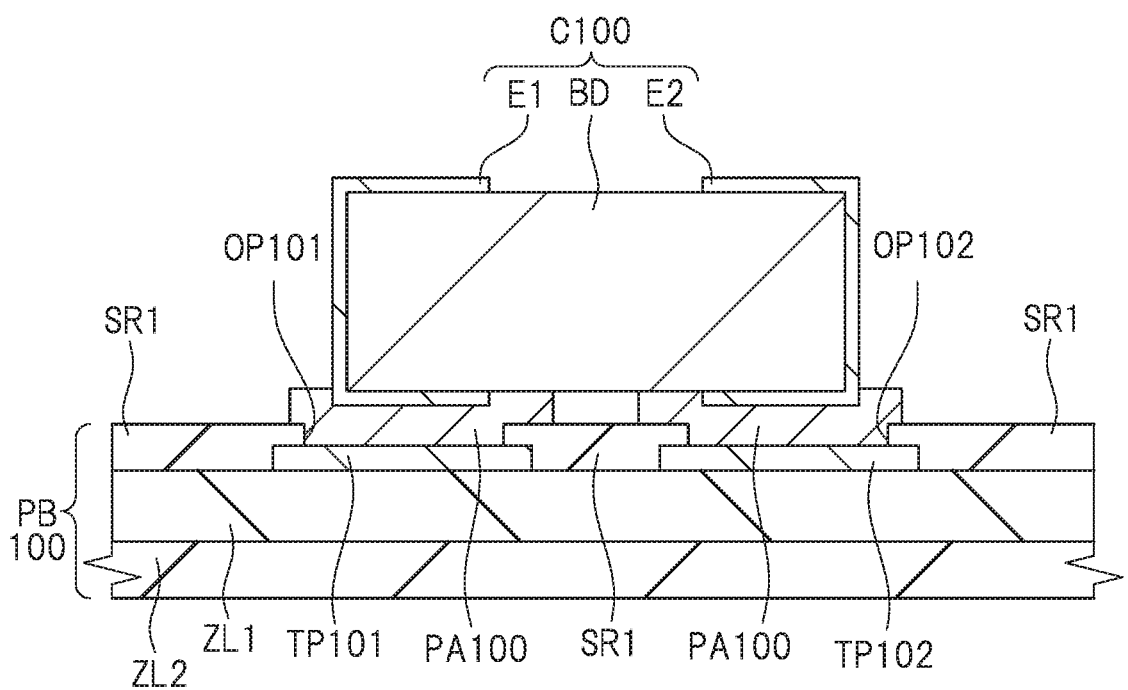
FIG. 29 is an explanatory diagram of a capacitor mounting process in the first examination example.
Figure 30:
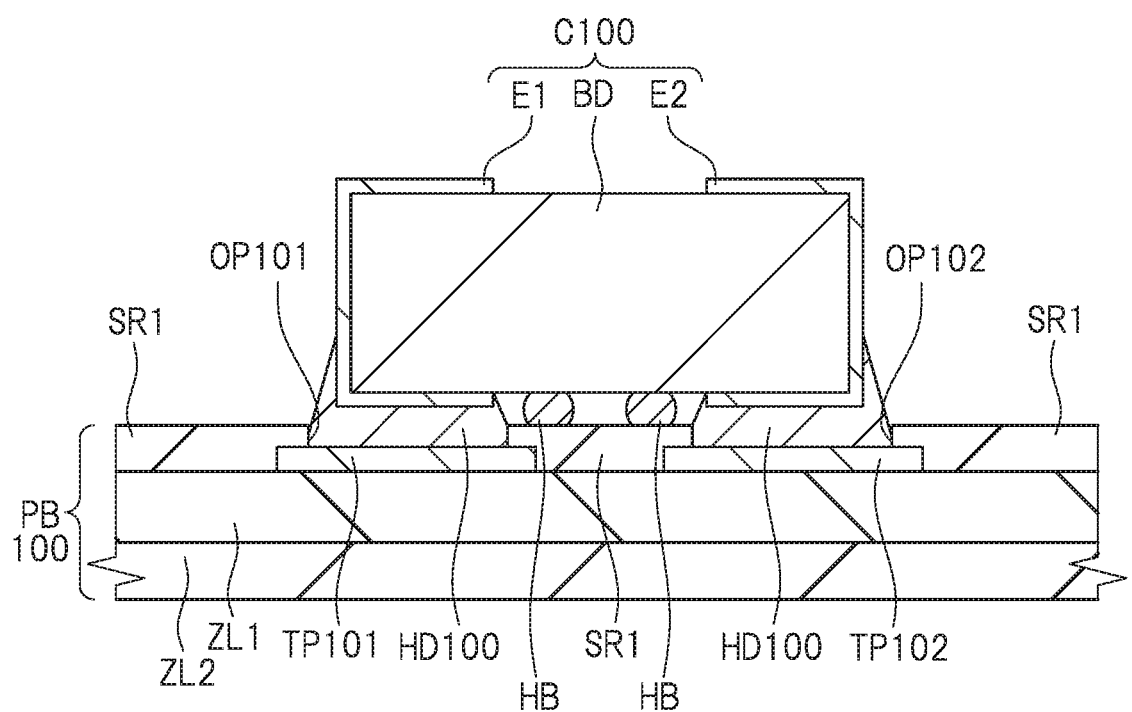
FIG. 30 is an explanatory diagram of a capacitor mounting process in the first examination example.

FIGS. 28 to 30 are explanatory diagrams of a capacitor mounting process in manufacturing the semiconductor device of the first study example, and cross sections corresponding to FIG. 27 are shown.

The semiconductor device of the first study example differs from the semiconductor device SD2 of the present embodiment in the connection structure between the wiring substrate and the chip capacitor.

Hereinafter, a concrete description will be given.

In the semiconductor device of the first study, the capacitor C 100 corresponding to the capacitor C 1 is mounted on the wiring substrate PB100 corresponding to the wiring substrate PB.

As shown in FIGS. 24 to 27, the uppermost conductive layer CL 1 of the plurality of conductive layers included in the wiring substrate PB100 includes terminal patterns TP101, TP102 for connecting the electrodes E1 and E2 of the capacitor C100 with a bonding material HD100 made of solders.

Part of the terminal patterns TP101 is exposed from the opening portion OP101 provided in the solder resist layer SR1.

Part of the terminal patterns TP102 is exposed from an opening portion OP102 provided in the solder resist layer SR1 covering the conductive layer CL1.

In the first study, the opening portion OP101 of the solder resist layer SR1 is included in the terminal pattern TP101 in plan view, and the opening portion OP102 of the solder resist layer SR1 is included in the terminal pattern TP102 in plan view.

Therefore, the outer peripheries (sides T101a, T101b, T101c, and T101d) of the terminal pattern TP101 and the outer peripheries (sides T102a, T102b, T102c, and T102d) of the terminal pattern TP102 are covered with the solder resist layers SR1.

That is, in the first study, the SMD (Solder Mask Defined) pads are used as the terminal patterns TP101, TP102 for connecting the capacitor C100.

The capacitor mounting process when manufacturing the semiconductor device of the first study example will be described with reference to FIGS. 28 to 30.

First, prior to mounting the capacitor C100, a solder paste PA100 is disposed (applied) on the surface of the terminal pattern TP101, TP102 exposed from the opening portion OP101, OP102 of the solder resist layer SR1 in the wiring substrate PB100 by using a print method or the like (see FIG. 28).

Then, the capacitor C100 is arranged on the wiring substrate PB100 such that the electrode E1 of the capacitor C100 faces the terminal pattern TP101 via the solder paste PA100 and the electrode E2 of the capacitor C100 faces the terminal pattern TP101 via the solder paste PA100, as shown in FIG. 29.

At this time, the solder-paste PA100 on the terminal patterns TP101, TP102 is pushed and spread by the lower surface of the capacitor C100 by the load applied to the capacitor C100 from the mounting jigs or the load caused by the self-weight of the capacitor C100.

The solder paste PA100 pushed out by the capacitor C100 may protrude from the opening portion OP101,OP102 and enter the gap between the main body portion BD of the capacitor C100 and the solder resist layer SR1.

That is, the solder paste PA100 may penetrate into the gap between the upper surface of the solder resist layer SR1 interposed between the opening portion OP01 and the opening portion OP102 and the lower surface of the main body portion BD of the capacitor C100 and become sandwiched therebetween.

Thereafter, a solder reflow process is performed to melt and solidify the solder paste PA100.

As a result, the electrodes E1 and E2 of the capacitor C100 are bonded and electrically connected to the terminal patterns TP101,TP102 by the bonding material HD100 made of solidified solder (solder paste PA) (see FIG. 30).

However, if the solder reflow process is performed with the solder paste PA100 entering the gap between the main body portion BD of the capacitor C100 and the solder resist layer SR1, the solidified solder ball HB may remain in the gap between the main body portion BD of the capacitor C100 and the solder resist layer SR1 even after the solder reflow process.

That is, except for the gap between the capacitor C100 and the solder resist layer SR1, the solder paste PA protruding from the opening portion OP101,OP102 tends to return to the opening portion OP101,OP102 due to the surface tension when the solder paste PA is melted by the solder reflow process, and therefore, the solder paste PA hardly contributes to the generation of the solder remaining on the solder resist layer SR1 as the foreign matter.

However, since the solder paste PA that has penetrated into the gap between the capacitor C100 and the solder resist layer SR1 hardly returns to the inside of the opening portion OP101,OP102 even if it is melted by the solder reflow process, the solder paste PA tends to remain as the solder HB in the gap between the capacitor C100 and the solder resist layer SR1 even after being solidified after the solder reflow process.

Since the solder HB present in the gap between the body portion BD of the capacitor C100 and the solder resist layer SR1 is away from the opening portion OP101,OP102, it is therefore difficult to stably hold the solder (the bonding material HD100) that connects the electrodes E1, E2 and the terminal pattern TP101,TP102 of the capacitor C100, respectively, and is thus liable to move.

The transferred solder HB acts as a foreign substance having conductivity, which leads to deterioration of reliability of the semiconductor device.

In addition, the solder HB as a foreign substance existing in the gap between the main body portion BD of the capacitor C100 and the solder resist layer SR1 may cause a short circuit between the electrodes E1 and E2 of the capacitor C100.

Therefore, in order to improve the reliability of the semiconductor device on which the capacitor is mounted, it is desirable that the solder HB is not formed as much as possible in the gap between the main body portion BD of the capacitor C100 and the solder resist layer SR1 in the capacitor mounting step.

Therefore, it is conceivable to reduce the quantity of the solder-paste PA100 supplied to the surfaces of the respective terminal patterns TP101, TP102 prior to mounting the capacitor.

This makes it difficult for the solder paste PA100 to penetrate the gap between the capacitor C100 and the solder resist layer SR1 when the capacitor is mounted, so that the problem described above with reference to FIGS. 28 to 29 is unlikely to occur.

However, if the amount of the solder paste PA100 supplied to the surfaces of the terminal patterns TP101, TP102 is reduced prior to mounting the capacitor, the amount of the bonding material HD100 connecting the electrodes E1 and E2 of the capacitor C100 and the terminal pattern TP101, TP102 after the solder reflow process is reduced.

In this instance, the reliability of the connections between the electrodes E1 and E2 of the capacitor C100 and the terminal patterns TP101, TP102 may deteriorate.

Therefore, even if the amount of the solder material (solder paste) to be supplied onto the terminal for capacitor connection is secured to some extent before the capacitor is mounted, it is desired that the solder material (solder paste) hardly intrudes into the gap between the main body portion BD of the capacitor C100 and the solder resist layer SR1 when the capacitor is mounted.

The semiconductor device SD2 of the present embodiment includes a wiring substrate PB, and a semiconductor chip CP2 and a capacitor C1 mounted on the wiring substrate PB.

The capacitor C1 has an electrode E1 (first electrode) and an electrode E2 (second electrode) located on the opposite side of the electrode E1.

The wiring substrate PB has a conductive layer CL1 (first conductive layer) including a terminal pattern TP1 (first terminal pattern) and a terminal pattern TP2 (second terminal pattern), and a solder resist layer SR1 as an insulating layer formed so as to cover the conductive layer CL1.

The solder resist layer SR1 of the wiring substrate PB has an opening portion OP1 (first opening) exposing a part of the terminal pattern TP1 and an opening portion OP2 (second opening portion) exposing a part of the terminal pattern TP2.

The electrode E1 of the capacitor C1 is electrically connected to the terminal pattern TP1 exposed from the opening portion OP1 via a bonding material HD1 made of solder.

The electrode E2 of the capacitor C1 is electrically connected to the terminal pattern TP2 exposed from the opening portion OP2 via a solder bonding material HD2 (the second solder joint).

Therefore, the terminal patterns TP1 and TP2 are terminal patterns for connecting the capacitor C1, the opening portion OP1 is an opening portion (solder resist opening portion) for exposing the terminal pattern TP1, and the opening portion OP2 is an opening portion (solder resist opening portion) for exposing the terminal pattern TP2.

One of the main features of the present embodiment is that a terminal pattern (TP1, TP2) for connecting the capacitor C1 in the wiring substrate PB and solder resist opening portions (OP1, OP2) for exposing the terminal pattern are devised.

That is, in the present embodiment, in plan view, the opening portion OP1 and the opening portion OP2 are separated from each other, the solder resist layer SR1 exists between the opening portion OP1 and the opening portion OP2, the terminal pattern TP2 is not exposed from the opening portion OP1, and the terminal, pattern TP1 is not exposed from the opening portion OP2.

The terminal pattern TP1 has a side T1a (first side) facing the terminal pattern TP2 in plan view, the terminal pattern TP2 has a side T2a (second side) facing the side T1a of the terminal pattern TP1 in plan view, the side T1a of the terminal pattern TP1 is exposed from the opening portion OP1, and the side T2a of the terminal pattern TP2 is exposed from the opening portion OP2.

The outer periphery of the terminal pattern TP1 other than the side T1a is not exposed from the opening portion OP1, and the outer periphery of the terminal pattern TP2 other than the side T2a is not exposed from the opening portion OP2.

As a result, the problems described with reference to the first examination example of FIGS. 24 to 30 can be improved or solved, and the reliability of the semiconductor device can be improved.

Hereinafter, a concrete description will be given.

In the semiconductor device SD2 of the present embodiment, the side T1a of the terminal pattern TP1 is exposed from the opening portion OP1 of the solder resist layer SR1, and the outer periphery of the terminal pattern TP1 other than the side T1a is not exposed from the opening portion OP1 of the solder resist layer SR1.

Accordingly, in the plane view, the region between the edge T1a of the terminal pattern TP1 and the inner wall of the opening portion OP1 opposite thereto becomes the region RG1 in which the terminal pattern TP1 (the conductive material constituting the conductive layer CL1) is not disposed.

More specifically, the opening portion OP1 has a side P1a (third side) facing the opening portion OP2 in plan view, and a region between the side T1a of the terminal pattern TP1 and the side P1a of the opening portion OP 1 is a region RG1 in which the terminal pattern TP1 (a conductive material constituting the conductive layer CL1) is not disposed.

The region RG1 in the opening portion OP1 can function as a region for storing the solder material when the capacitor C1 is disposed on the wiring substrate PB or at the time of subsequent solder reflow.

In the semiconductor device SD2 of the present embodiment, the side T2a of the terminal pattern TP2 is exposed from the opening portion OP2 of the solder resist layer SR1, and the outer periphery of the terminal pattern TP2 other than the side T2a is not exposed from the opening portion OP2 of the solder resist layer SR1.

Accordingly, in the plane view, the region between the edge T2a of the terminal pattern TP2 and the inner wall of the opening portion OP2 opposite thereto becomes the region RG2 in which the terminal pattern TP2 (the conductive material constituting the conductive layer CL1) is not disposed.

More specifically, the opening portion OP2 has a side P2a (fourth side) facing the opening portion OP1 in plan view, and a region between the side T2a of the terminal pattern TP2 and the side P2a of the opening portion OP2 is a region RG2 in which the terminal pattern TP2 (a conductive material constituting the conductive layer CL1) is not disposed.

The region RG2 in the opening portion OP2 can function as a region for storing the solder material when the capacitor C1 is disposed on the wiring substrate PB or at the time of subsequent solder reflow.

As described above with reference to FIG. 20, when the capacitor C1 is disposed on the wiring substrate PB, the solder paste PA on the terminal portions TE1 and TE2 is pushed and spread by the lower surface of the capacitor C1 due to the load applied to the capacitor C1 from the mounting jig or the load due to the self-load of the capacitor C1.

However, in the present embodiment, the regions RG1 and RG2 in the opening portions OP1 and OP2 can store (accumulate) the solder material as much as the terminal patterns TP1 and TP2 (the conductive material constituting the conductive layer CL1) do not exist.

Therefore, when the capacitor C1 is arranged on the wiring substrate PB, the solder paste PA pushed and spread by the capacitor C1 is stored in the areas RG1 and RG2 in the opening portions OP1 and OP2, and therefore, the solder paste PA hardly penetrates into the gap between the body portion BD of the capacitor C1 and the solder resist layer SR1.

That is, in the present embodiment, the amount of solder paste PA that penetrates into the gap between the upper surface of the solder resist layer SR1 interposed between the opening portion OP1 and the opening portion OP2 and the lower surface of the body portion BD of the capacitor C1 can be reduced compared to the case of the first study.

Alternatively, in the case of the present embodiment, it is possible to prevent the solder paste PA from intruding into the gap between the upper surface of the solder resist layer SR1 interposed between the opening portion OP1 and the opening portion OP2 and the lower surface of the main body portion BD of the capacitor C1.

Therefore, it is possible to suppress or prevent the solidified solder from remaining in the gap between the main body portion BD of the capacitor C1 and the solder resist layer SR1 after the solder reflow process after the capacitor placement.

Thus, the reliability of the semiconductor device can be improved.

In the present embodiment, in the opening portion OP1, the region RG1 in which the conductive material constituting the conductive layer CL1 does not exist extends along the side P1a, and the terminal pattern TP1 exists in the region along the sides P1b, P1c, and P1d.

In the opening portion OP2, the region RG2 in which the conductive material constituting the conductive layer CL1 does not exist extends along the side P2a, and the terminal pattern TP1 exists in the region along the sides P2b, P2c, and P2d.

Therefore, when the capacitor C1 is arranged on the wiring substrate PB, the solder paste PA is restrained or prevented from protruding from the sides P1a and P2a of the opening portions OP1 and OP2, but the solder paste PA may protrude from the outer peripheries other than the sides P1a and P2a of the openings portion OP1 and OP2 (specifically, the sides P1b, P1c, P1d, P2b, P2c, and P2d).

However, since the solder paste PA protruding from the outer periphery (specifically, the sides P1b, P1c, P1d, P2b, P2c, P2d) other than the sides P1a, P2a of the opening portions OP1, OP2 tends to return to the inside of the opening portions OP1, OP2 due to the surface tension when the solder reflow process is performed, the solder paste PA hardly contributes to the generation of the solder remaining on the solder resist layer SR1 as the foreign matter.

Therefore, when the capacitor C1 is arranged on the wiring substrate PB, even if the solder paste PA protrudes from the outer periphery (specifically, the sides P1b, P1c, P1d, P2b, P2c, P2d) other than the sides P1a, P2a of the opening portions OP1, OP2, the reliability of the semiconductor device is hardly lowered.

On the other hand, when the capacitor C1 is disposed on the wiring substrate PB, if the solder paste PA protrudes from the sides P1a and P2a of the opening portions OP1 and OP2, the solder paste PA enters the gap between the capacitor C1 and the solder resist layer SR1, and even if the solder reflow processing is performed, it is difficult to return to the inside of the opening portions OP1 and OP2.

This leads to the solidified solder remaining in the gap between the main body portion BD of the capacitor C1 and the solder resist layer SR1 after the solder reflow process, and thus the reliability of the semiconductor device is lowered.

Therefore, in the present embodiment, the areas RG1 and RG2 in which the conductive material constituting the conductive layer CL1 does not exist are provided along the sides P1l a and P2a in the opening portions OP1 and OP2, so that the solder paste PA is suppressed or prevented from protruding from the sides P1a and P2a of the opening portions OP1 and OP2, thereby improving the reliability of the semiconductor device.

On the other hand, the solder paste PA is allowed to protrude from the sides P1b, P1c, P1d, P2b, P2c, and P2d of the opening portions OP1 and OP2 to some extent because it is difficult to lead to a decrease in reliability of the semiconductor device.

Therefore, the outer peripheries of the terminal patterns TP1 and TP2 other than the sides T1a and T1b (specifically, the sides T1b, T1c, T1d, T2b, T2c and T2d) are not exposed from the opening portions OP1 and OP2.

Figure 31:
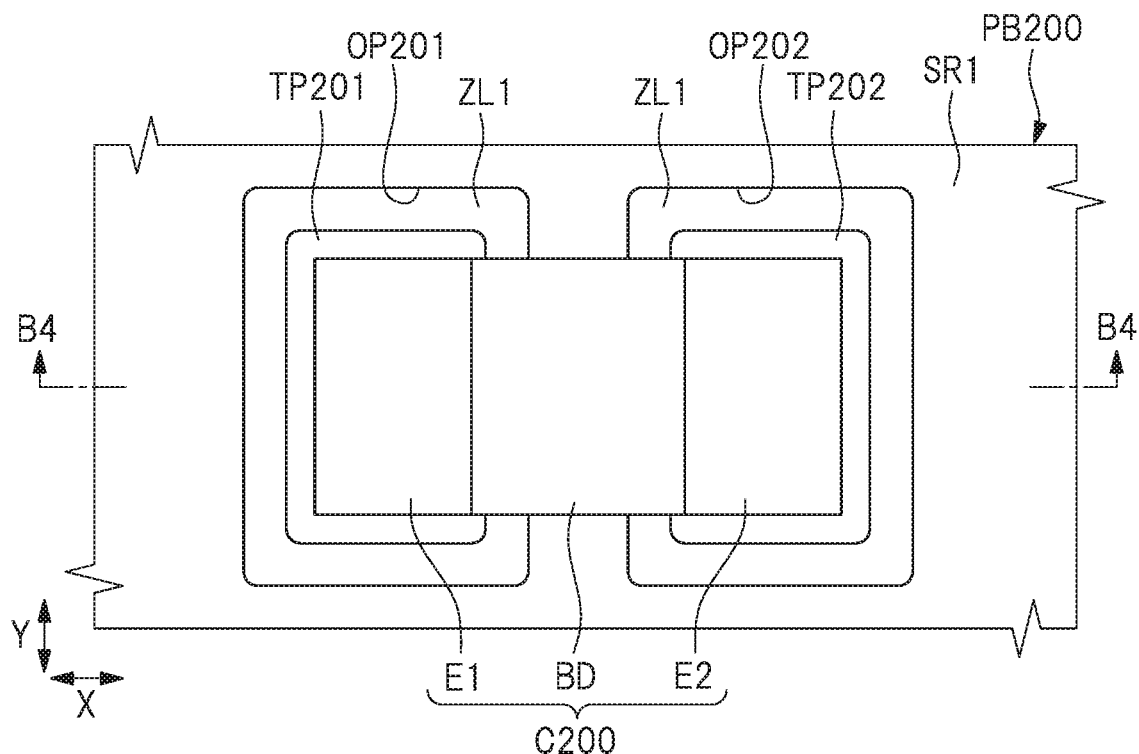
FIG. 31 is a partially enlarged plan view of a part of the semiconductor device of the second study example.

FIG. 31 is a partially enlarged plan view of the semiconductor device of the second study example studied by the present inventor, and corresponds to FIG. 9.

Figure 32:
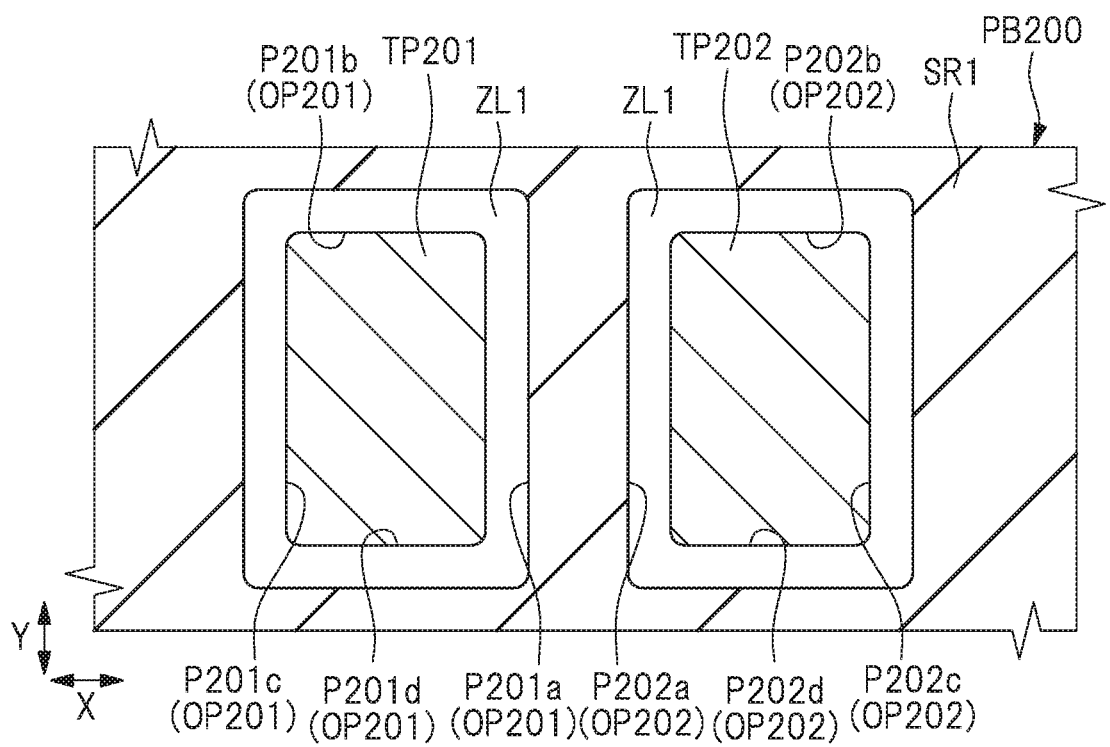
FIG. 32 is a top view of the wiring substrate shown in FIG. 31.

FIG. 32 is a top view of a wiring substrate PB200 used in the semiconductor device of the second study embodiment, and corresponds to FIG. 10.

Figure 33:
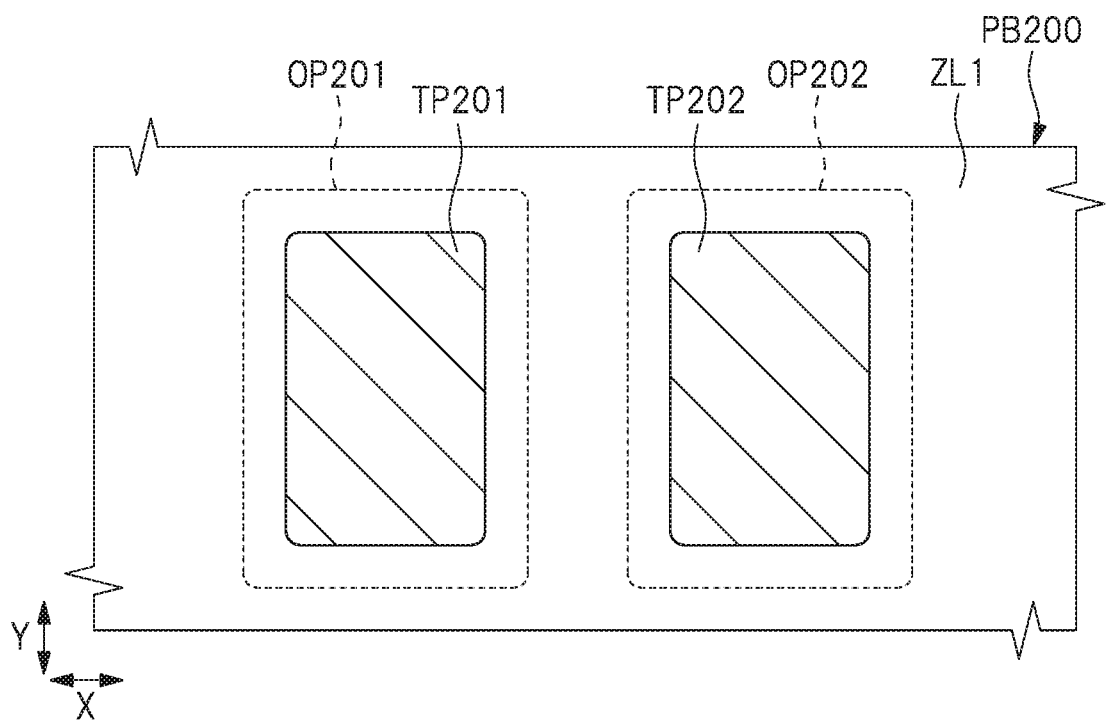
FIG. 33 is a plan perspective view of the solder resist layer in the wiring substrate shown in FIG. 32.

FIG. 33 is a plan perspective view of the solder resist layer SR1 in the wiring substrate PB200 shown in FIG. 32, and corresponds to FIG. 11.

Figure 34:
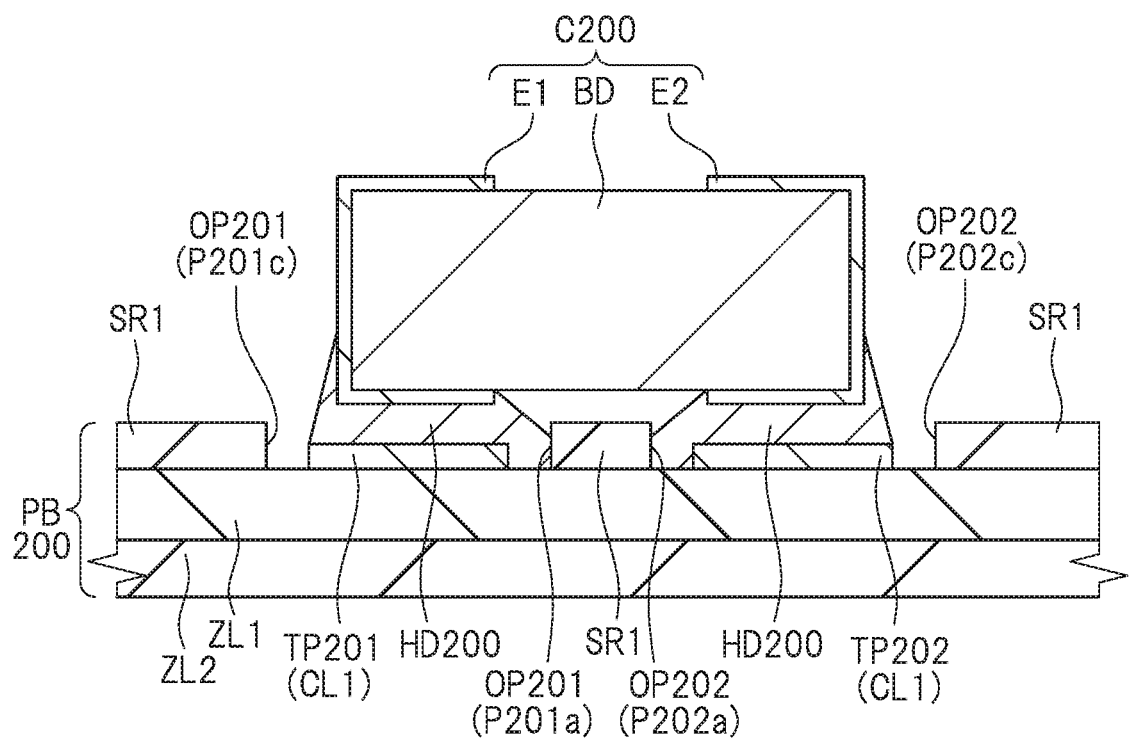
FIG. 34 is a cross-sectional view along line B4-B4 of FIG. 31.

FIG. 34 is a cross-sectional view along line B4-B4 of FIG. 31, and corresponds to FIG. 12.

In the second study examples of FIGS. 31 to 34, the capacitor C200 corresponding to the capacitor C1 is mounted on the wiring substrate PB200 corresponding to the wiring substrate PB.

The uppermost conductive layer CL1 of the plurality of conductive layers included in the wiring substrate PB200 includes terminal patterns TP201, TP202 for connecting the electrodes E1 and E2 of the capacitor C200 with a bonding material HD200 made of solders.

The entire terminal pattern TP201 is exposed from the opening portion OP201 provided in the solder resist layer SR1, and the entire terminal pattern TP202 is exposed from the opening portion OP202 provided in the solder resist layer SR1.

In plan view, the terminal pattern TP201 is included in the opening portion OP201, and the terminal pattern TP202 is included in the opening portion OP202.

That is, in the second study, the NSMD (Non Solder Mask Defined) pads are used as the terminal patterns TP201, TP202 for connecting the capacitor C200.

In the second study, in plan view, the entire area between the entire outer periphery of the terminal patterns TP201 and the entire inner wall of the opening portion OP201 can function as a region for storing soldering materials in the capacitor mounting process.

Further, in plan view, the entire area between the entire outer periphery of the terminal patterns TP202 and the entire inner wall of the opening portion OP202 can function as a region for storing soldering materials in the capacitor mounting process.

Therefore, in the second study, when the capacitor C200 is arranged on the wiring substrate PB, it is possible to suppress or prevent the solder paste from protruding from all the sides P201a, P201b, P201c, and P201d of the opening portion OP201 and all the sides P202a, P202b, P202c, and P202d of the opening portion OP202.

Therefore, also in the case of the second study example, it is possible to suppress or prevent the solidified solder from remaining in the gap between the main body portion BD of the capacitor C200 and the solder resist layer SR1 after the solder reflow process after the capacitor placement.

However, in the second study example, the planar dimensions (flat area) of each opening portion OP201, OP202 of the solder resist layer SR1 must be larger than the planar dimensions (flat area) of each opening portion OP201, OP202 in the first study example and the planar dimensions (flat area) of OP1 and OP2 in the present embodiment.

In the conductive layer CL1 of the wiring substrate, the wiring (or conductive pattern) other than the terminal pattern TP201, TP202 needs to be disposed apart from the opening portion OP201,OP202 of the solder resist layer SR1 to some extent.

Therefore, enlarging the planar dimensions of the opening portion OP201,OP202 of the solder resist layer SR1 leads to a reduction in the planar area in which the wirings can be arranged in the conductive layer CL1.

Therefore, it becomes difficult to design the layout of the wiring (or conductive pattern) constituting the conductive layer CL1, the degree of freedom of design of the wiring substrate is reduced, and it is also disadvantageous in downsizing (reduction in area) of the wiring substrate.

Further, if each plane dimension (plane area) of the opening portion OP201,OP202 in the case of the second study example is to be the same as each plane dimension (plane area) of OP1 and OP2 in the case of the present embodiment, each plane dimension (plane area) of the terminal patterns TP201,TP202 in the case of the second study example is considerably smaller than each plane dimension (plane area) of the terminal portions TE1 and TE2 in the case of the present embodiment.

In this instance, since the substrate-side terminal area contributing to the solder bonding with the capacitor C200 is reduced, the reliability of the solder connection between the electrodes E1 and E2 of the capacitor C200 and the terminal patterns TP201, TP202 may be lowered.

On the other hand, in the present embodiment, the sides T1a and T2a of the terminal patterns TP1 and TP2 are exposed from the opening portions OP1 and OP2, but the outer peripheries of the terminal patterns TP1 and TP2 other than the sides T1a and T2a are not exposed from the opening portions OP1 and OP2.

That is, in the present embodiment, in the opening portions OP1 and OP2, the regions RG1 and RG2 in which the conductive material constituting the conductive layer CL1 does not exist are provided on the sides P1a and P2a sides, but are not provided on the sides P1b, P1c, P1d, P2b, P2c, and P2d sides.

Therefore, in the case of the present embodiment, the planar dimensions of the opening portions OP1 and OP2 of the solder resist layer SR1 can be suppressed.

Specifically, the positions of the sides P1b, P1c, P1d, P2b, P2c, and P2d of the opening portions OP1 and OP2 in the present embodiment can be the same as the positions of the corresponding sides of the opening portion OP101, OP102 in the case of the first study described above.

Therefore, in the case of the present embodiment, the layout design of the wiring (or the conductive pattern) constituting the conductive layer CL1 becomes easier than in the case of the second examination example, the degree of freedom in the design of the wiring substrate can be improved, and it is also advantageous for the miniaturization (reduction in area) of the wiring substrate.

Further, in the case of the present embodiment, since the exposed areas of the terminal patterns TP1 and TP2 (that is, the areas of the terminal portions TE1 and TE2) can be secured while suppressing the planar dimensions (planar areas) of the opening portions OP1 and OP2, it is possible to improve the reliability of the solder connection between the electrodes E1 and E2 of the capacitor C1 and the terminal patterns TP1 and TP2.

Further, in the case of the present embodiment, as described above, when the capacitor C1 is arranged on the wiring substrate PB, the solder paste PA may protrude from the outer peripheries other than the sides P1a and P2a of the opening portions OP1 and OP2 (specifically, the sides P1b, P1c, P1d, P2b, P2c, and P2d).

However, since the solder paste PA protruding from the outer peripheries other than the sides P1a and P2a of the opening portions OP1 and OP2 tends to return to the inside of the opening portions OP1 and OP2 by the surface tension when the solder reflow processing is performed in a molten state, the reliability of the semiconductor device is hardly lowered.

Figure 35:
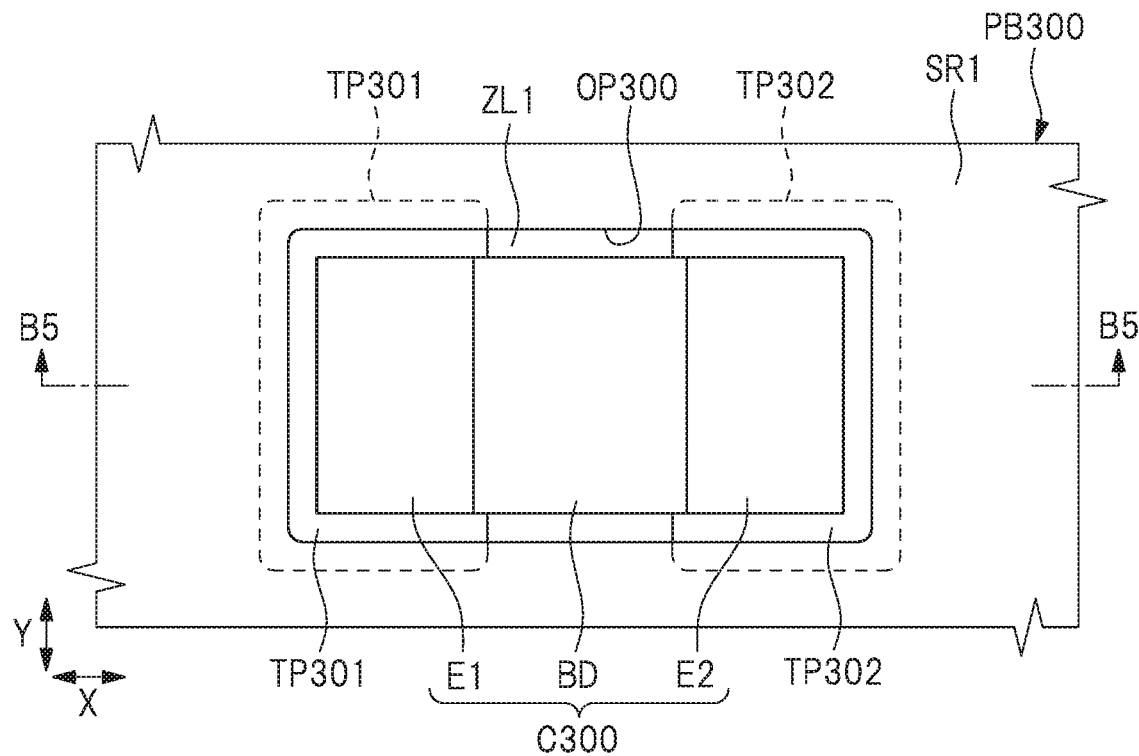
FIG. 35 is a partially enlarged plan view of a part of the semiconductor device of the third study example.

FIG. 35 is a partially enlarged plan view of the semiconductor device of the third study example studied by the present inventor, and corresponds to FIG. 9.

Figure 36:
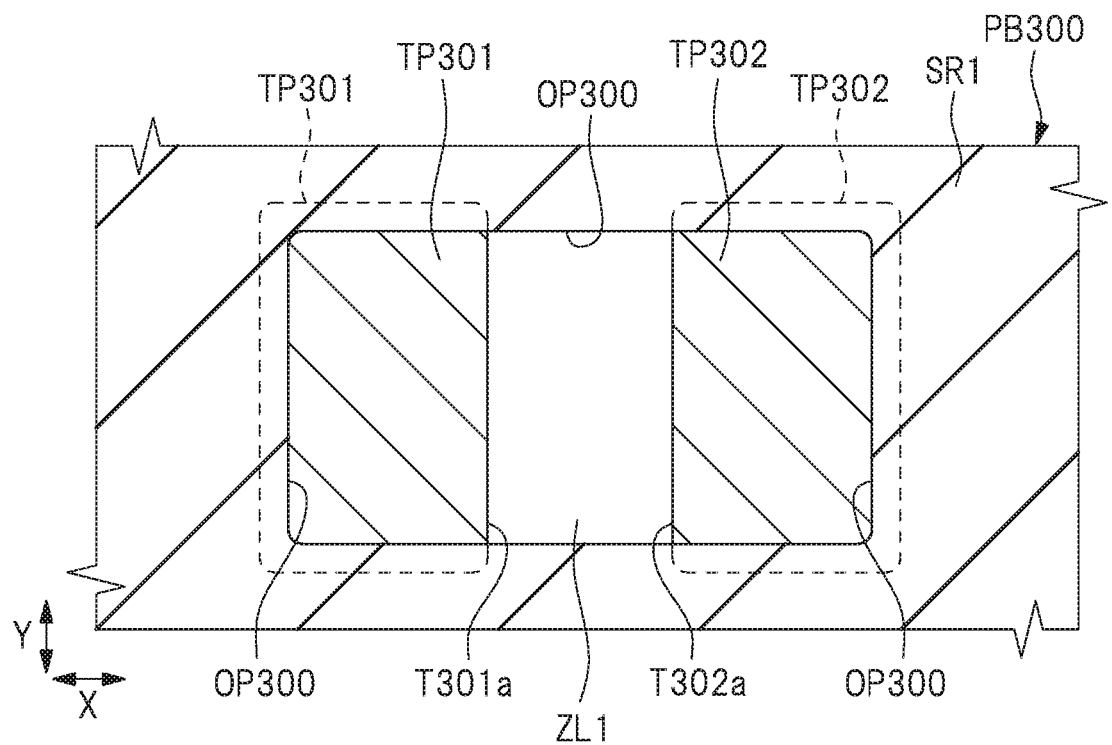
FIG. 36 is a top view of the wiring substrate shown in FIG. 35.

FIG. 36 is a top view of a wiring substrate PB300 used in the semiconductor device of the third study, and corresponds to FIG. 10.

Figure 37:
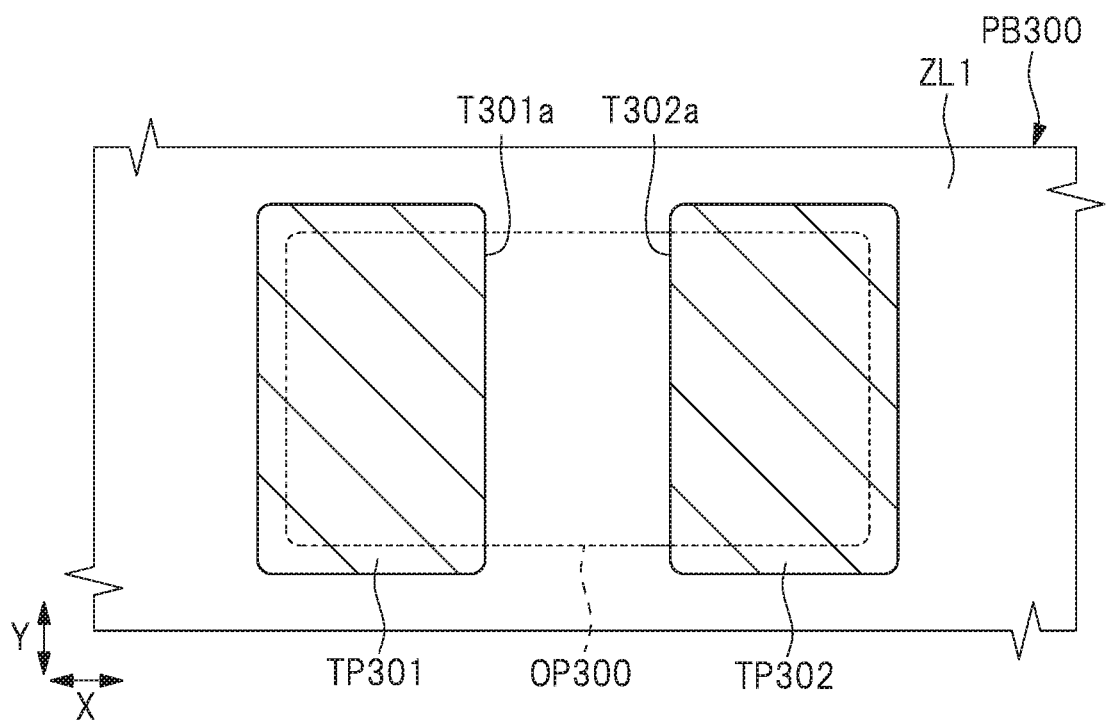
FIG. 37 is a plan perspective view of the solder resist layer in the wiring substrate shown in FIG. 36.

FIG. 37 is a plan perspective view of the solder resist layer SR1 in the wiring substrate PB300 shown in FIG. 36, and corresponds to FIG. 11.

Figure 38:
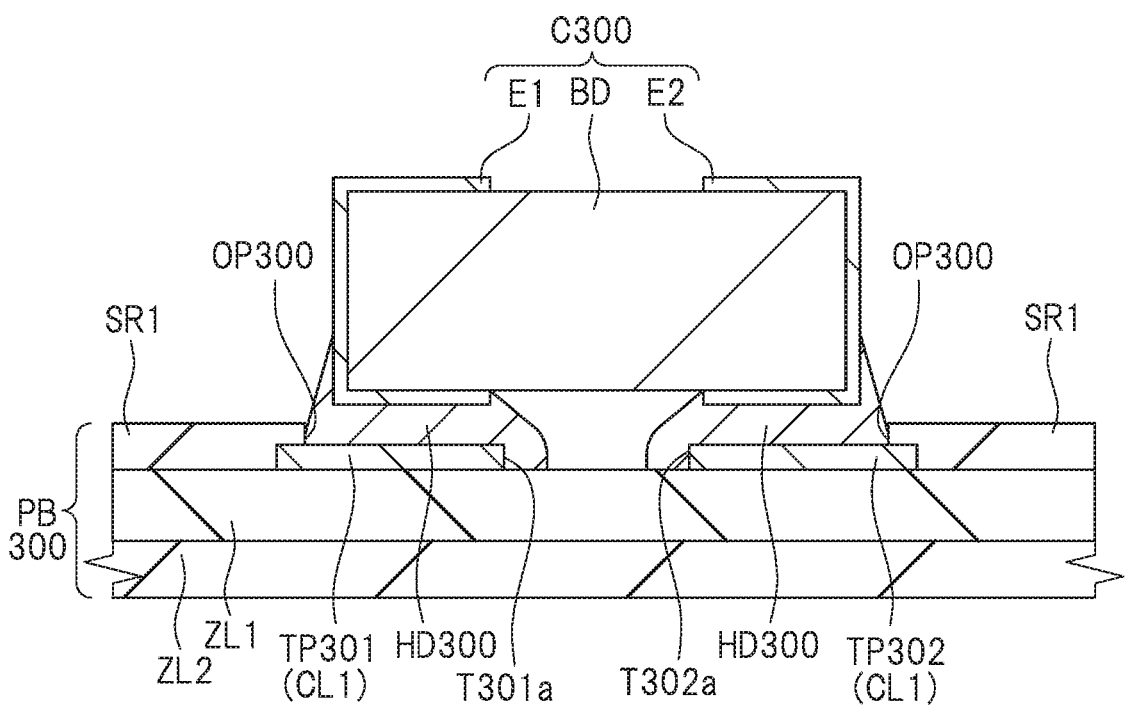
FIG. 38 is a cross-sectional view along line B5-B5 of FIG. 35.

FIG. 38 is a cross-sectional view along line B5-B5 of FIG. 35, and corresponds to FIG. 12.

In the third study examples of FIGS. 35 to 38, the capacitor C300 corresponding to the capacitor C1 is mounted on the wiring substrate PB300 corresponding to the wiring substrate PB.

The uppermost conductive layer CL1 of the plurality of conductive layers included in the wiring substrate PB300 includes terminal patterns TP301,TP302 for connecting the electrodes E1 and E2 of the capacitor C300 with a bonding material HD300 made of solders.

The terminal pattern TP301, TP302 is formed at the same position as the terminal patterns TP1 and TP2, and has the same planar configuration and planar dimension.

However, in the third study, the terminal patterns TP301, TP302 are exposed from a single opening portion OP300.

That is, the opening portion OP300 corresponds to a portion in which the solder resist layer SR1 existing between the opening portion OP1 and the opening portion OP2 in plan view is removed and the opening portion OP1 and the opening portion OP2 are connected to each other.

In the third study, the electrodes E1 and E2 of the capacitor C300 are connected to the terminal patterns TP301, TP302 exposed from one opening portion OP300 by soldering.

Therefore, in plan view, a region between the side T301a of the terminal pattern TP301 and the side T302a of the terminal pattern TP302 that face each other is a region in which the solder resist layer SR1 is not disposed and the insulative layer ZL1 is exposed.

In plan view, in the area between the side T301a of the terminal pattern TP301 and the side T302a of the terminal pattern TP302, the solder resist layer SR1 does not exist, so that the height of the gap (space) between the lower surface of the main body portion BD of the capacitor C300 and the upper surface of the insulative layer ZL1 is increased.

In other words, there is no member formed between the side T301a of the terminal pattern TP301 and the side T302a of the terminal pattern TP302 to prevent the solder paste from being melted or the solder paste from moving.

Therefore, in the case of the third study example, the solder paste before melting or the solder paste in the molten state easily moves in the gap between the lower surface of the main body portion BD of the capacitor C300 and the upper surface of the insulative layer ZL1.

This increases the risk that the terminal pattern TP301 and the terminal pattern TP302 are short-circuited by the solder when the electrodes E1 and E2 of the capacitor C300 and the terminal pattern TP301, TP302 are connected to each other by the bonding material HD300 made of the solidified solder.

That is, soldering the capacitor C300 with the terminal patterns TP301, TP302 facing each other exposed from the common opening portion OP300 and without the solder resist layers SR1 being disposed between the terminal patterns TP301, TP302 may cause a short circuit due to the solder between the terminal patterns TP301, TP302, and therefore, a short circuit between the electrodes E1 and E2 of the capacitor C300.

On the other hand, in the present embodiment, the opening portion OP1 exposing the terminal pattern TP1 and the opening portion OP2 exposing the terminal pattern TP2 are separated from each other in plan view, and the solder resist layer SR1 exists between (the side P1a of) the opening portion OP1 and (the side P2a of) the opening portion OP2.

Between the side T1a of the terminal pattern TP1 and the side T2a of the terminal pattern TP2, the inner walls of the opening portions OP1 and OP2 can function as a wall that prevents the solder paste PA before melting or the solder paste PA in a molten state from moving.

Between the side T1a of the terminal pattern TP1 and the side P1a of the opening portion OP1, there is a region RG1 in which the solder material can be stored, and between the side T2a of the terminal pattern TP2 and the side P2a of the opening portion OP2, there is a region RG2 in which the solder material can be stored.

Therefore, the solder paste PA before melting and the solder paste PA in a molten state are stored in the regions RG1 and RG2, but do not easily get over the sides P1a and P2a of the opening portions OP1 and OP2 and do not easily move on the solder resist layer SR1 between the opening portions OP1 and OP2.

Therefore, it is possible to reduce the risk that the terminal pattern TP1 and the terminal pattern TP2 are short-circuited by the solder when the electrodes E1 and E2 of the capacitor C1 and the terminal patterns TP1 and TP2 are connected to each other by the bonding material HD made of the solidified solder.

Therefore, short-circuiting of the electrodes E1 and E2 of the capacitor C1 can be prevented more accurately, and the reliability of the semiconductor device can be improved more accurately.

As described above, the region between the side T1a of the terminal pattern TP1 and the side P1a of the opening portion OP1 and the region between the side T2a of the terminal pattern TP2 and the side P2a of the opening portion OP2 function as a region in which a solder material can be stored.

In order to properly exhibit this function, it is preferable to secure the distance between the side T1a of the terminal pattern TP1 and the side P1a of the opening portion OP1 and the distance between the side T2a of the terminal pattern TP2 and the side P2a of the opening portion OP2 to some extent.

In this respect, in plan view, the distance (interval) L1 between the side T1a of the terminal pattern TP1 and the side P1a of the opening portion OP1 is preferably 100 µm or more (L1≥100 µm).

Further, in plan view, it is preferable that the distance (interval) L2 between the side T2a of the terminal pattern TP2 and the side P2a of the opening portion OP2 is 100 µm or more (L2≥100 µm).

The distances L1 and L2 are shown in FIG. 10.

Further, it is preferable that the wiring WR1 connected to the terminal pattern TP1 is integrally connected to the outer periphery of the terminal pattern TP1 other than the side T1a, specifically, any one of the sides T1b, T1c, and T1d.

Further, it is preferable that the wiring WR 2 connected to the terminal pattern TP1 is integrally connected to the outer periphery of the terminal pattern TP2 other than the side T2a, specifically, any one of the sides T2b, T2c, and T2d.

As a result, the areas of the regions RG1 and RG2 do not have to be reduced due to the wirings WR1 and WR2, so that the amount of the solder material that can be stored in the regions RG1 and RG2 can be easily secured.

Figures 39, 40:
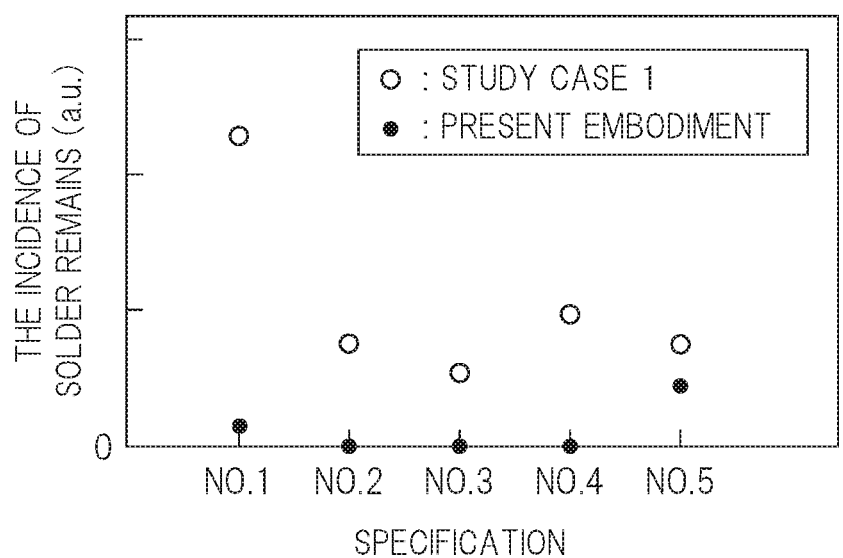
FIG. 39 is a graph showing the result of checking the rate at which residual solder is generated between the capacitor and the solder resist layer after the solder reflow process is performed after the capacitor is disposed.
FIG. 40 is a table showing specifications of each sample when an experiment serving as a base of the graph of FIG. 39 is performed.

FIG. 39 is a graph showing the result of checking the rate of generation of residual solder (corresponding to the solder HB) between the capacitor and the solder resist layer after performing solder reflow processing after capacitor placement for the sample employing the structure of FIGS. 10 and 11 (the present embodiment) and the sample employing the structure of FIGS. 25 and 26 (the first examination example).

The vertical axis of FIG. 39 corresponds to the generation rate of residual solder between the capacitor and the solder resist layer.

FIG. 40 is a table showing the specification of each sample when the experiment serving as the basis of the graph of FIG. 39 is performed, and a plurality of samples of the specifications NO. 1 to NO. 5 in which the dimensions W1 and W2 shown in FIG. 10 and FIG. 25 are changed are prepared, respectively, and the experiment is performed using a chip capacitor of 1005 size.

As can be seen from FIG. 10 and FIG. 25, the product W1×W2 of the dimension W1 and the dimension W2 is the terminal area contributing to the solder connection, and the experiment is performed so that the terminal area contributing to the solder connection is the same in the sample to which the present embodiment is applied and the sample to which the first examination example is applied.

As can be seen from FIG. 39, when the structure of FIGS. 10 and 11 (the present embodiment) is employed, it is possible to suppress or prevent the generation of the remaining solder (corresponding to the solder HB) between the capacitor and the solder resist layer after the solder reflow process after the capacitor placement, as compared with the case where the structure of FIGS. 25 and 26 (the first examination example) is employed.

Next, a modification of the semiconductor device SD2 of the present embodiment will be described.

Figure 41:
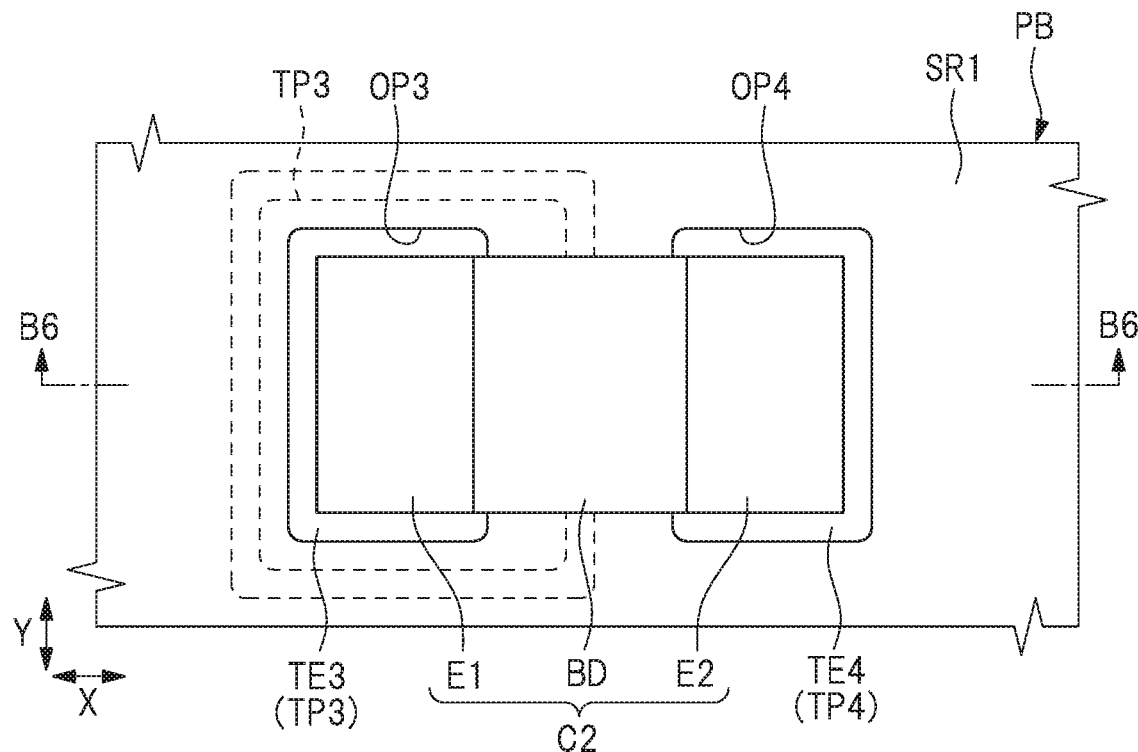
FIG. 41 is a partially enlarged plan view of a portion of the semiconductor device of the modified example.

FIG. 41 is a partially enlarged plan view of a modified example of the semiconductor device SD2, which corresponds to FIG. 13.

Figure 42:
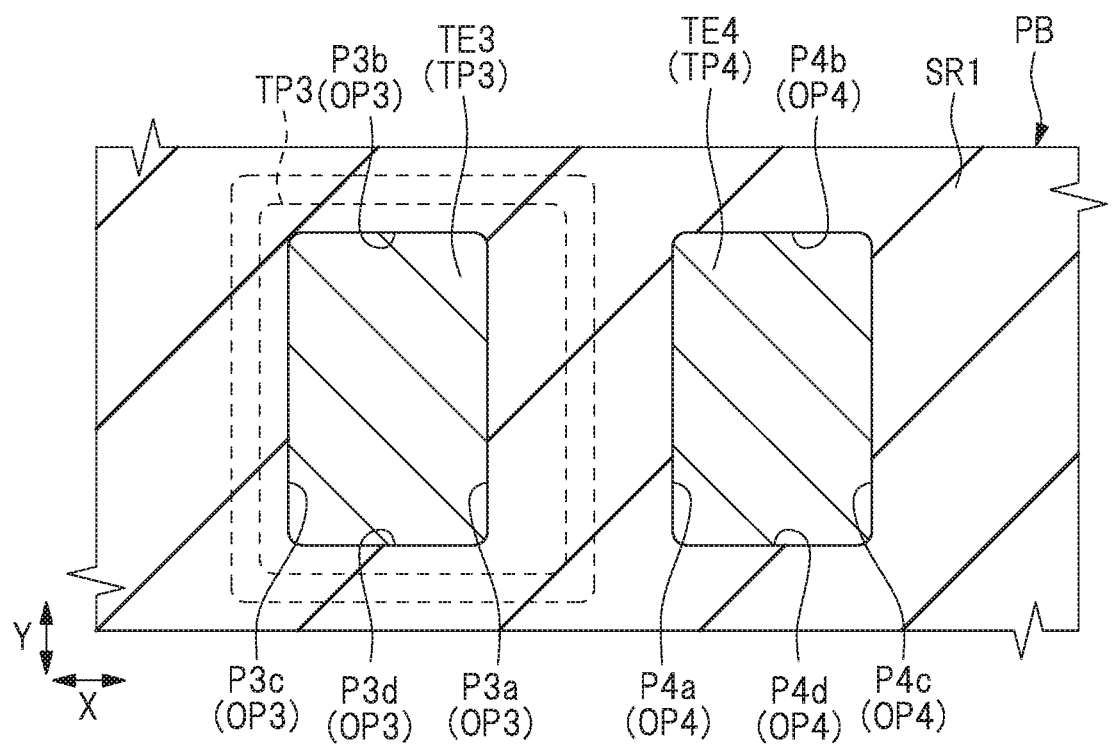
FIG. 42 is a top view of the wiring substrate shown in FIG. 41.

FIG. 42 is a top view of the wiring substrate PB used in the semiconductor device SD2 of the modification shown in FIG. 41, and corresponds to FIG. 14.

Figure 43:
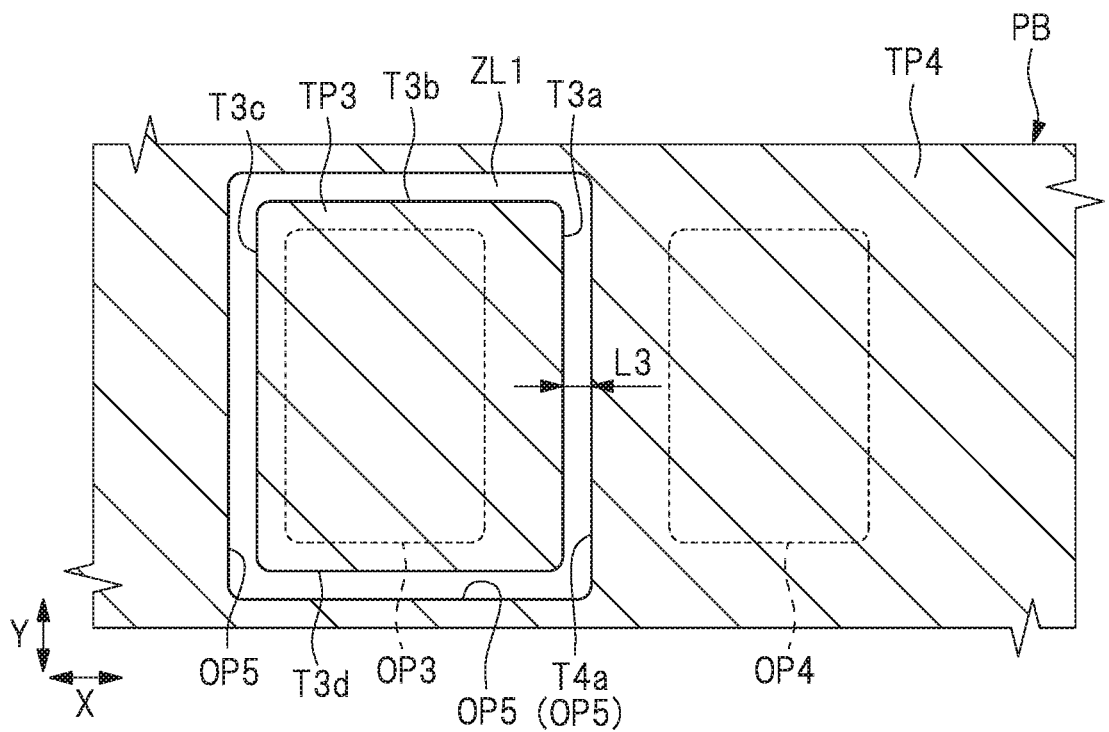
FIG. 43 is a plan perspective view of the solder resist layer in the wiring substrate shown in FIG. 42.

FIG. 43 is a plan perspective view of the solder resist layer SR 1 in the wiring substrate PB shown in FIG. 42, and corresponds to FIG. 15.

Figure 44:
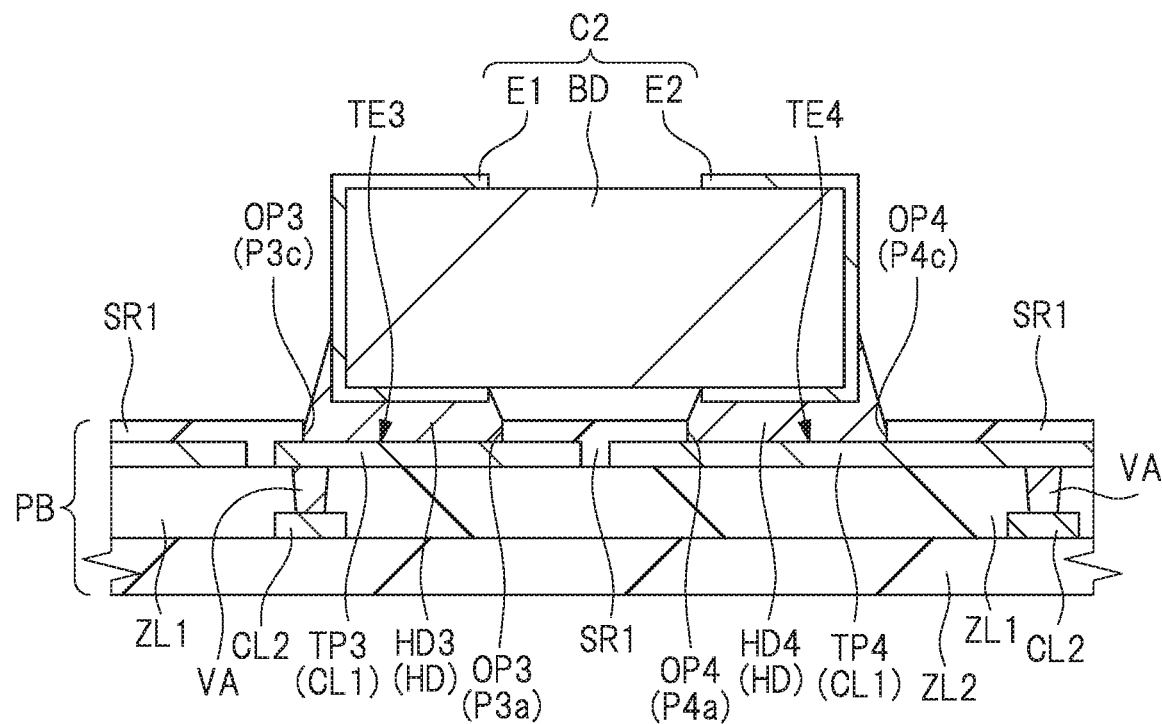
FIG. 44 is a cross-sectional view along line B6-B6 of FIG. 41.

FIG. 44 is a cross-sectional view along line B6-B6 of FIG. 41, and corresponds to FIG. 16.

FIGS. 41 to 43 show the same planar regions as each other, specifically the region R2 shown in FIG. 5.

In the modification shown in FIGS. 41 to 44, the connection structure between the wiring substrate PB and the capacitor C2 is different from the configuration described with reference to FIGS. 13 to 16.

That is, the modification shown in FIGS. 41 to 44 differs from the case of FIGS. 13 to 16 in the following points.

In the case of the modification shown in FIGS. 41 to 44, the opening portion OP3 of the solder resist layer SR 1 is included in the terminal pattern TP 3 in plan view, and the opening portion OP4 of the solder resist layer SR1 is included in the conductive plane TP4 in plan view.

Therefore, the outer periphery of the terminal pattern TP3 (sides T3a, T3b, T3c, and T3d) is not exposed from the opening portion OP3 of the solder resist layer SR 1, and extends outside the opening portion OP3 in plan view.

The outer periphery of the conductive plane TP4 including the side T4a is not exposed from the opening portion OP4 of the solder resist layer SR1, and extends outside the opening portion OP4 in plan view.

Accordingly, the terminal pattern TP3 is exposed from the entire opening portion OP3, the terminal portion TE3 coincides with the opening portion OP3 in plan view, the conductive plane TP4 is exposed from the entire opening portion OP3, and the terminal portion TE4 coincides with the opening portion OP4 in plan view.

Thus, in plan view, there is no region in which the terminal pattern TP3 (the conductive material constituting the conductive layer CL1) is not arranged in the opening portion OP3, and there is no region in which the conductive plane TP4 (the conductive material constituting the conductive layer CL1) is not arranged in the opening portion OP4.

As described above, in the case of the modification shown in FIGS. 41 to 44, the SMD pad structure is employed as the terminal portions TE3 and TE4 for connecting the capacitor C2.

Accordingly, in the case of the modification shown in FIGS. 41 to 44, the distance L3 between the side T3a of the terminal pattern TP3 and the side T4a of the conductive plane TP4 can be reduced as compared with the case of FIGS. 13 to 16.

The electrode E1 of the capacitor C2 is disposed so as to face the terminal pattern TP3 (i.e., the terminal portion TE3) exposed from the opening portion OP3 of the solder resist layer SR1, and is bonded and electrically connected to the terminal pattern TP3 (the terminal portion TE3) via the conductive bonding material HD3 made of solder.

The electrode E2 of the capacitor C2 is disposed so as to face the conductive plane TP4 (i.e., the terminal portion TE4) exposed from the opening portion OP4 of the solder resist layer SR1, and is bonded and electrically connected to the conductive plane TP4 (the terminal portion TE4) via the conductive bonding material HD4 made of solder.

As a result, the capacitor C2 is mounted on and fixed to the wiring substrate PB, and is connected in series between the terminal pattern TP3 (terminal portion TE3) and the conductive plane TP4 (terminal portion TE4) of the wiring substrate PB.

In other configurations, the semiconductor device SD2 of the modified example shown in FIGS. 41 to 44 is also substantially the same as the semiconductor device SD2 of the present embodiment described above, and therefore a repetitive description thereof will be omitted here.

In the case of FIGS. 13 to 16, the same structure as the connection structure between the wiring substrate PB and the capacitor C1 of FIGS. 9 to 12 is applied to the connection structure between the wiring substrate PB and the capacitor C2.

That is, in the case of FIGS. 13 to 16, the side T3a of the terminal pattern TP3 is exposed from the opening portion OP3 of the solder resist layer SR1, and the outer periphery of the terminal pattern TP3 other than the side T3a is not exposed from the opening portion OP3 of the solder resist layer SR1.

Accordingly, in the plane view, the region between the edge T3a of the terminal pattern TP3 and the inner wall of the opening portion OP3 opposite thereto (more specifically, the P3a of the opening portion OP3) becomes the region RG3 in which the terminal pattern TP3 (the conductive material constituting the conductive layer CL1) is not disposed.

The side T4a of the conductive plane TP4 is exposed from the opening portion OP4, and the outer periphery of the conductive plane TP4 other than the side T4a is not exposed from the opening portion OP4.

Thus, in a plane view, the region between the edge T4a of the conductive plane TP4 and the inner wall of the opening portion OP4 opposite thereto (more specifically, the P4a of the opening portion OP4) becomes the region RG4 in which the conductive plane TP4 (the conductive material that constitutes the conductive layer CL1) is not disposed.

The regions RG3 and RG4 in the opening portions OP3 and OP4 can function as regions for storing solder material when the capacitor C2 is disposed on the wiring substrate PB or during subsequent solder reflow.

As a result, it is possible to suppress or prevent the solidified solder from remaining in the gap between the main body portion BD of the capacitor C2 and the solder resist layer SR1 after the solder reflow process after the capacitor placement, so that the reliability of the semiconductor device can be improved.

On the other hand, in the case of the modification shown in FIGS. 41 to 44, the connection structure of the wiring substrate PB and the capacitor C2 is not applied to the connection structure of the wiring substrate PB and the capacitor C1 in FIGS. 9 to 12, and the SMD pad structure is applied.

The reason is as follows.

In the case of FIGS. 13 to 16, since it is necessary to provide the regions RG3 and RG4 where the conductive material constituting the conductive layer CL1 is not arranged in the opening portions OP 3 and OP 4, it is necessary to increase the distance L 3 between the side T3a of the terminal pattern TP3 and the side T4a of the conductive plane TP4 to some extent.

On the other hand, in the case of the modification shown in FIG. 41 to FIG. 44, the side T3a of the terminal pattern TP3 and the side T4a of the conductive plane TP4 can be brought close to each other because the regions in which the conductive material constituting the conductive layer CL1 is not disposed are not provided in the opening portions OP3 and OP4.

That is, in the case of the modification shown in FIGS. 41 to 44, the distance L3 between the side T3a of the terminal pattern TP3 and the side T4a of the conductive plane TP4 can be reduced as compared with the case of FIGS. 13 to 16.

In the conductive layer CL2 which is one lower than the conductive layer CL1 including the terminal pattern TP3 and the conductive plane TP4, it is desirable that the region immediately below the region between the side T3a of the terminal pattern TP3 and the side T4a of the conductive plane TP4 is a signal wiring arrangement prohibition region.

This is because, in order to improve the quality of the signal transmitted through the signal wiring included in the conductive layer CL2, it is preferable to form a microstrip line structure between the signal wiring included in the conductive layer CL2 and the ground pattern included in the conductive layer CL1, which corresponds to the conductive plane TP4 to which the reference potential VSS is supplied.

If the signal wiring included in the conductive layer CL2 passes directly under the region between the side T3a of the terminal pattern TP3 and the side T4a of the conductive plane TP4, the capacitance between the signal wiring and the ground pattern locally changes to form a discontinuous portion of impedance, and a reflected wave may be generated in the signal passing through the signal wiring, resulting in noise.

Therefore, it is desirable that the signal wiring included in the conductive layer CL2 does not pass directly under the region between the side T3a of the terminal pattern TP3 and the side T4a of the conductive plane TP4.

On the upper surface PB1 of the wiring substrate PB, the capacitor C2 for the power supply circuit is disposed near the semiconductor chip CP2 as described above.

However, in a region near the semiconductor chip CP2 in the wiring substrate PB in plan view, many signal wirings to be electrically connected to the circuits in the semiconductor chip CP 2 are arranged at high density.

Therefore, it is desirable to suppress as much as possible the occurrence of the arrangement prohibition region of the signal wiring in the region near the semiconductor chip CP2 in the wiring substrate PB due to the connection structure of the capacitor C2.

In the case of the modification shown in FIGS. 41 to 44, since the distance L3 between the side T3a of the terminal pattern TP3 and the side T4a of the conductive plane TP4 can be reduced, the arrangement prohibition region of the signal wiring in the conductive layer CL2 can be reduced.

This facilitates the wiring design of the wiring substrate PB, and is advantageous for the miniaturization of the wiring substrate PB, and hence the miniaturization of the semiconductor device SD2.

The invention made by the present inventor has been described above in detail based on the embodiment, but the present invention is not limited to the embodiment described above, and various modifications can be made without departing from the gist thereof.

What is claimed is:

1. A semiconductor device comprising:
   a wiring substrate;
   a semiconductor chip mounted on the wiring substrate; and
   a first chip capacitor mounted on the wiring substrate, the first chip capacitor having a first electrode and a second electrode opposite the first electrode,
   wherein the wiring substrate includes:
      a first conductive layer which includes a first terminal pattern and a second terminal pattern; and
      an insulating layer which covers the first conductive layer,
   wherein the insulating layer includes:
      a first opening portion exposing a part of the first terminal pattern; and
      a second opening portion exposing a part of the second terminal pattern,
   wherein, in plan view, the first opening portion and the second opening portion are separated apart from each other such that the insulating layer is located between the first opening portion and the second opening portion, wherein the second terminal pattern is not exposed in the first opening portion, wherein the first terminal pattern is not exposed in the second opening portion, wherein the first terminal pattern has a first side which faces the second terminal pattern in the plan view, wherein the second terminal pattern has a second side which faces the first side of the first terminal pattern in the plan view, wherein the first side of the first terminal pattern is exposed in the first opening portion, wherein the second side of the second terminal pattern is exposed in the second opening portion, wherein other sides of the first terminal pattern except the first side are not exposed in the first opening portion, wherein other sides of the second terminal pattern except the second side are not exposed in the second opening portion, wherein the first electrode of the first chip capacitor is electrically connected with the first terminal pattern exposed in the first opening portion via a first solder, wherein the second electrode of the first chip capacitor is electrically connected with the second terminal pattern exposed in the second opening portion via a second solder, wherein the first opening portion has a third side facing the second opening portion in the plan view, wherein the second opening portion has a fourth side facing the third side of the first opening portion in the plan view, wherein a conductive member of the first conductive layer is not disposed between the first side of the first terminal pattern and the third side of the first opening portion, and wherein the conductive member of the first conductive layer is not disposed between the second side of the second terminal pattern and the fourth side of the second opening portion.

2. The semiconductor device according to claim 1,
wherein an interval between the first side of the first terminal pattern and the third side of the first opening portion is more than 100 μm in the plan view, and
wherein an interval between the second side of the second terminal pattern and the fourth side of the second opening portion is more than 100 μm in the plan view.

3. The semiconductor device according to claim 1,
wherein the other sides of the first terminal pattern except the first side is covered with the insulating layer, and
wherein the other sides of the second terminal pattern except the second side is covered with the insulating layer.

4. The semiconductor device according to claim 1, wherein the insulating layer is a solder resist layer.

5. The semiconductor device according to claim 1, wherein the first chip capacitor is inserted in series connection into a signal transmission path through which an electric signal is input to or output from a circuit of the semiconductor chip.

6. The semiconductor device according to claim 1,
wherein the first conductive layer further includes a first wiring, and
wherein the first wiring is connected to the other sides of the first terminal pattern except the first side.

7. The semiconductor device according to claim 6,
wherein the first conductive layer further includes a second wiring, and
wherein the second wiring is connected to the other sides of the second terminal pattern except the second side.

8. A semiconductor device comprising:
a wiring substrate;
a semiconductor chip mounted on the wiring substrate;
a first chip capacitor mounted on the wiring substrate, the first chip capacitor having a first electrode and a second electrode opposite the first electrode; and
a second chip capacitor mounted on the wiring substrate, the second chip capacitor including a third electrode and a fourth electrode opposite the third electrode,
wherein the wiring substrate includes:
   a first conductive layer which includes a first terminal pattern, a second terminal pattern, a third terminal pattern, and a fourth terminal pattern; and
   an insulating layer which covers the first conductive layer, wherein the insulating layer includes:
      a first opening portion exposing a part of the first terminal pattern;
      a second opening portion exposing a part of the second terminal pattern;
      a third opening portion exposing a part of the third terminal patter; and
      a fourth opening portion exposing a part of the fourth terminal pattern,
wherein, in plan view, the first opening portion and the second opening portion are separated apart from each other such that the insulating layer is located between the first opening portion and the second opening portions,
wherein, in the plan view, the third opening portion and the fourth opening portion are separated apart from each other such that, the insulating layer is located between the third opening portion and the fourth opening portion,
wherein the second terminal pattern is not exposed in each of the first opening portion, the third opening portion and the fourth opening portion,
wherein the first terminal pattern is not exposed in each of the second opening portion, the third opening portion, and the fourth opening portion,
wherein the fourth terminal pattern is not exposed in each of the first opening portion, the second opening portion, and the third opening portion,
wherein the third terminal pattern is not exposed in each of the first opening portion, the second opening portion, and the fourth opening portion,
wherein the first terminal pattern has a first side which faces the second terminal pattern in the plan view,
wherein the first side of the first terminal pattern is exposed in the first opening portion,
wherein other sides of the first terminal pattern except the first side is not exposed in the first opening portion,
wherein the second terminal pattern has a second side which faces the first side of the first terminal pattern in the plan view,
wherein the second side of the second terminal pattern is exposed in the second opening portion,
wherein other sides of the second terminal pattern except the second side is not exposed in the second opening portion,
wherein the third opening portion is disposed inside the third terminal pattern in the plan view,
wherein the fourth opening portion is disposed inside the fourth terminal pattern in the plan view, wherein the first electrode of the first chip capacitor is electrically connected with the first terminal pattern exposed in the first opening portion via a first solder, wherein the second electrode of the first chip capacitor is electrically connected with the second terminal pattern exposed in the second opening portion via a second solder, wherein the third electrode of the second chip capacitor is electrically connected with the third terminal pattern exposed in the third opening portion via a third solder connected portion, and wherein the fourth electrode of the second chip capacitor is electrically connected with the fourth terminal pattern exposed in the fourth opening portion via a fourth solder connected portion.

9. The semiconductor device according to claim 8, wherein the third terminal pattern is a terminal for a power supply voltage, and wherein the fourth terminal pattern is a terminal for a reference potential.

10. The semiconductor device according to claim 9, wherein an interval between the second chip capacitor and the semiconductor chip is smaller than an interval between the first chip capacitor and the semiconductor chip.

11. The semiconductor device according to claim 10, wherein the first chip capacitor is inserted in series connection into a signal transmission path through which an electric signal is input to or output from a circuit of the semiconductor chip.

12. The semiconductor device according to claim 9, wherein the third terminal pattern is surrounded with the fourth terminal pattern in the plan view.

13. The semiconductor device according to claim 9,
wherein the third terminal pattern has a fifth side which faces the fourth terminal pattern in the plan view, wherein the fourth terminal pattern has a sixth side which faces the fifth side of the third terminal pattern in the plan view, and wherein a distance between the fifth side of the third terminal pattern and the sixth side of the fourth pattern is less than a distance between the first side of the first terminal pattern and the second side of the second pattern.

14. The semiconductor device according to claim 13,
wherein the first opening portion has a third side facing the second opening portion in the plan view, wherein the second opening portion has a fourth side facing the third side of the first opening portion in the plan view, wherein a conductive member of the first conductive layer is not disposed between the first side of the first terminal pattern and the third side of the first opening portion, and wherein the conductive member of the first conductive layer is not disposed between the second side of the second terminal pattern and the fourth side of the second opening portion.

15. The semiconductor device according to claim 14,
wherein an interval between the first side of the first terminal pattern and the third side of the first opening portion is more than 100 µm in the plan view, and wherein an interval between the second side of the second terminal pattern and the fourth side of the second opening portion is more than 100 µm in the plan view.

* * * * *